(12) United States Patent
Kim et al.

(10) Patent No.: US 11,569,455 B2
(45) Date of Patent: Jan. 31, 2023

(54) COMPOUND FOR ORGANIC OPTOELECTRONIC DEVICE, ORGANIC OPTOELECTRONIC DEVICE, AND DISPLAY DEVICE

(71) Applicant: SAMSUNG SDI CO., LTD., Yongin-si (KR)

(72) Inventors: Jun Seok Kim, Yongin-si (KR); Dong Min Kang, Yongin-si (KR); Dongyeong Kim, Yongin-si (KR); Namheon Lee, Yongin-si (KR); Byoungkwan Lee, Yongin-si (KR); Sangshin Lee, Yongin-si (KR); Jihun Shin, Yongin-si (KR); Eun Sun Yu, Yongin-si (KR); Yoonman Lee, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 331 days.

(21) Appl. No.: 16/891,630

(22) Filed: Jun. 3, 2020

(65) Prior Publication Data

US 2020/0395551 A1 Dec. 17, 2020

(30) Foreign Application Priority Data

Jun. 13, 2019 (KR) ........................ 10-2019-0070256

(51) Int. Cl.
  *H01L 51/50* (2006.01)
  *H01L 51/00* (2006.01)

(52) U.S. Cl.
  CPC ...... *H01L 51/0072* (2013.01); *H01L 51/0061* (2013.01); *H01L 51/0067* (2013.01);
  (Continued)

(58) Field of Classification Search
  None
  See application file for complete search history.

(56) References Cited

U.S. PATENT DOCUMENTS

| | | | |
|---|---|---|---|
| 5,639,914 A | 6/1997 | Tomiyama et al. | |
| 5,837,166 A | 11/1998 | Kawamura et al. | |

(Continued)

FOREIGN PATENT DOCUMENTS

| | | |
|---|---|---|
| CN | 106467516 A | 3/2017 |
| CN | 106467522 A | 3/2017 |

(Continued)

OTHER PUBLICATIONS

Korean Notice of Allowance dated May 30, 2022.
(Continued)

*Primary Examiner* — Gregory D Clark
(74) *Attorney, Agent, or Firm* — Lee IP Law, P.C.

(57) ABSTRACT

A compound for an organic optoelectronic device, an organic optoelectronic device including the same, and a display device, the compound being represented by Chemical Formula 1:

[Chemial Formula 1]

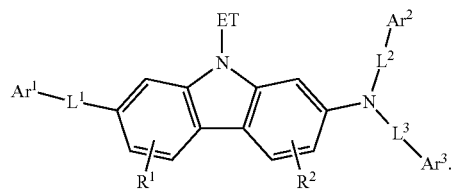

12 Claims, 1 Drawing Sheet

(52) U.S. Cl.
CPC ...... *H01L 51/0073* (2013.01); *H01L 51/5012* (2013.01); *H01L 51/5016* (2013.01)

(56) References Cited

U.S. PATENT DOCUMENTS

| | | |
|---|---|---|
| 6,203,725 B1 | 3/2001 | Ogiso et al. |
| 2005/0127823 A1 | 6/2005 | Iwakuma et al. |
| 2011/0210318 A1 | 9/2011 | Bae et al. |
| 2012/0203010 A1 | 8/2012 | Matsumoto et al. |
| 2014/0312338 A1 | 10/2014 | Mizutani et al. |
| 2014/0336379 A1 | 11/2014 | Adachi et al. |
| 2015/0325794 A1* | 11/2015 | Nishimura ........... C07D 403/04 544/212 |
| 2016/0336518 A1 | 11/2016 | Chun et al. |
| 2017/0012217 A1 | 1/2017 | Chun et al. |
| 2017/0062730 A1 | 3/2017 | Ahn et al. |
| 2017/0174705 A1 | 6/2017 | Kato et al. |
| 2017/0244047 A1 | 8/2017 | Lee et al. |
| 2017/0317290 A1* | 11/2017 | Lee ..................... C07D 209/86 |
| 2019/0131543 A1 | 5/2019 | Lee et al. |

FOREIGN PATENT DOCUMENTS

| | | |
|---|---|---|
| JP | 05-009471 A | 1/1993 |
| JP | 07-126615 A | 5/1995 |
| JP | 10-095973 A | 4/1998 |
| KR | 10-2011-0102055 A | 9/2011 |
| KR | 10-2014-0106631 A | 9/2014 |
| KR | 10-1493482 B1 | 2/2015 |
| KR | 10-2015-0127548 A | 11/2015 |
| KR | 10-2016-0022768 A | 3/2016 |
| KR | 10-1603070 B1 | 3/2016 |
| KR | 10-2016-0048575 A | 5/2016 |
| KR | 10-2017-0074811 A | 6/2017 |
| KR | 10-2017-0075524 A | 7/2017 |
| KR | 10-2017-0096767 A | 8/2017 |
| KR | 10-2017-0117775 A | 10/2017 |
| KR | 10-2017-0123955 A | 11/2017 |
| KR | 10-1801412 B1 | 11/2017 |
| KR | 10-2017-0134163 A | 12/2017 |
| KR | 10-2018-0036529 A | 4/2018 |
| KR | 10-2018-0069475 A | 6/2018 |
| WO | WO 1995/009147 A1 | 4/1995 |
| WO | WO 2003/078541 A1 | 9/2003 |
| WO | WO 2010/021524 A2 | 2/2010 |
| WO | WO 2010/114264 A2 | 10/2010 |
| WO | WO 2013/077362 A1 | 5/2013 |
| WO | WO 2014/087657 A1 | 6/2014 |
| WO | WO 2017/150859 A1 | 9/2017 |

OTHER PUBLICATIONS

Korean Office action dated Sep. 13, 2021.
Chinese Office action dated Nov. 18, 2022, Chinese Search Report dated Nov. 12, 2022.

* cited by examiner

COMPOUND FOR ORGANIC OPTOELECTRONIC DEVICE, ORGANIC OPTOELECTRONIC DEVICE, AND DISPLAY DEVICE

CROSS-REFERENCE TO RELATED APPLICATION

Korean Patent Application No. 10-2019-0070256, filed on Jun. 13, 2019, in the Korean Intellectual Property Office, and entitled: "Compound for Optoelectronic Device, Organic Optoelectronic Device, and Display Device," is incorporated by reference herein in its entirety.

BACKGROUND

1. Field

Embodiments relate to a compound for an organic optoelectronic device, an organic optoelectronic device, and a display device.

2. Description of the Related Art

An organic optoelectronic device is a device that converts electrical energy into photoenergy, and vice versa.

An organic optoelectronic device may be classified as follows in accordance with its driving principles. One type includes a photoelectric device where excitons are generated by photoenergy, separated into electrons and holes, and are transferred to different electrodes to generate electrical energy, and another type includes a light emitting device where a voltage or a current is supplied to an electrode to generate photoenergy from electrical energy.

Examples of the organic optoelectronic device may include an organic photoelectric device, an organic light emitting diode, an organic solar cell, and an organic photo conductor drum.

Of these, an organic light emitting diode (OLED) has recently drawn attention due to an increase in demand for flat panel displays. The organic light emitting diode converts electrical energy into light by applying current to an organic light emitting material and performance of an organic light emitting diode may be affected by organic materials disposed between electrodes.

SUMMARY

The embodiments may be realized by providing a compound for an organic optoelectronic device, the compound being represented by Chemical Formula 1:

[Chemial Formula 1]

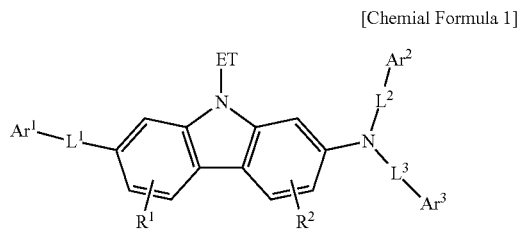

wherein, in Chemical Formula 1, $L^1$ to $L^3$ are independently a single bond or a substituted or unsubstituted C6 to C20 arylene group, $Ar^1$ is a substituted or unsubstituted C6 to C20 aryl group, $Ar^2$ and $Ar^3$ are independently a substituted or unsubstituted C6 to C20 aryl group, a substituted or unsubstituted dibenzofuranyl group, or a substituted or unsubstituted dibenzothiophenyl group, $R^1$ and $R^2$ are independently hydrogen, deuterium, a cyano group, a halogen, a C1 to C10 alkyl group, a C6 to C20 aryl group, a C2 to C20 heterocyclic group, or a combination thereof, and ET is a group represented by Chemical Formula A,

[Chemical Formula A]

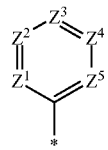

wherein, in Chemical Formula A, $Z^1$ to $Z^5$ are independently N or $C\text{-}L^a\text{-}R^a$, at least one of $Z^1$ to $Z^5$ is N, each $L^a$ is independently a single bond or a substituted or unsubstituted C6 to C20 arylene group, each $R^a$ is independently hydrogen, deuterium, a cyano group, a halogen, a substituted or unsubstituted C1 to C10 alkyl group, a substituted or unsubstituted C6 to C20 aryl group, a substituted or unsubstituted C2 to C20 heterocyclic group, or a combination thereof, each $R^a$ is separate or adjacent ones thereof are linked with each other to form a substituted or unsubstituted aliphatic, aromatic, or heteroaromatic monocyclic ring; or a substituted or unsubstituted aliphatic, aromatic, or heteroaromatic polycyclic ring, and * is a linking point.

ET may be a substituted or unsubstituted pyridinyl group, a substituted or unsubstituted pyrimidinyl group, a substituted or unsubstituted triazinyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted phenanthrolinyl group, a substituted or unsubstituted benzofuranpyrimidinyl group, a substituted or unsubstituted benzothiophenepyrimidinyl group, or a combination thereof.

The compound represented by Chemical Formula 1 may be represented by Chemical Formula 1A:

[Chemial Formula 1A]

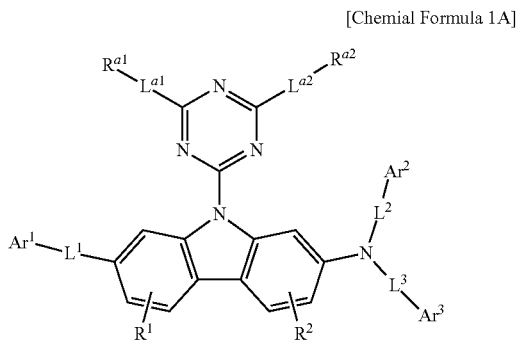

wherein, in Chemical Formula 1A, $L^1$ to $L^3$, $L^{a1}$, and $L^{a2}$ may be independently a single bond or a substituted or unsubstituted C6 to C20 arylene group, $Ar^1$ may be a substituted or unsubstituted C6 to C20 aryl group, $Ar^2$ and $Ar^3$ may be independently a substituted or unsubstituted C6 to C20 aryl group, a substituted or unsubstituted dibenzofuranyl group, or a substituted or unsubstituted dibenzothiophenyl group, $R^{a1}$ and $R^{a2}$ may be independently a substituted or unsubstituted C6 to C20 aryl group, a dibenzofuranyl group, or a dibenzothiophenyl group, $R^1$ and $R^2$ may be independently hydrogen, deuterium, a cyano group, a halogen, a C1 to C10 alkyl group, a C6 to C20 aryl group, a C2 to C20 heterocyclic group, or a combination thereof.

$L^{a1}$ and $L^{a2}$ may be independently a single bond or a substituted or unsubstituted phenylene group, and $R^{a1}$ and $R^{a2}$ may be independently a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group.

$L^2$ and $L^3$ may be independently a single bond, a substituted or unsubstituted phenylene group, a substituted or unsubstituted biphenylene group, or a substituted or unsubstituted naphthylene group, and $Ar^2$ and $Ar^3$ may be independently a substituted or unsubstituted phenyl group, a substituted or unsubstituted biphenyl group, a substituted or unsubstituted terphenyl group, a substituted or unsubstituted naphthyl group, a substituted or unsubstituted dibenzofuranyl group, or a substituted or unsubstituted dibenzothiophenyl group.

Moieties $*-L^2-Ar^2$ and $*-L^3-Ar^3$ of Chemical Formula 1 may be independently a moiety of Group II:

[Group II]

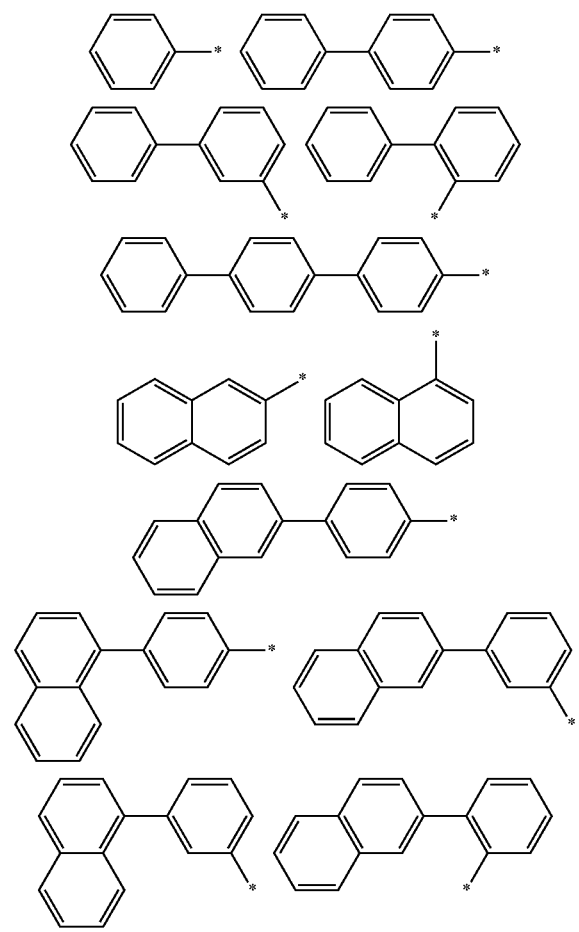

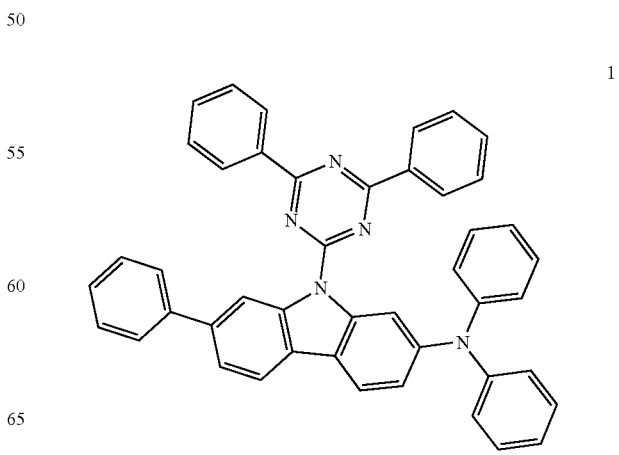

wherein, in Group II, * is a linking point.

$Ar^1$ to $Ar^3$ may be independently a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group, $R^a$ may be a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group, $L^a$ and $L^1$ to $L^3$ may be independently a single bond or a substituted or unsubstituted phenylene group, and both $R^1$ and $R^2$ may be hydrogen.

The compound represented by Chemical Formula 1 may be a compound of Group 1:

[Group 1]

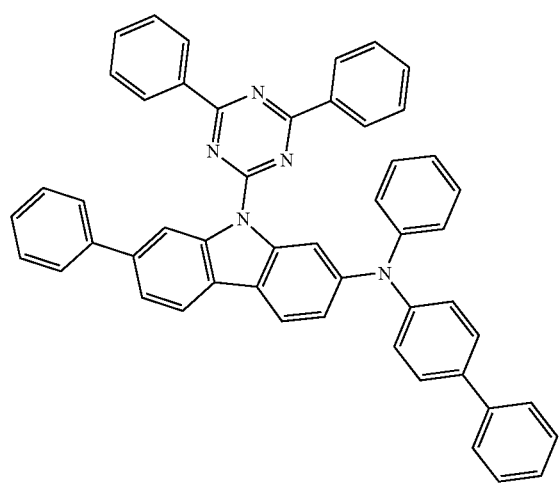
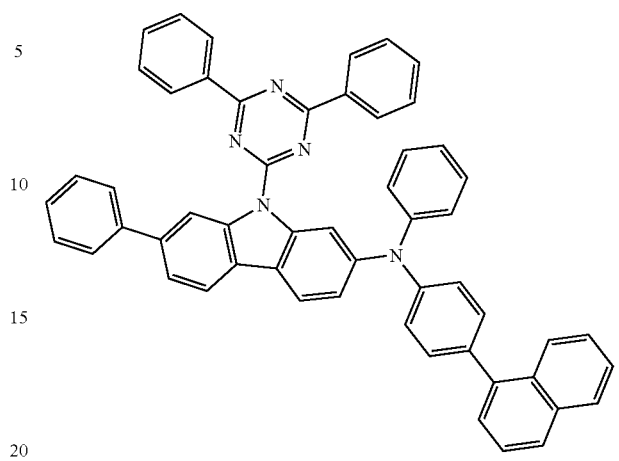
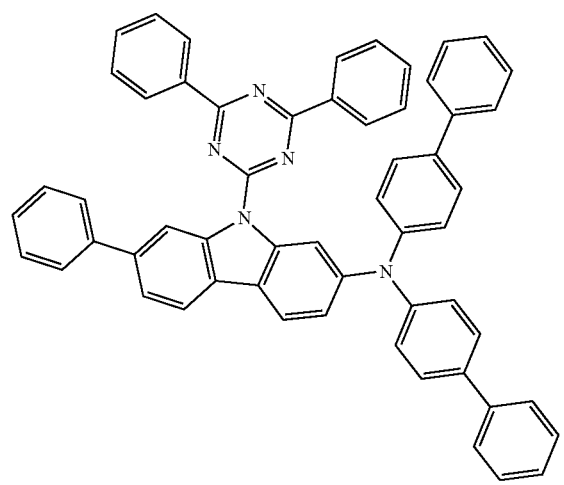

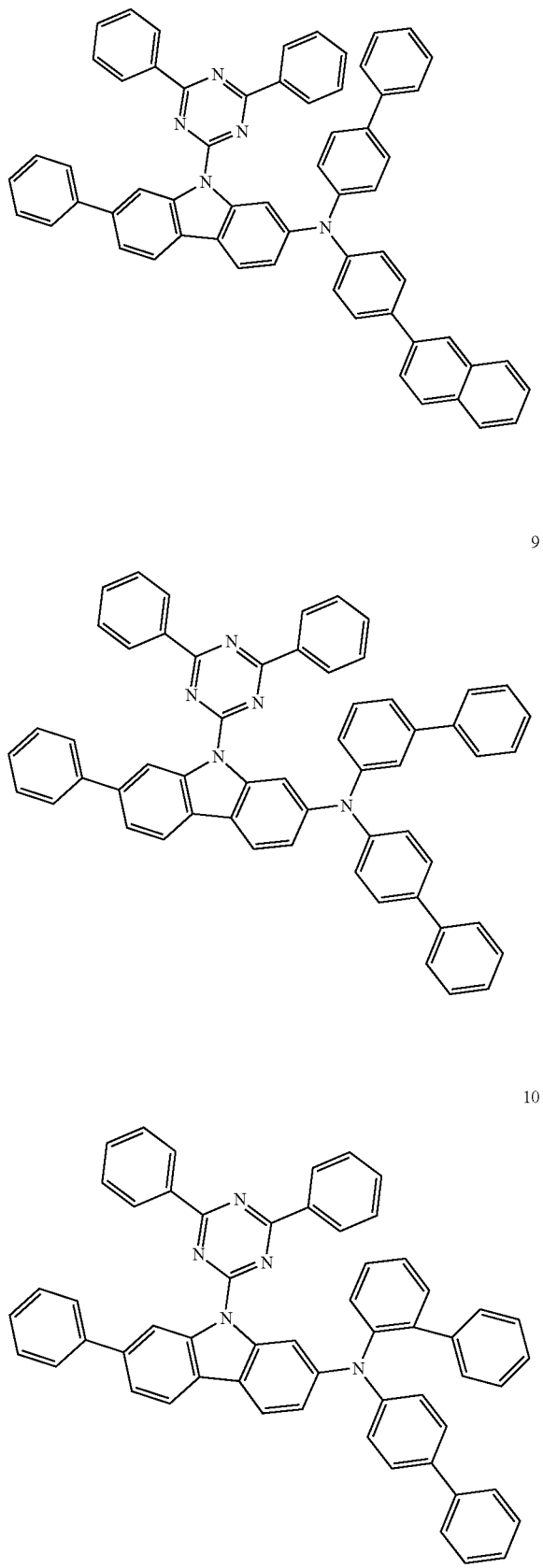
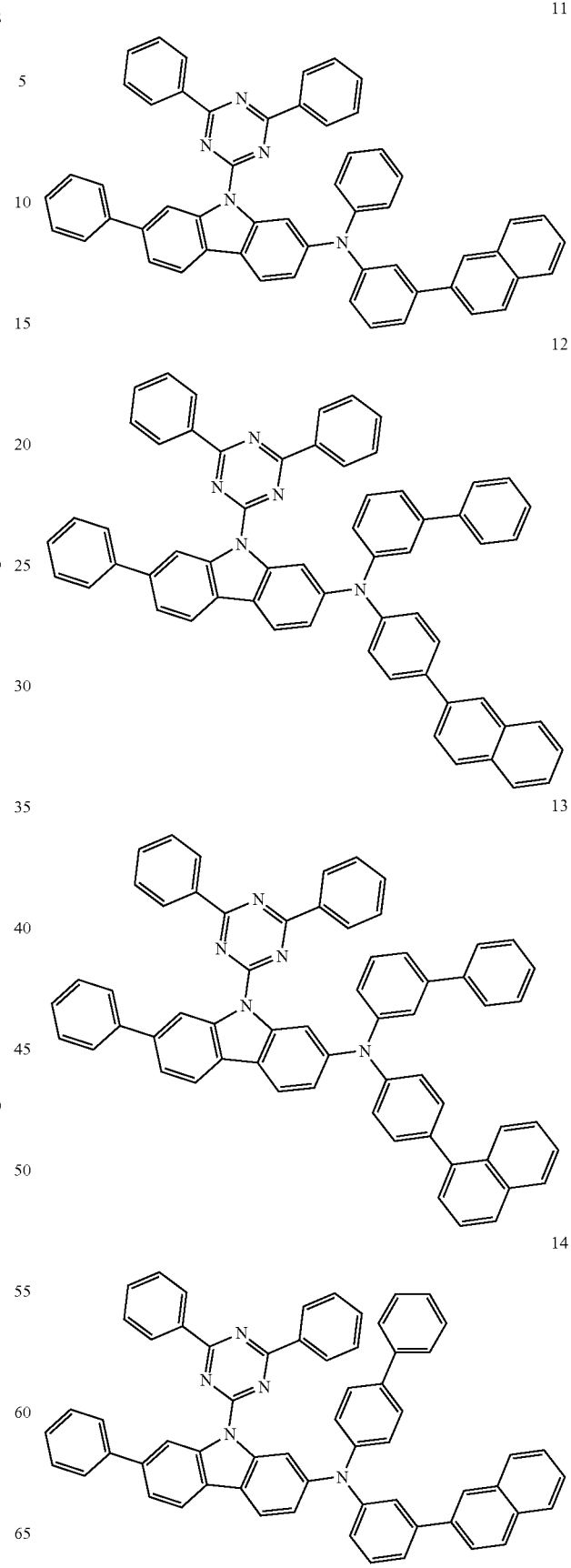

15
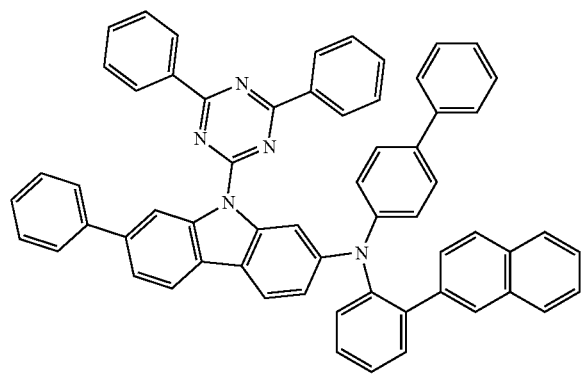
16
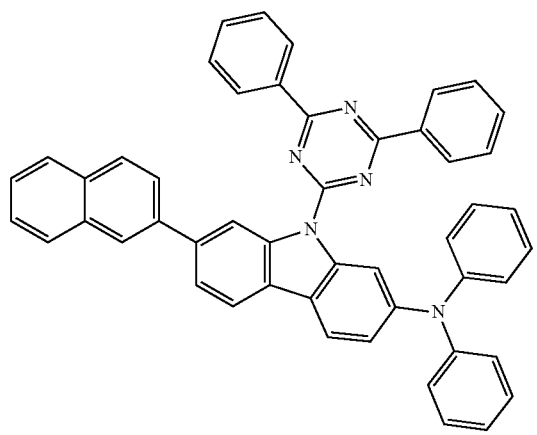
17
18
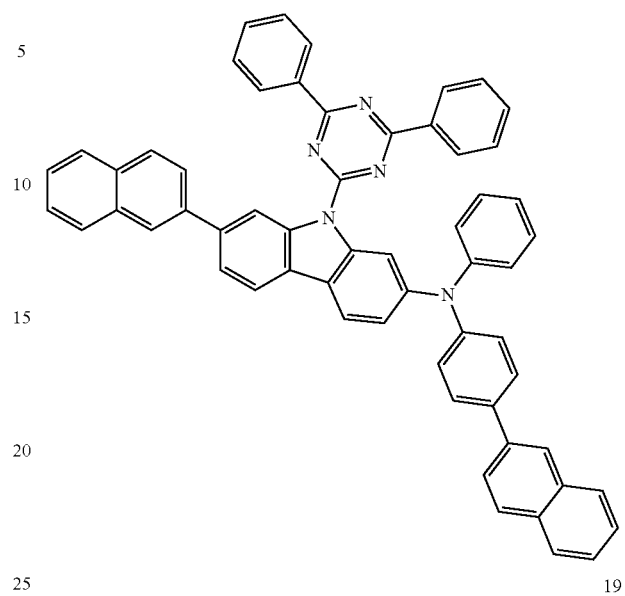
19
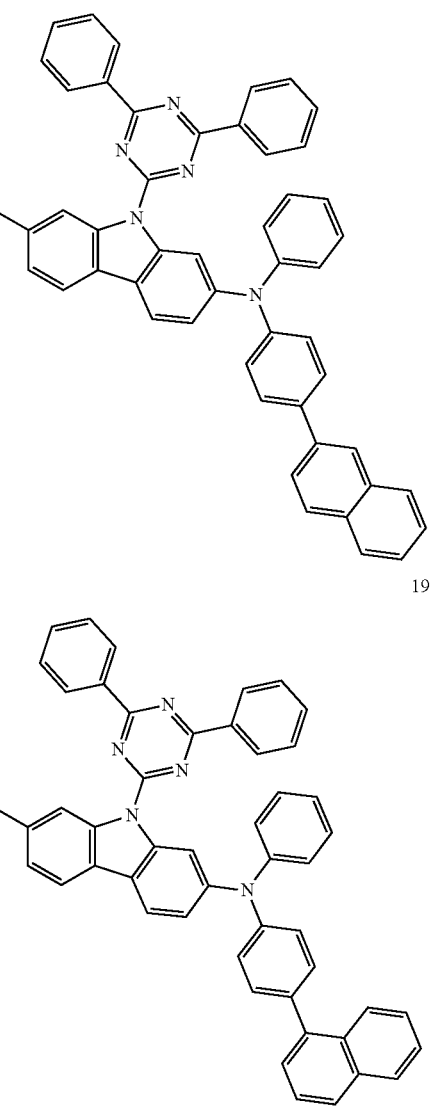
20
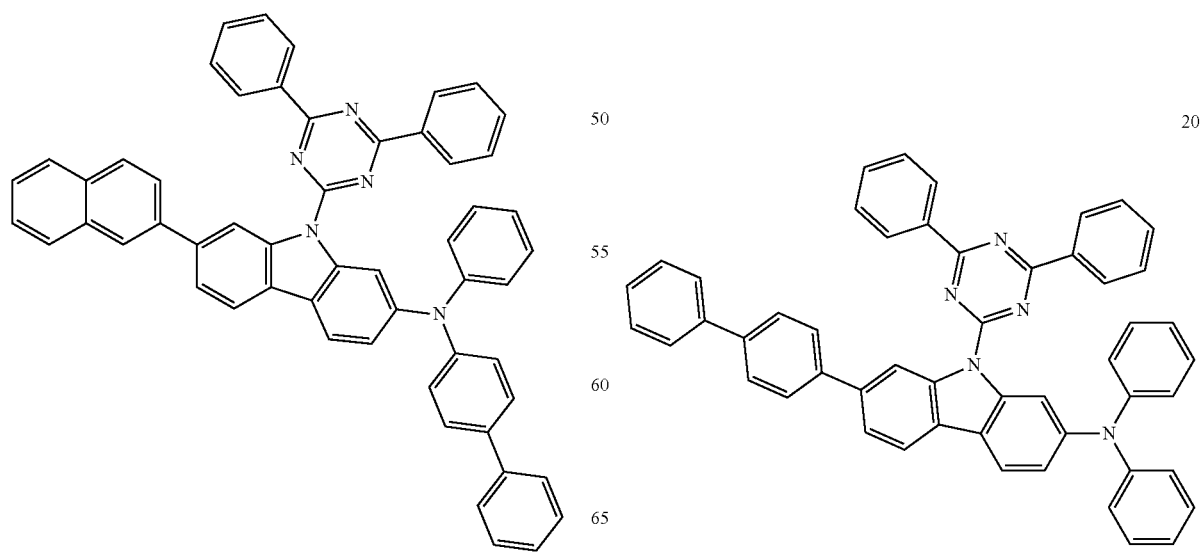

21
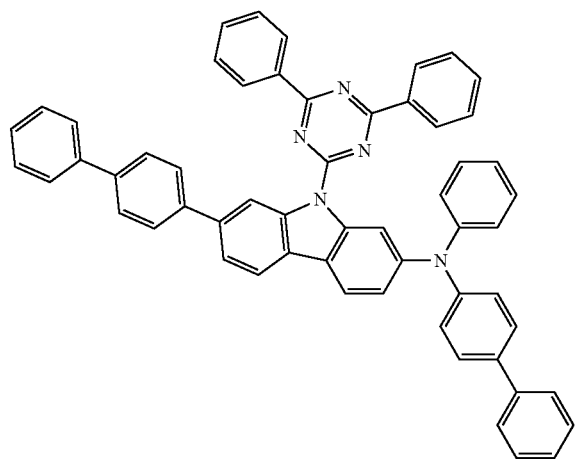
22
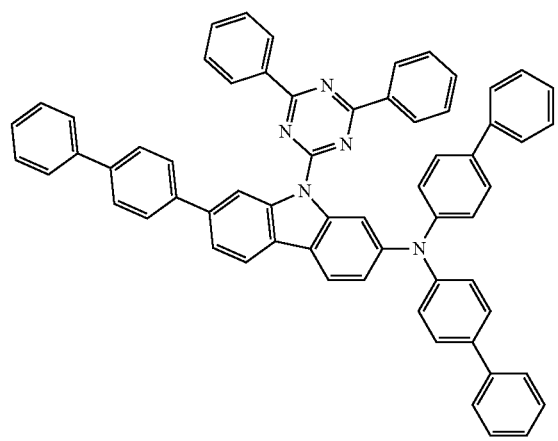
23
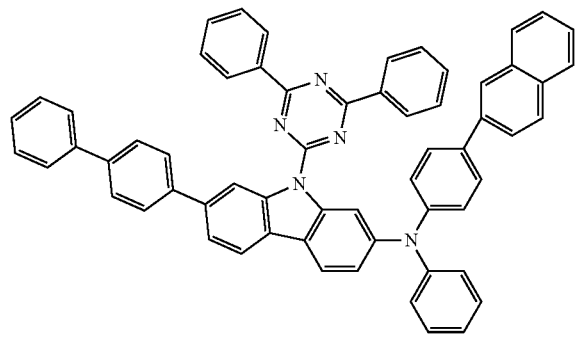
24
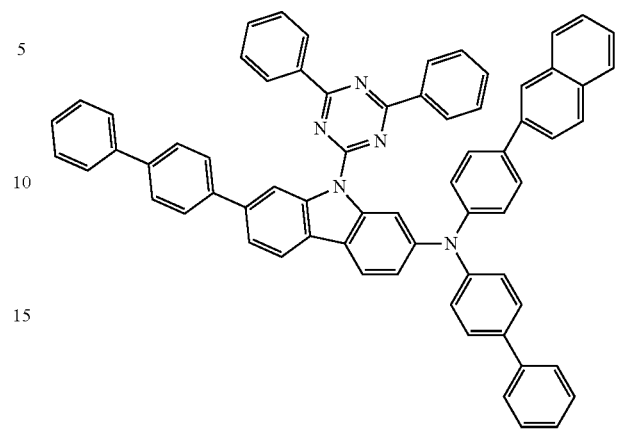
25
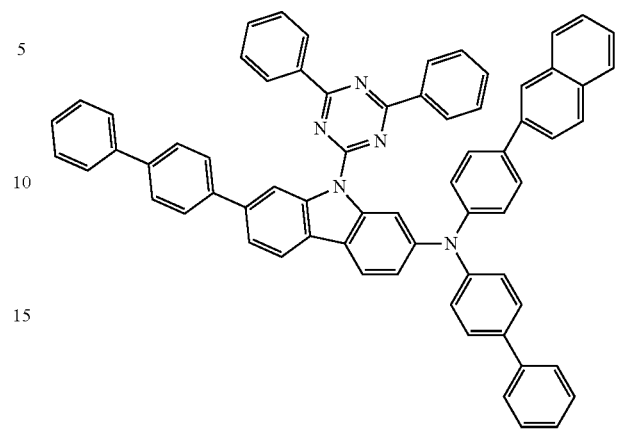
26

27
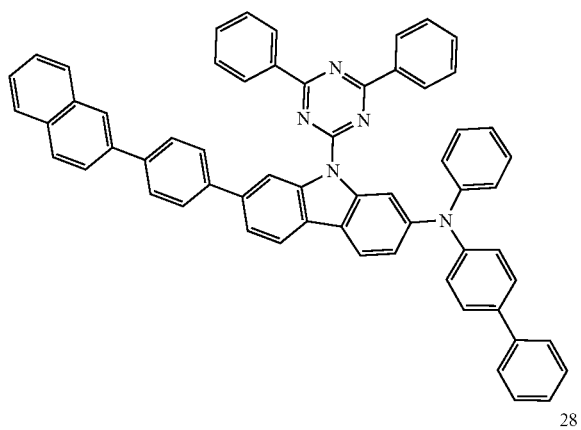
28
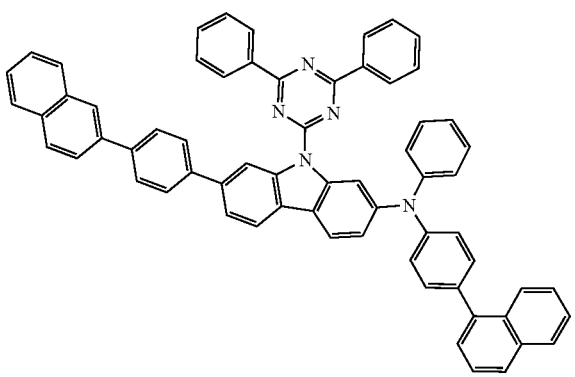
29
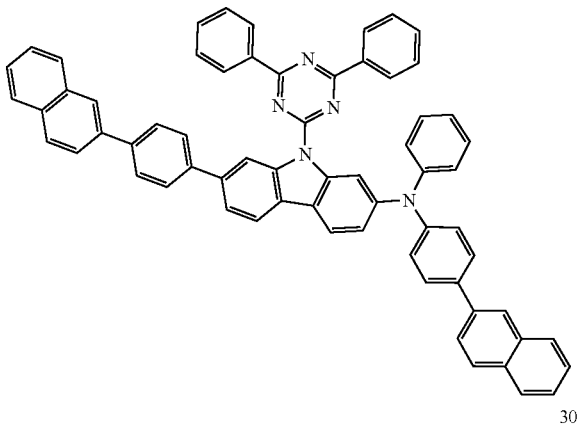
30
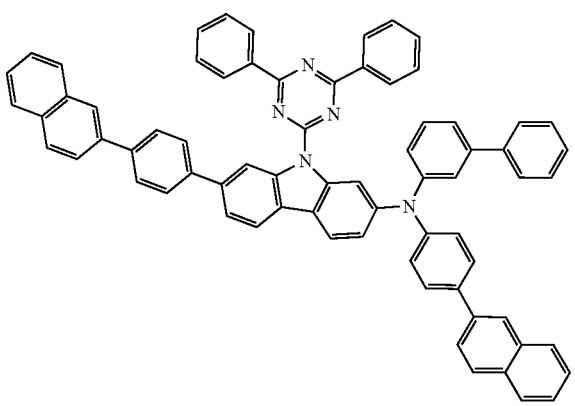
31
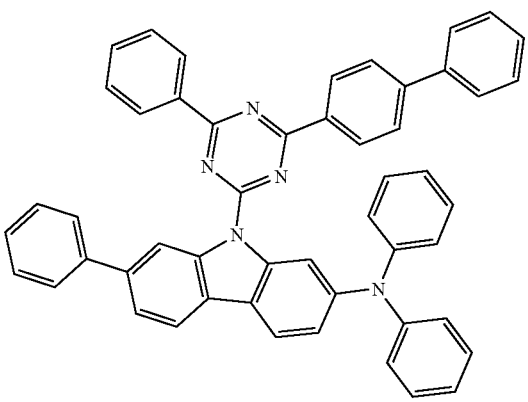
32
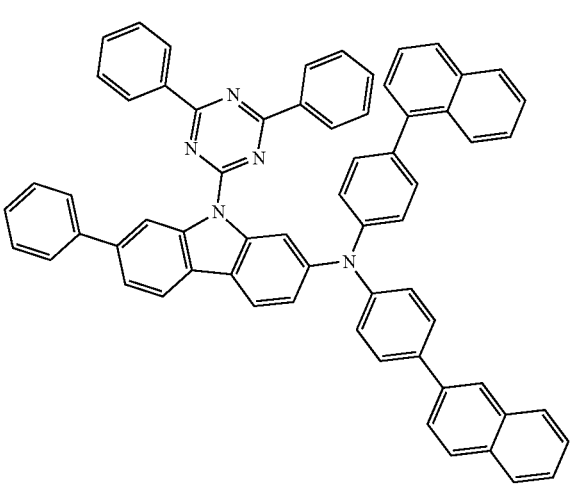
33
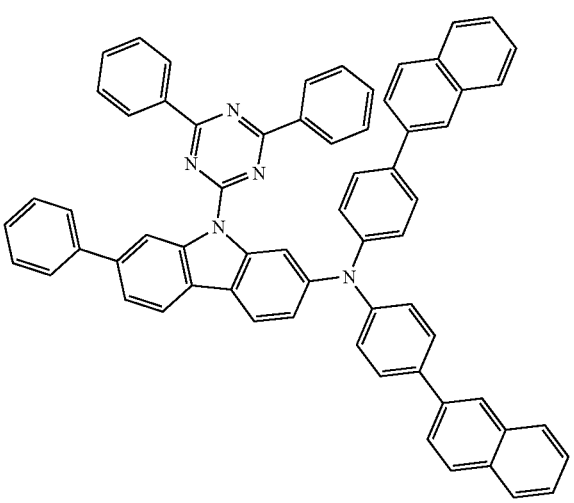

34
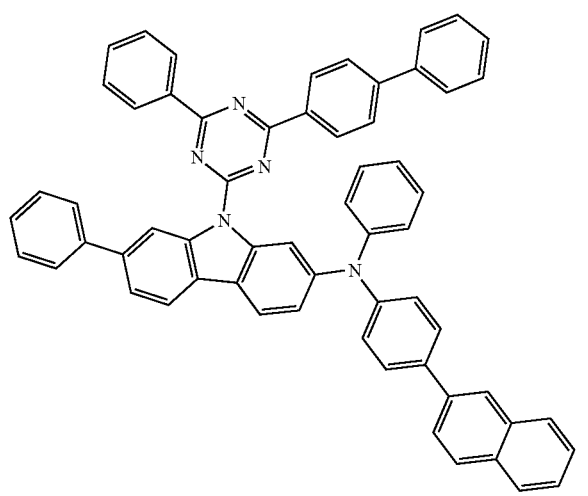
35
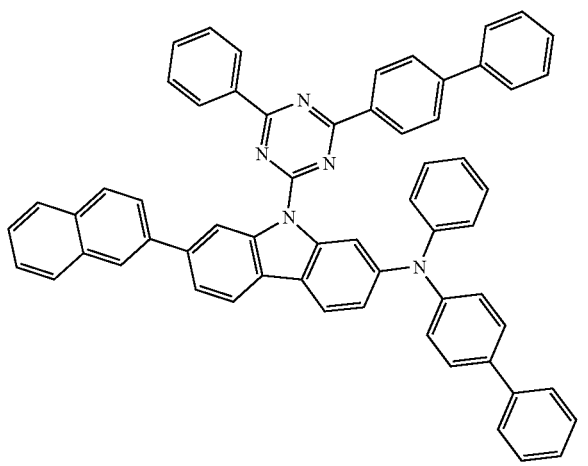
36
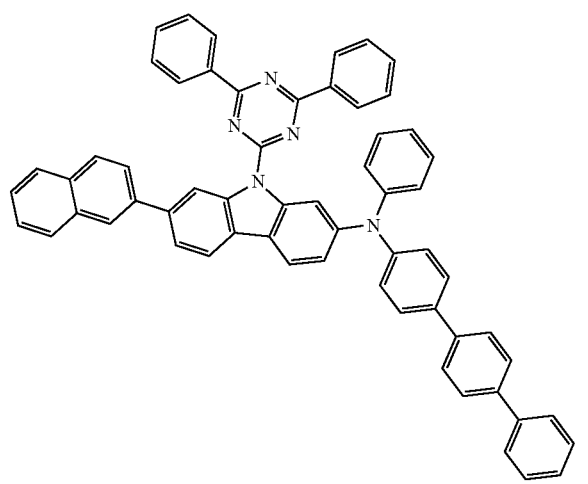
37
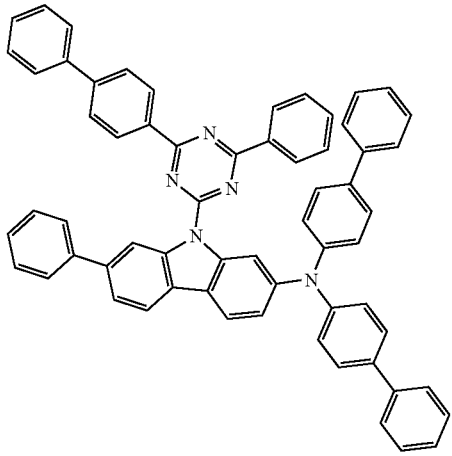
38
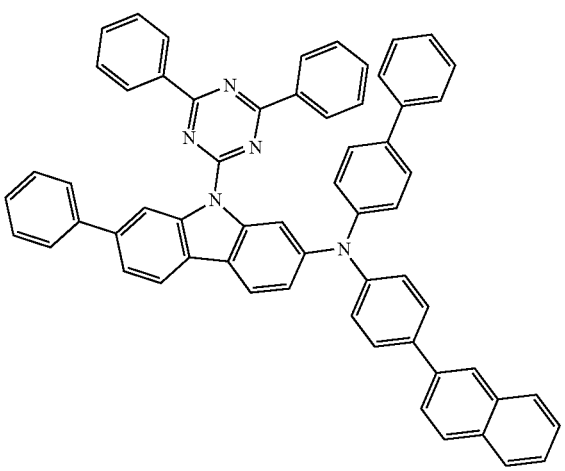
39
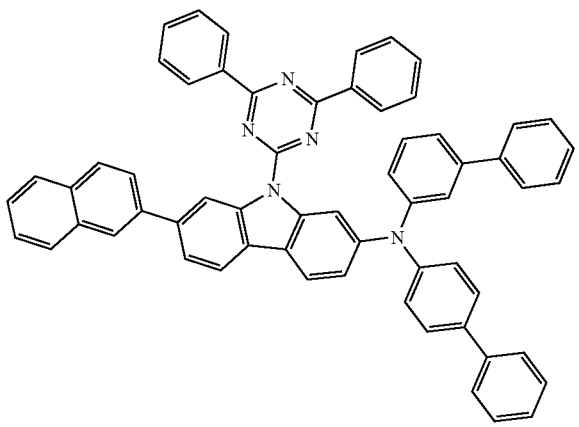

40
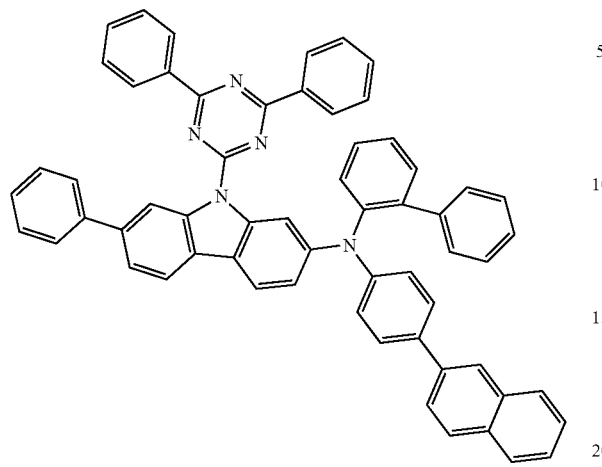
41
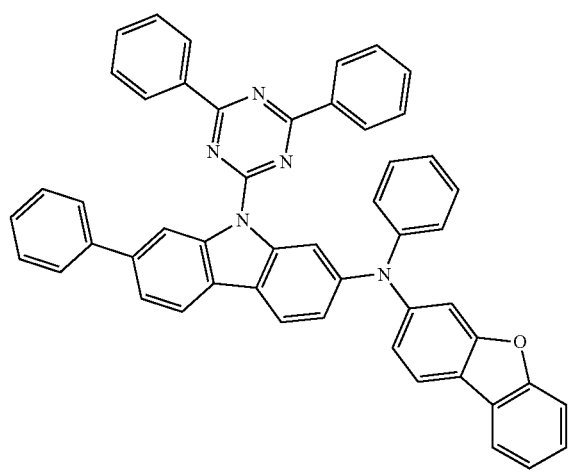
42
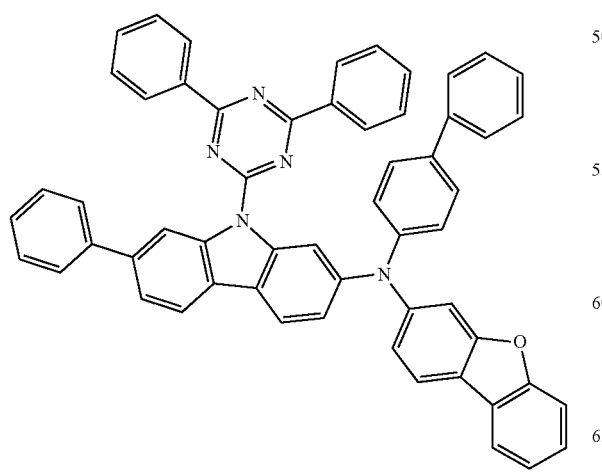
43
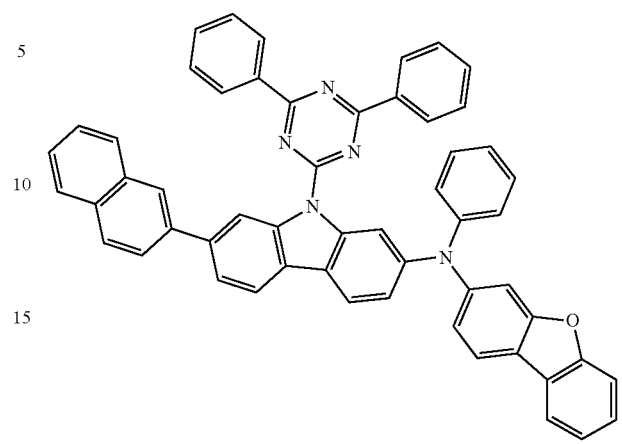
44
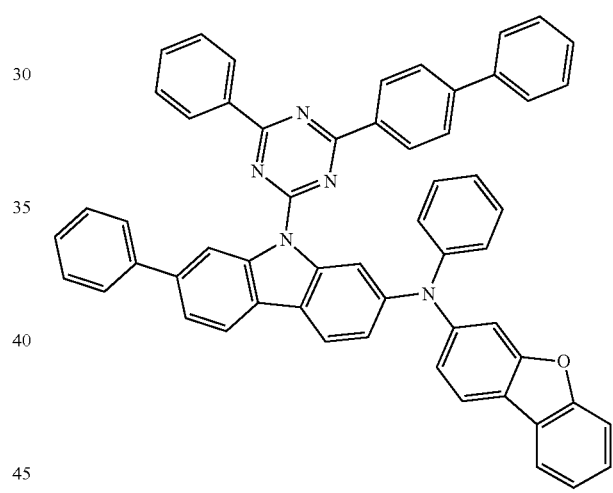
45
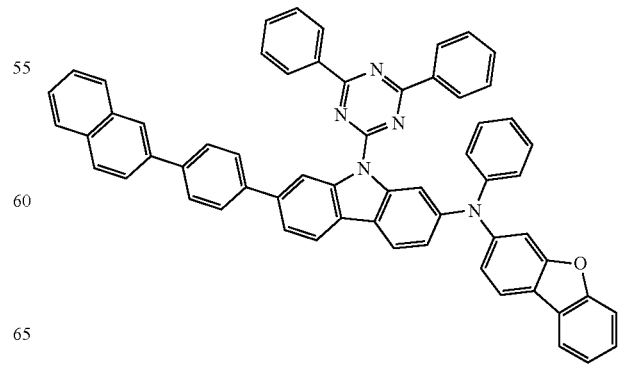

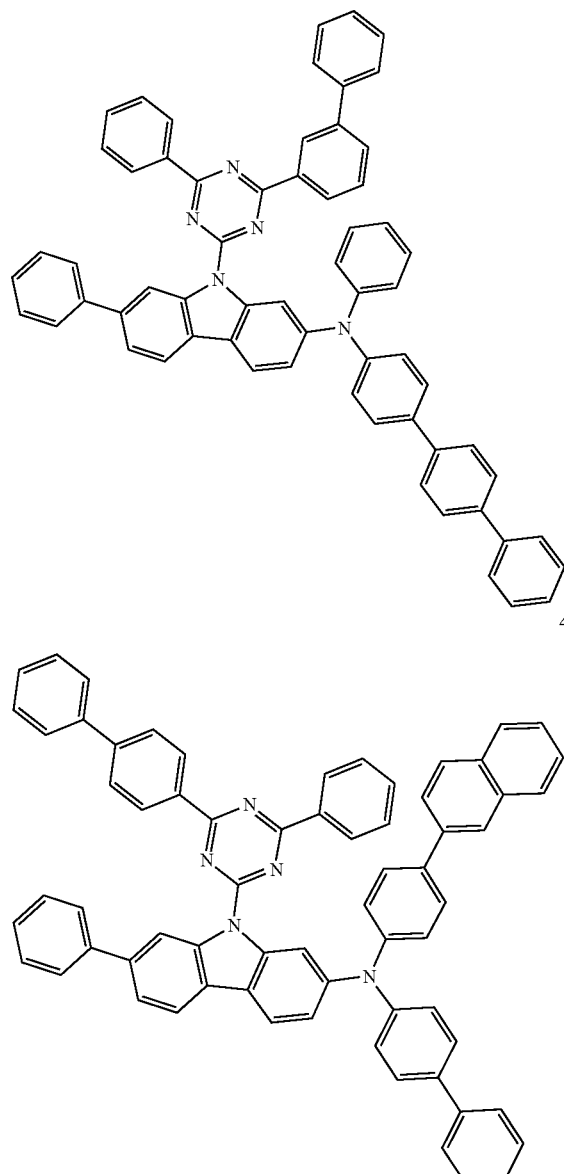
46
47
48
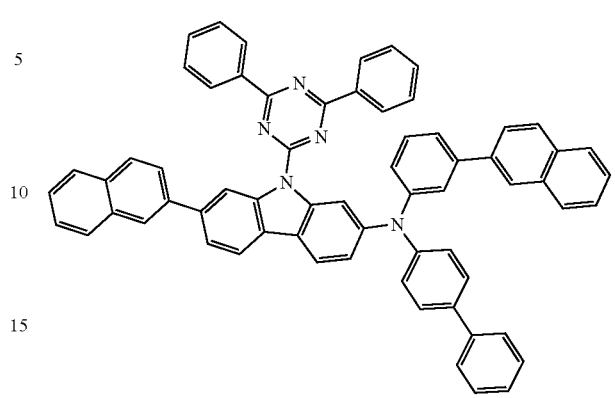
49
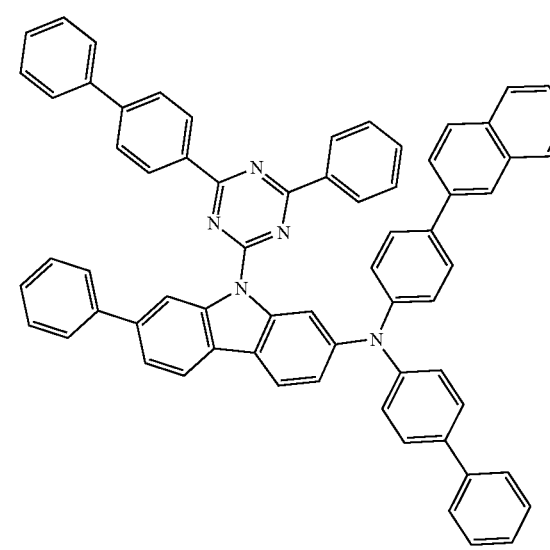
50
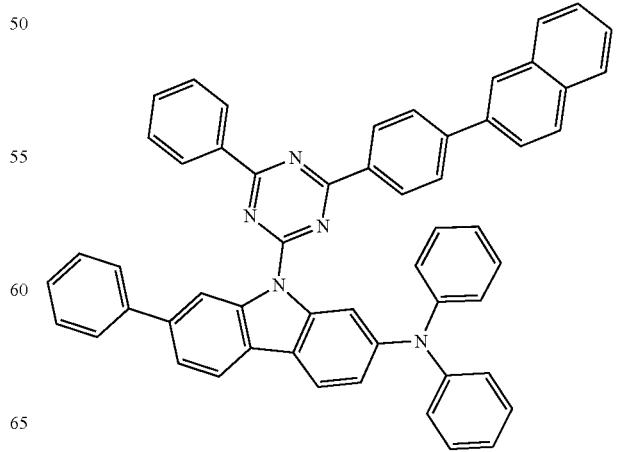
51

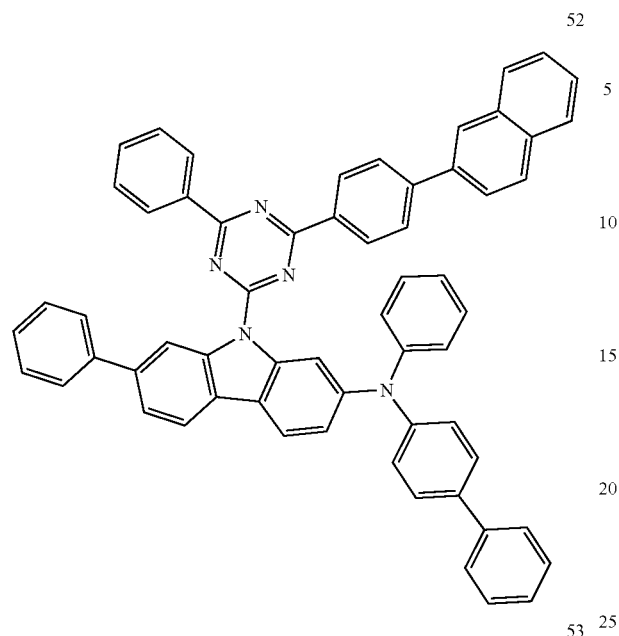
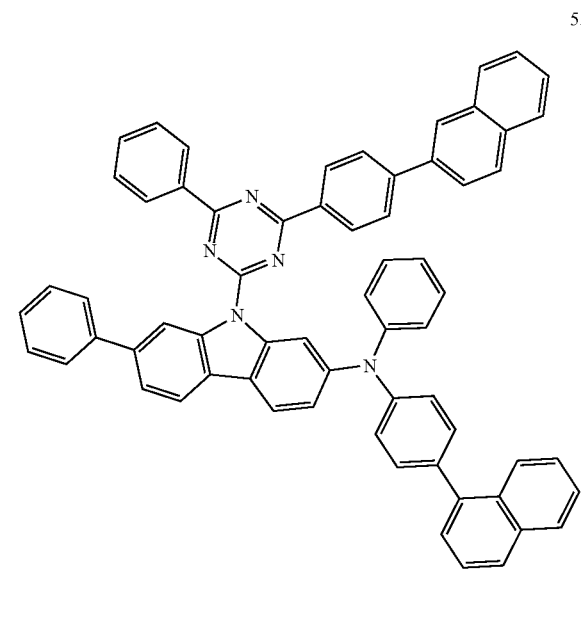

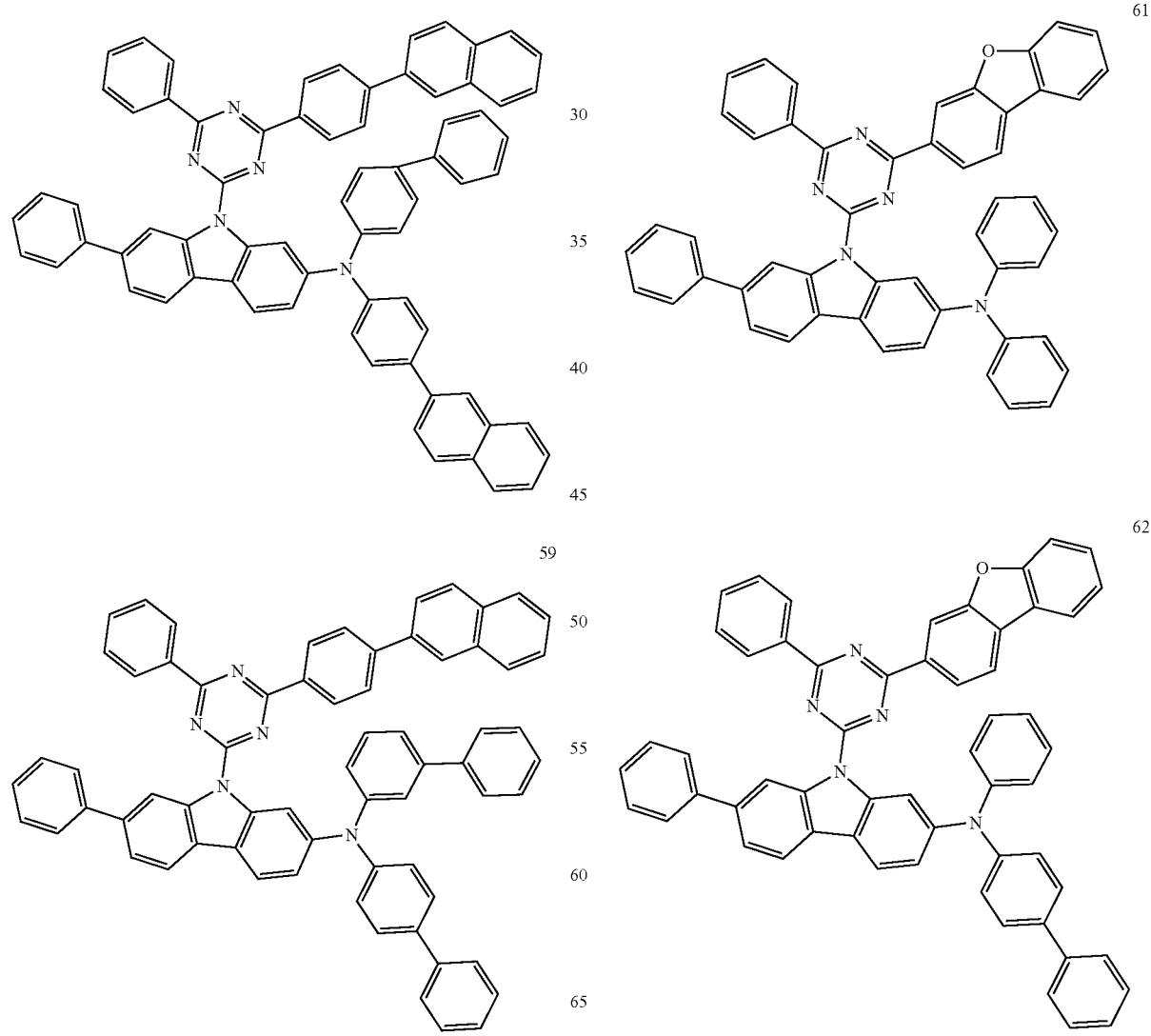

63

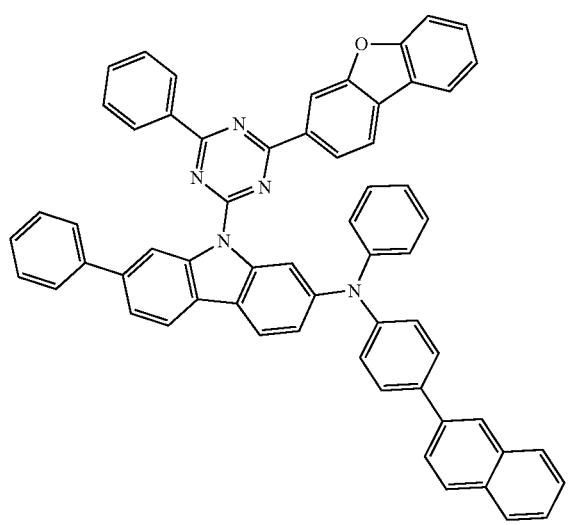

64

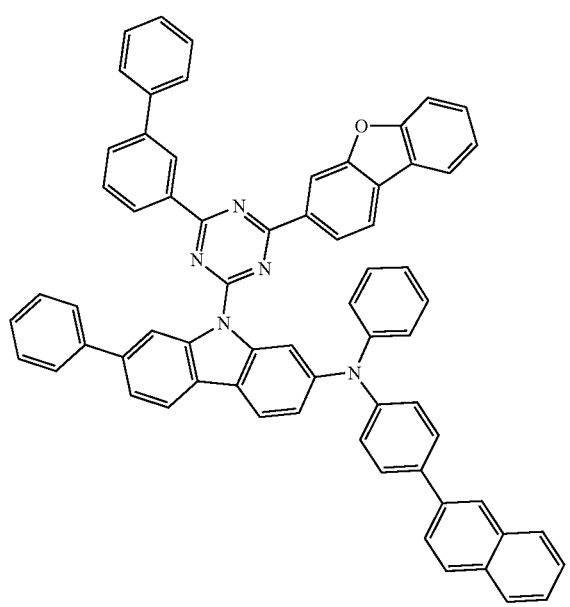

65

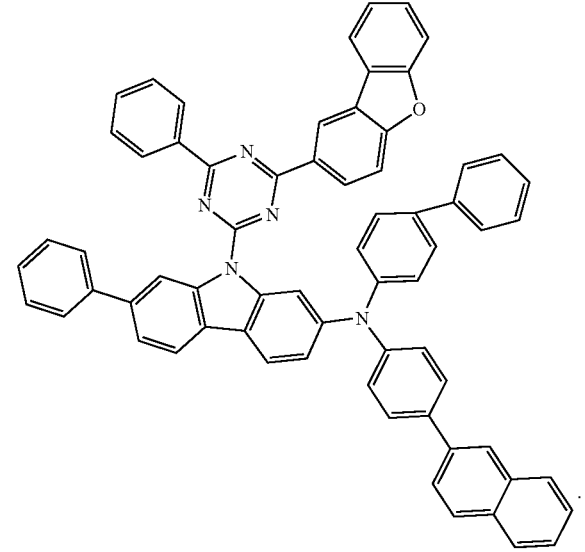

The embodiments may be realized by providing an organic optoelectronic device including an anode and a cathode facing each other, at least one organic layer between the anode and the cathode, wherein the organic layer includes the compound according to an embodiment.

The organic layer may include a light emitting layer, and the light emitting layer may include the compound.

The compound may be a phosphorescent host of the light emitting layer.

The embodiments may be realized by providing a display device comprising the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
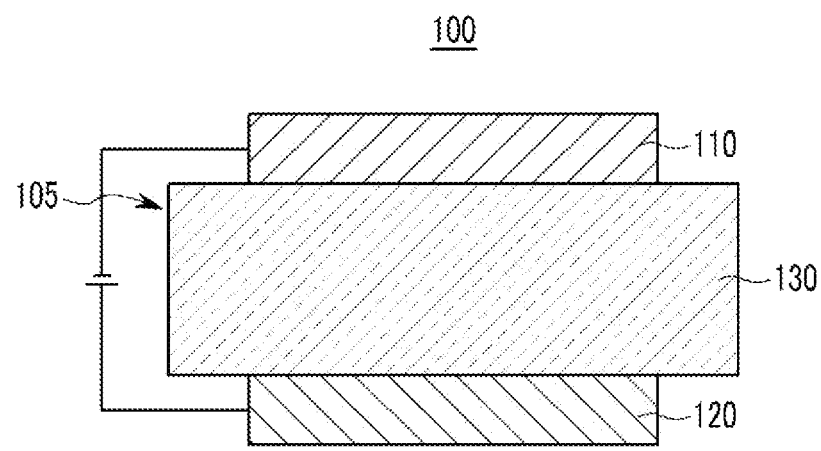
FIGS. 1 and 2 are cross-sectional views showing organic light emitting diodes according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, "substituted" refers to replacement of at least one hydrogen of a substituent of a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, or a C2 to C30 heteroaryl group. In addition, in a specific example, the "substituted" refers to replacement of at least one hydrogen of a substituent or a compound by deuterium, a C1 to C20 alkyl group, a C6 to C30 aryl group, or a C2 to C30 heteroaryl group. In addition, in a specific example, the "substituted" refers to replacement of at least one hydrogen of a substituent or a compound by deuterium, a C1 to C5 alkyl group, a C6 to C18 aryl group, a pyridinyl group, a quinolinyl group, an isoquinolinyl group, a dibenzofuranyl group, a dibenzothiophenyl group, or a carbazolyl group. In addition, in a specific example, the "substituted" refers to replacement of at least one hydrogen of a substituent or a compound by deuterium, a C1 to C5 alkyl group, a C6 to C18 aryl group, a dibenzofuranyl group, or a dibenzothiophenyl group. In addition, in a specific example, the "substituted" refers to replacement of at least one hydrogen of a substituent or a compound by deuterium, a methyl group, an ethyl group, a propyl group, a butyl group, a phenyl group, a biphenyl group, a terphenyl group, a naphthyl group, a triphenyl group, a dibenzofuranyl group, or a dibenzothiophenyl group.

In the present specification, the description of adjacent ones thereof is linked with each other to form a substituted or unsubstituted aliphatic, aromatic, or heteroaromatic monocyclic or polycyclic ring means that any two adjacent substituents directly substituting an aromatic ring or a heteroaromatic ring are linked to form an additional ring.

For example, adjacent groups may be linked to each other to form a substituted or unsubstituted aromatic monocyclic or polycyclic additional ring, or heteroaromatic monocyclic or polycyclic additional ring. For example, in Chemical Formula A, $Z^1$ to $Z^5$ may independently be N or C-$L^a$-$R^a$, wherein adjacent $R^a$'s may be linked to each other to form, for example, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted phenanthrolinyl group, a substituted or unsubstituted benzofuranpyrimidinyl group, or a substituted or unsubstituted benzothiophenepyrimidinyl group.

[Chemical Formula A]

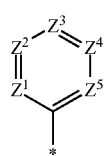

As used herein, when a definition is not otherwise provided, "hetero" refers to one including one to three heteroatoms selected from N, O, S, P, and Si, and remaining carbons in one functional group.

In the present specification, "aryl group" refers to a group including at least one hydrocarbon aromatic moiety, and all the elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic or fused ring polycyclic (i.e., rings sharing adjacent pairs of carbon atoms) functional group.

In the present specification, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, or a combination thereof.

More specifically, the substituted or unsubstituted C2 to C30 heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted phenanthrolinyl group, a substituted or unsubstituted benzofuranpyrimidinyl group, a substituted or unsubstituted benzothiophenepyrimidinyl group, a substituted or unsubstituted dibenzofuranyl group, or a substituted or unsubstituted dibenzothiophenyl group, or a combination thereof.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

A compound for an organic optoelectronic device according to an embodiment may be represented by Chemical Formula 1.

[Chemial Formula 1]

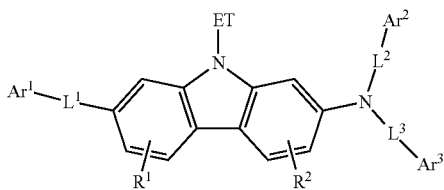

In Chemical Formula 1, $L^1$ to $L^3$ may each independently be or include, e.g., a single bond or a substituted or unsubstituted C6 to C20 arylene group, $Ar^1$ may be or include, e.g., a substituted or unsubstituted C6 to C20 aryl group, $Ar^2$ and $Ar^3$ may each independently be or include, e.g., a substituted or unsubstituted C6 to C20 aryl group, a substituted or unsubstituted dibenzofuranyl group, or a substituted or unsubstituted dibenzothiophenyl group, $R^1$ and $R^2$ may each independently be or include, e.g., hydrogen, deuterium, a cyano group, a halogen, a C1 to C10 alkyl group, a C6 to C20 aryl group, a C2 to C20 heterocyclic group, or a combination thereof, and ET may be a group represented by Chemical Formula A.

[Chemical Formula A]

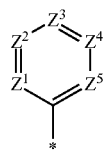

In Chemical Formula A, $Z^1$ to $Z^5$ may be independently N or C-$L^a$-$R^a$. At least one of $Z^1$ to $Z^5$ may be N.

Each $L^a$ may independently be or include, e.g., a single bond or a substituted or unsubstituted C6 to C20 arylene group, and each $R^a$ may independently be or include, e.g., hydrogen, deuterium, a cyano group, a halogen, a substituted or unsubstituted C1 to C10 alkyl group, a substituted or unsubstituted C6 to C20 aryl group, a substituted or unsubstituted C2 to C20 heterocyclic group, or a combination thereof.

In an implementation, each $R^a$ may be separate, or adjacent ones thereof may be linked with each other to form a substituted or unsubstituted aliphatic, aromatic, or heteroaromatic monocyclic ring; or a substituted or unsubstituted aliphatic, aromatic, or heteroaromatic polycyclic ring.

* is a linking point (e.g., to N).

The compound represented by Chemical Formula 1 may implement bipolar properties by including carbazole and an ET group substituting carbazole in an N-position, which is a substituent having electronic properties.

In an implementation, by substituting the aryl and amine structures in both directions or positions of the carbazole in order to improve hole transportability, a HOMO energy level may be further increased and a richer electron cloud is secured, so that a material capable of transferring more holes and electrons may be developed to produce an organic light emitting diode that achieves high efficiency, lowers the driving voltage, and has a long life-span.

It is possible to obtain a shallow HOMO energy level through an amine substituting directly carbazole in one direction, and improve the electron and hole transporting capability of the carbazole through aryl substituting the carbazole in the other direction, resulting in securing an organic light emitting diode having further improved life-span characteristics as well as low driving voltage and high efficiency.

In an implementation, ET may be or may include, e.g., a substituted or unsubstituted pyridinyl group, a substituted or unsubstituted pyrimidinyl group, a substituted or unsubstituted triazinyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted phenanthrolinyl group, a substituted or unsubstituted benzofuranpyrimidinyl group, a substituted or unsubstituted benzothiophenepyrimidinyl group, or a combination thereof.

In an implementation, ET may be or may include, e.g., a substituted or unsubstituted triazinyl group.

In an implementation, the compound represented by Chemical Formula 1 may be, e.g., a compound represented by Chemical Formula 1A.

[Chemial Formula 1A]

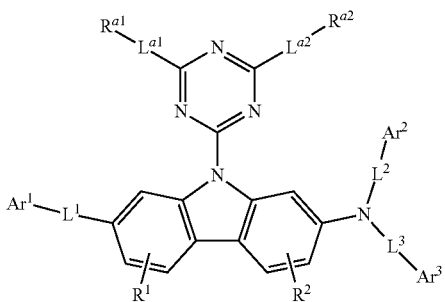

In Chemical Formula 1A, $L^1$ to $L^3$, $Ar^1$ to $Ar^3$, $R^1$ and $R^2$ may be defined the same as those of Chemical Formula 1, and $L^{a1}$ and $L^{a2}$ may be defined the same as $L^1$ to $L^3$ of Chemical Formula 1.

In Chemical Formula 1A, $R^{a1}$ and $R^{a2}$ may each independently be or include, e.g., a substituted or unsubstituted C6 to C20 aryl group, a substituted or unsubstituted dibenzofuranyl group, or a substituted or unsubstituted dibenzothiophenyl group.

In an implementation, $L^{a1}$ and $L^{a2}$ may each independently be or include, e.g., a single bond or a substituted or unsubstituted phenylene group.

In an implementation, $R^{a1}$ and $R^{a2}$ may each independently be or include, e.g., a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group.

In an implementation, ET may be a group of the following Group I.

[Group 1]

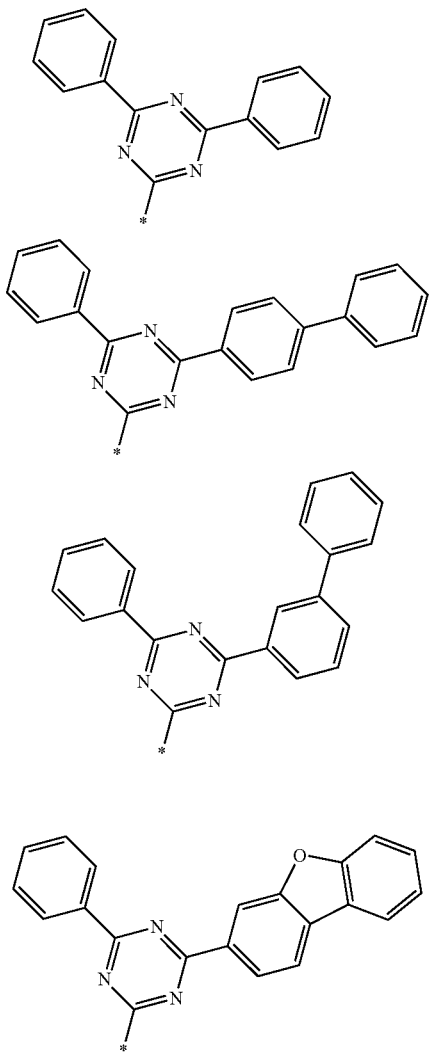

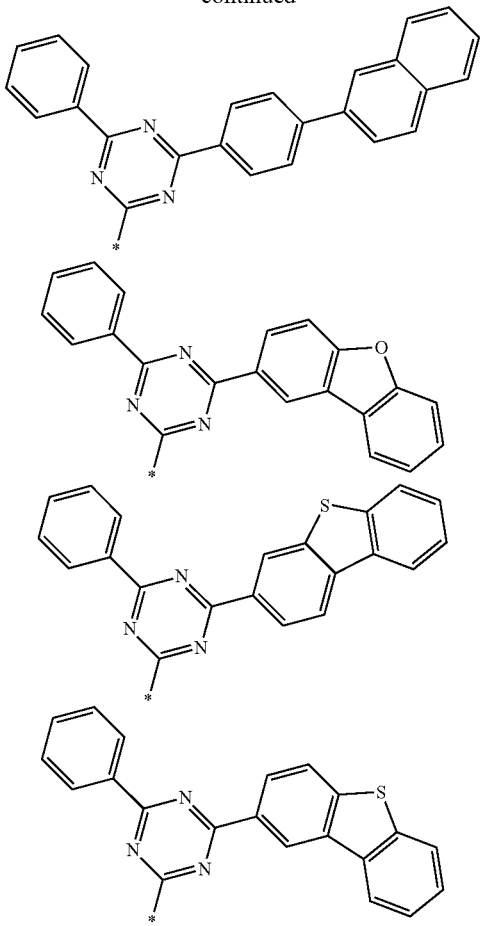

In Group I, * is a linking point.

In an implementation, $L^2$ and $L^3$ may each independently be or include, e.g., a single bond, a substituted or unsubstituted phenylene group, a substituted or unsubstituted biphenylene group, or a substituted or unsubstituted naphthylene group.

In an implementation, $Ar^2$ and $Ar^3$ may each independently be or include, e.g., a substituted or unsubstituted phenyl group, a substituted or unsubstituted biphenyl group, a substituted or unsubstituted terphenyl group, a substituted or unsubstituted naphthyl group, a substituted or unsubstituted dibenzofuranyl group, or a substituted or unsubstituted dibenzothiophenyl group.

In an implementation, $L^2$ and $L^3$ may each independently be or include, e.g., a single bond or a substituted or unsubstituted phenylene group.

In an implementation, $Ar^2$ and $Ar^3$ may each independently be or include, e.g., a substituted or unsubstituted phenyl group, a substituted or unsubstituted biphenyl group, or a substituted or unsubstituted naphthyl group.

In an implementation, the moieties *-$L^2$-$Ar^2$ and *-$L^3$-$Ar^3$ of Chemical Formula 1 may each independently be a moiety of the following Group II.

[Group II]

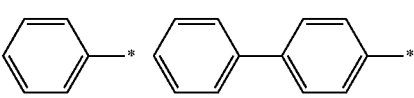

-continued

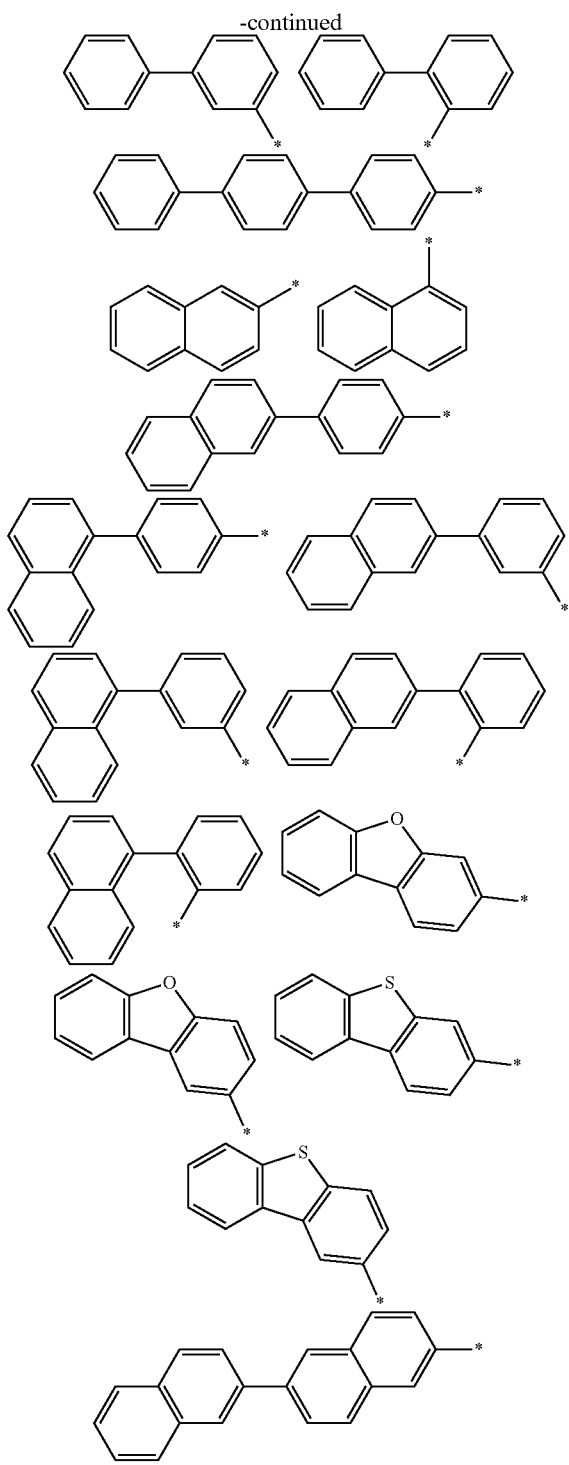

In Group II, * is a linking point (e.g., to N).

In an implementation, the compound for the organic optoelectronic device may be represented by Chemical Formula 1A.

In an implementation, $L^{a1}$ and $L^{a2}$ of Chemical Formula 1A may each be a single bond.

In an implementation, $R^{a1}$ and $R^{a2}$ of Chemical Formula 1A may each independently be or include, e.g., a substituted or unsubstituted phenyl group, a substituted or unsubstituted dibenzofuranyl group, or a substituted or unsubstituted dibenzothiophenyl group.

In an implementation, $Ar^1$ may be or may include, e.g., a substituted or unsubstituted phenyl group or a substituted or unsubstituted naphthyl group.

In an implementation, $Ar^2$ and $Ar^3$ may each independently be or include, e.g., a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group.

In an implementation, both $R^1$ and $R^2$ may be hydrogen.

In an implementation, the compound for the organic optoelectronic device represented by Chemical Formula 1 may be a compound of the following Group 1.

[Group 1]

1

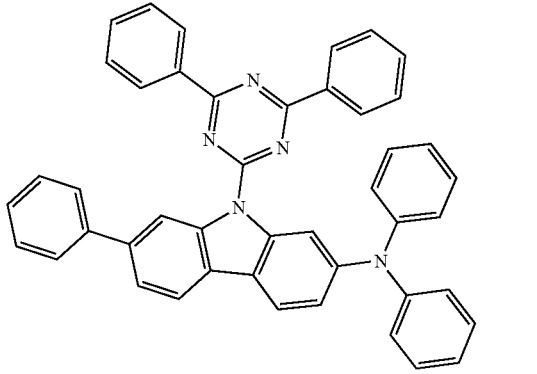

2

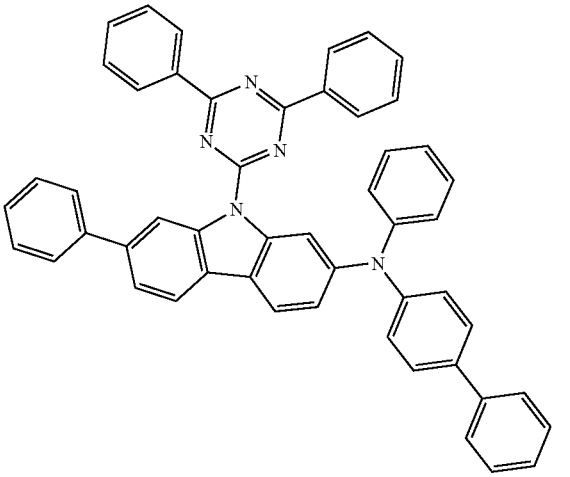

3

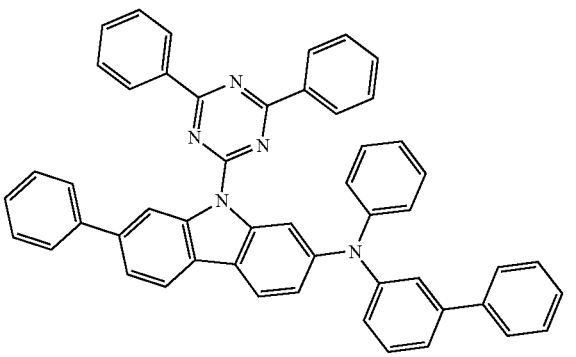

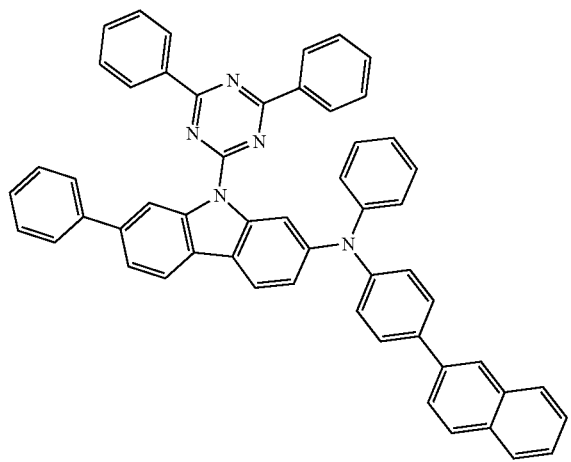
4
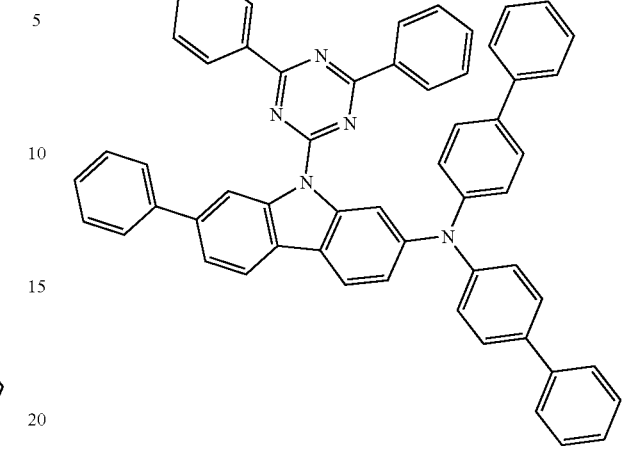
7
5
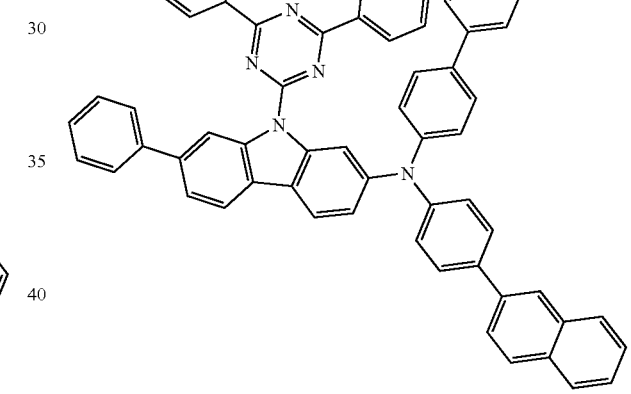
8
6
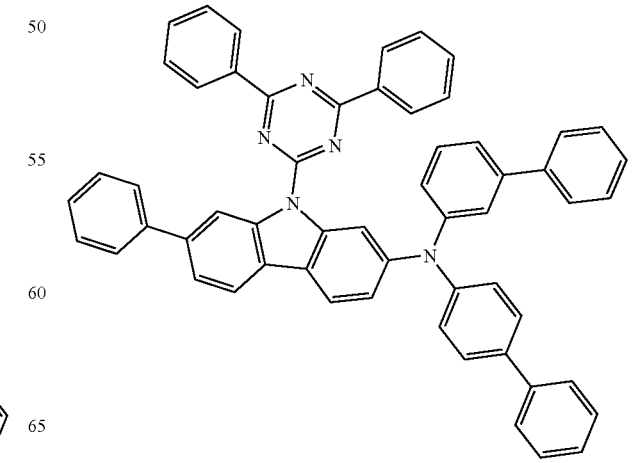
9

10
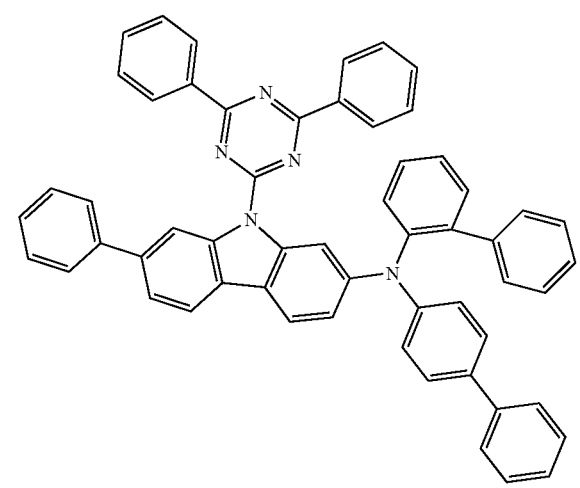
13
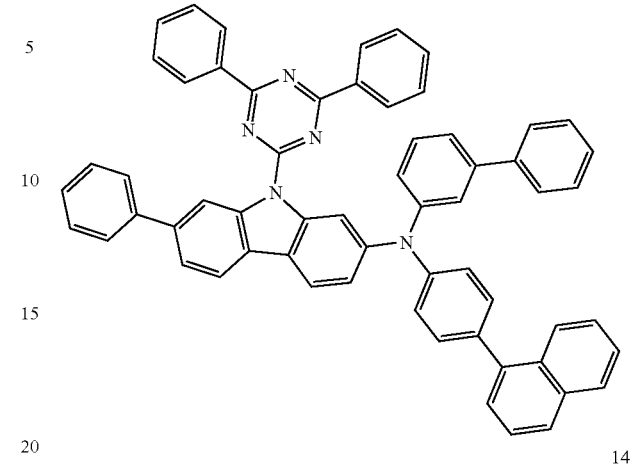
11
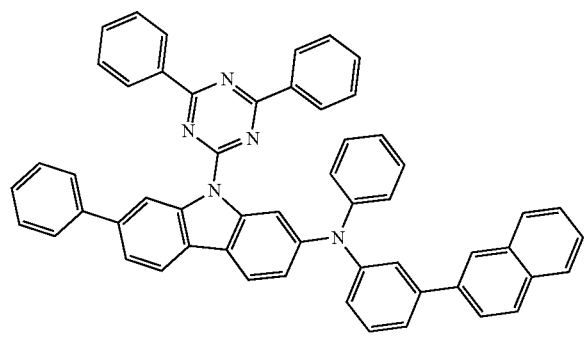
14
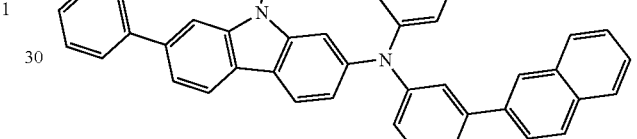
15
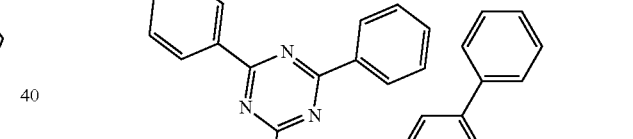
12
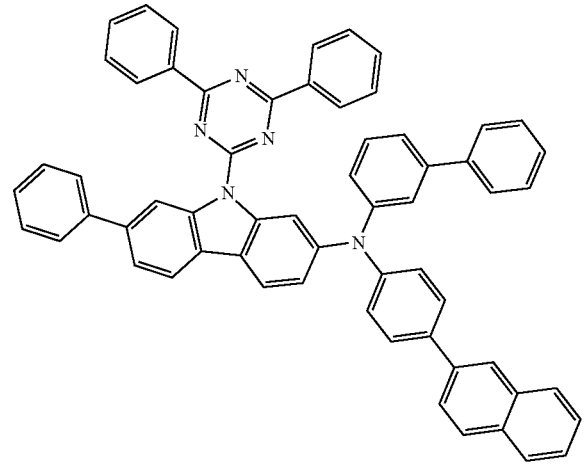
16
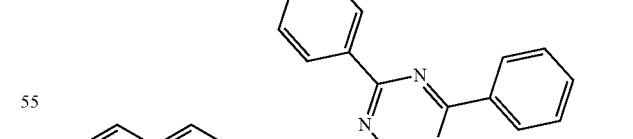

17
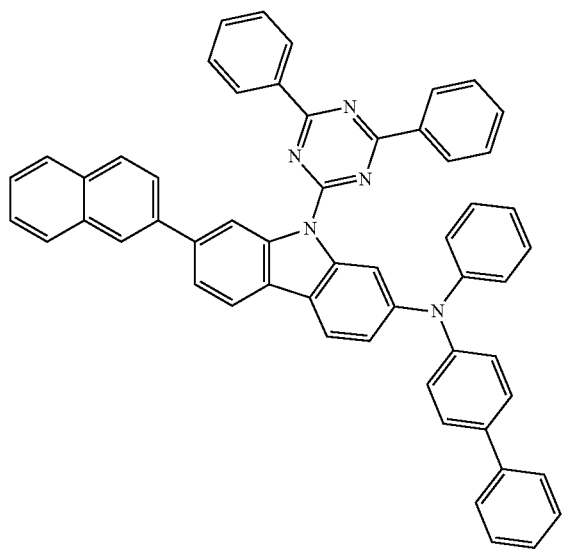
18
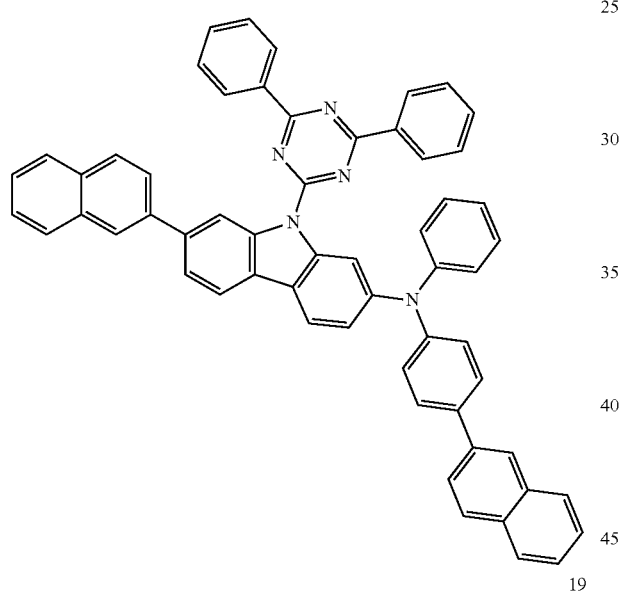
19
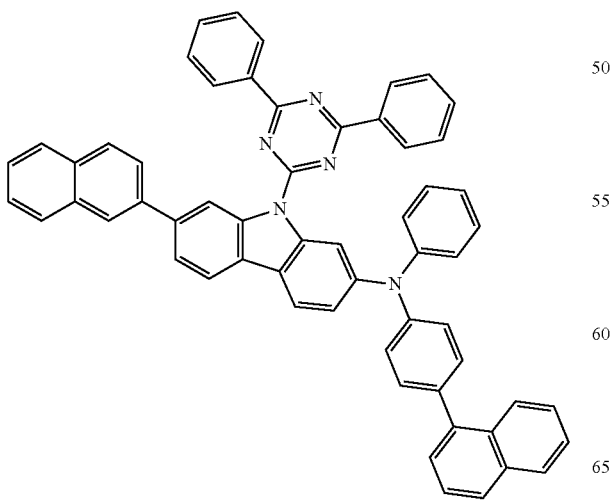
20
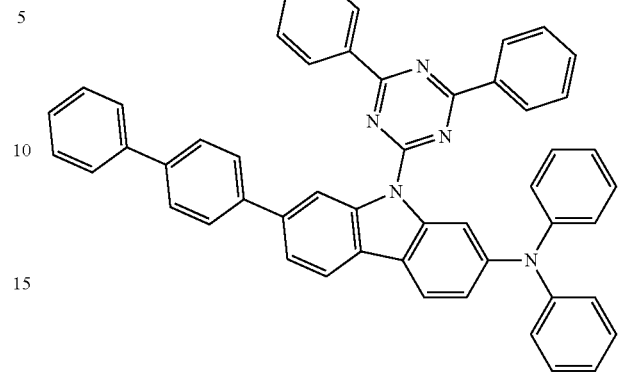
21
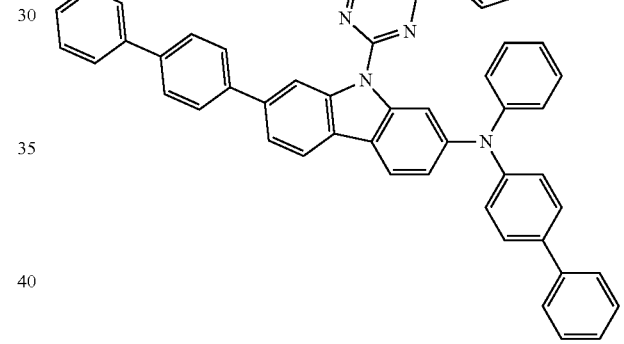
22
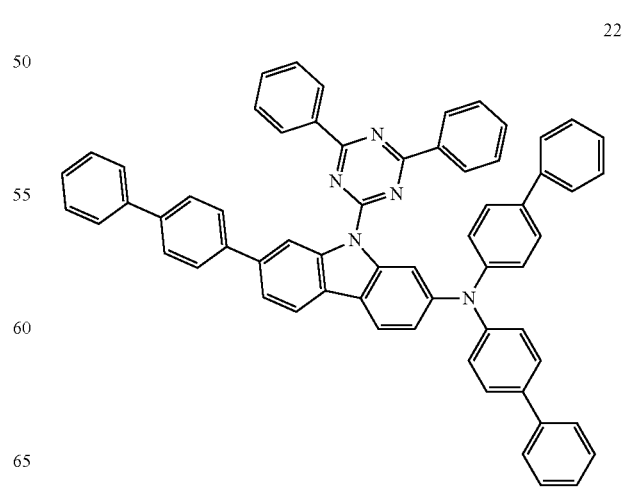

23
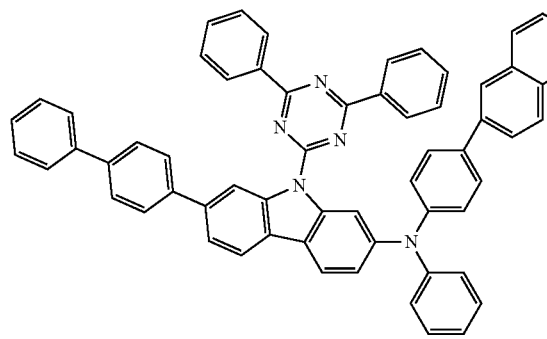
24
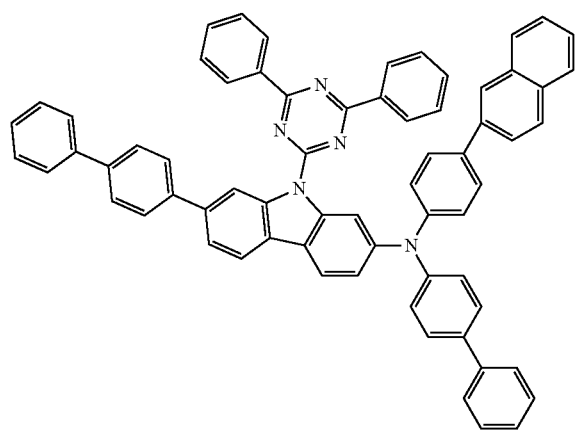
25
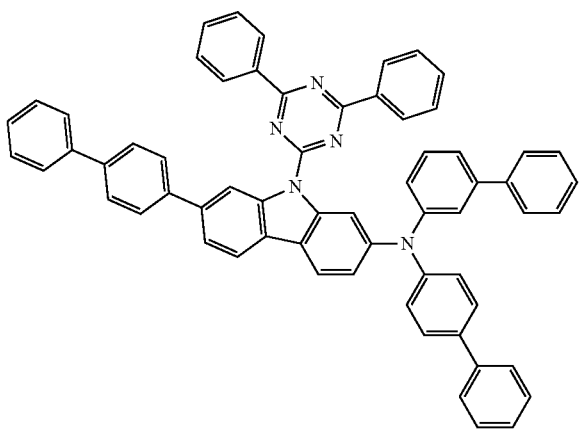
26
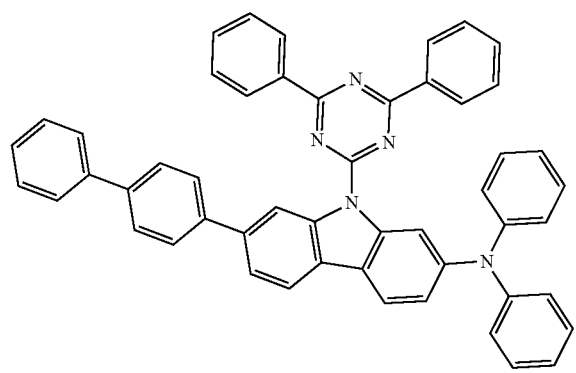
27
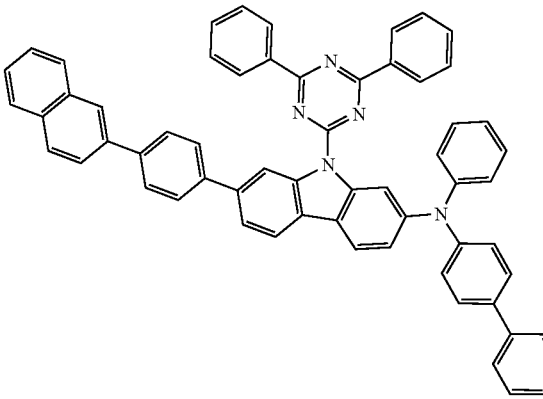
28
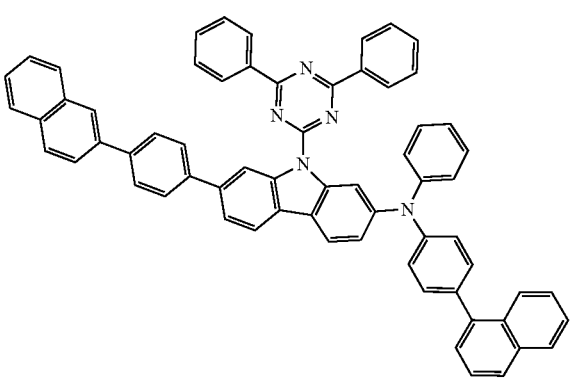
29
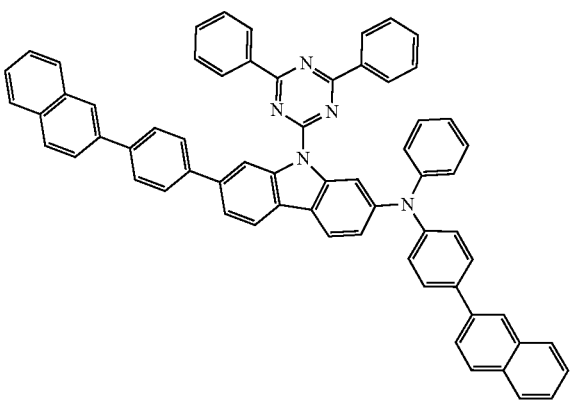
30
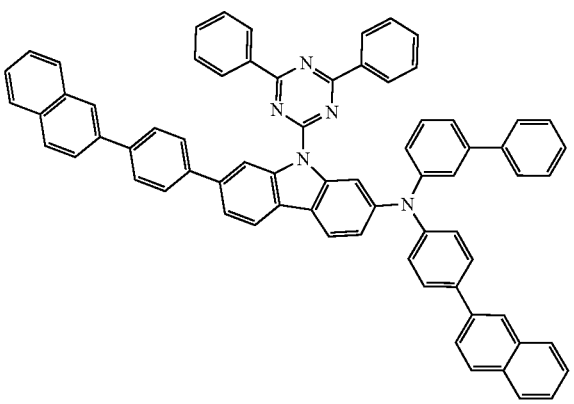

31
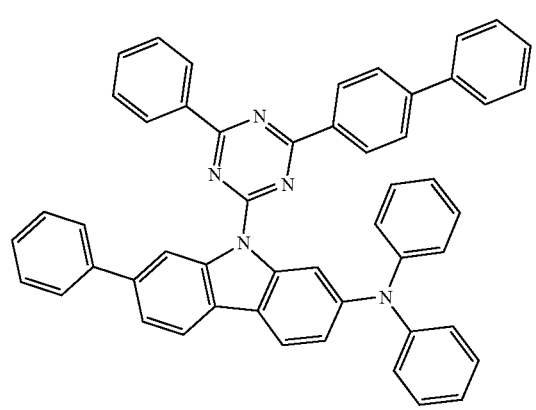
32
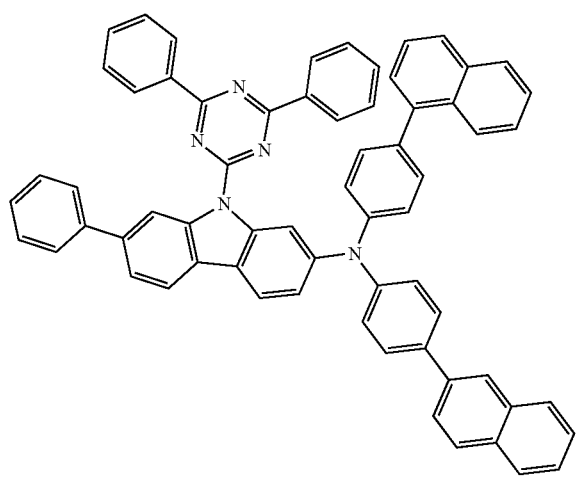
33
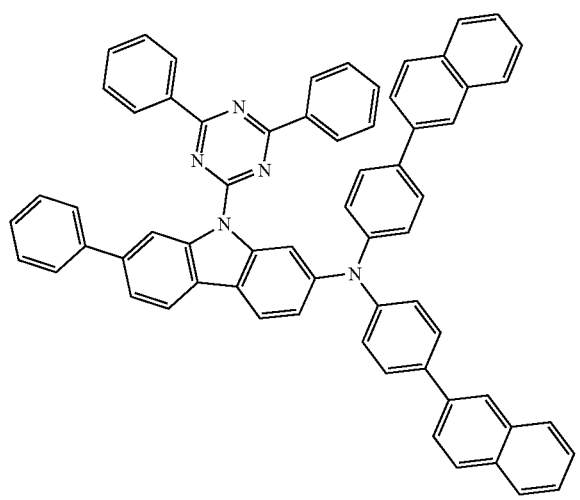
34
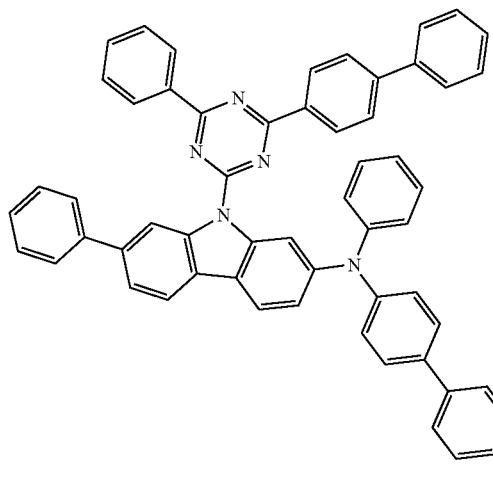
35
36
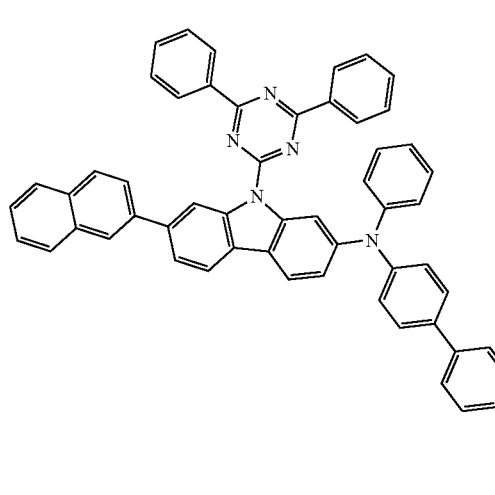

37
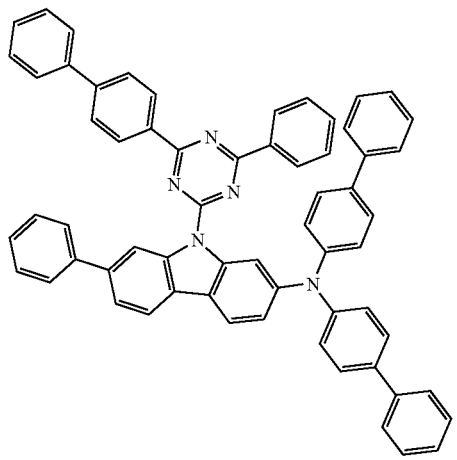
40
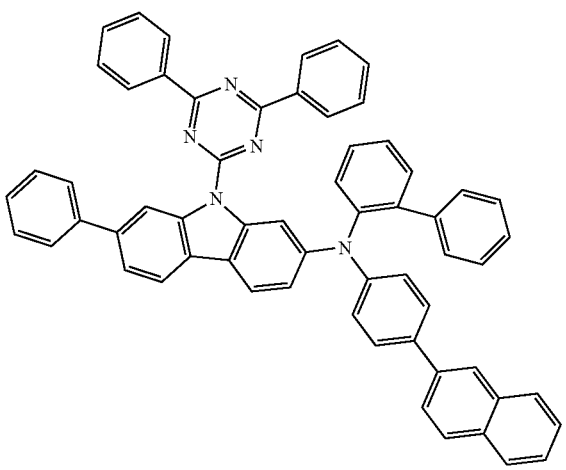
38
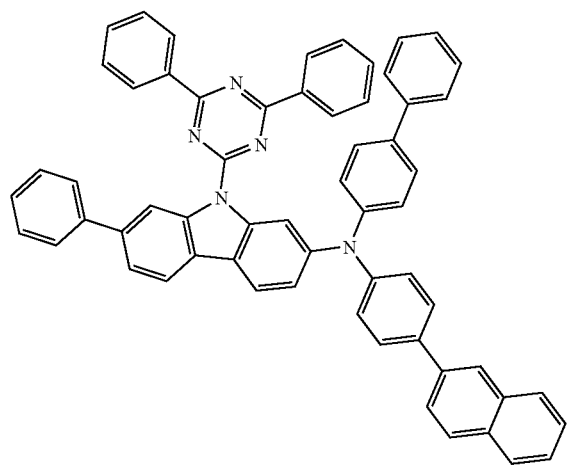
41
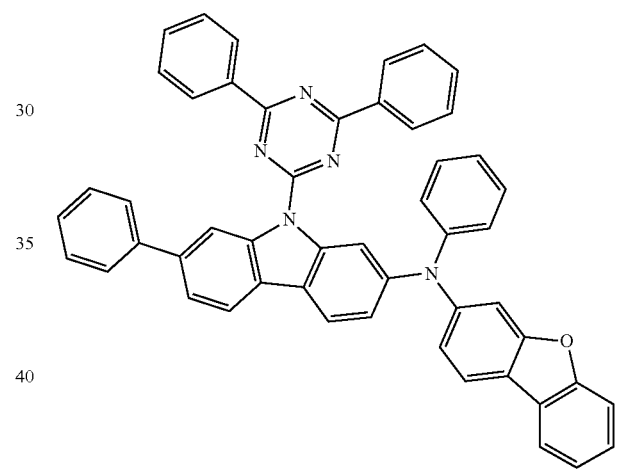
39
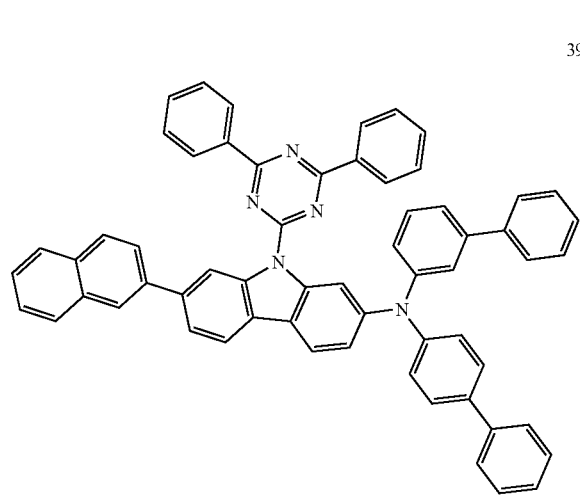
42
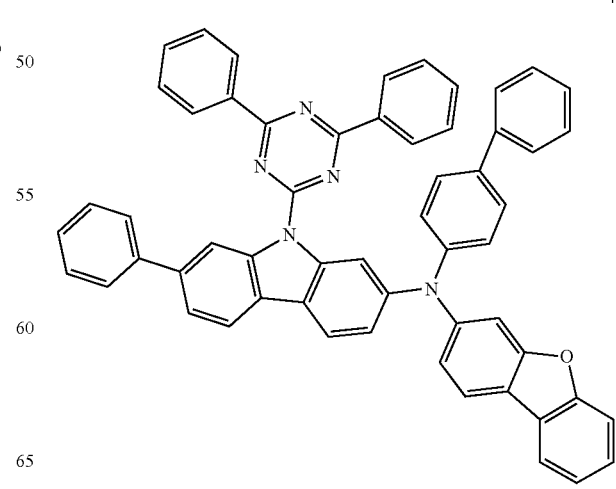

43
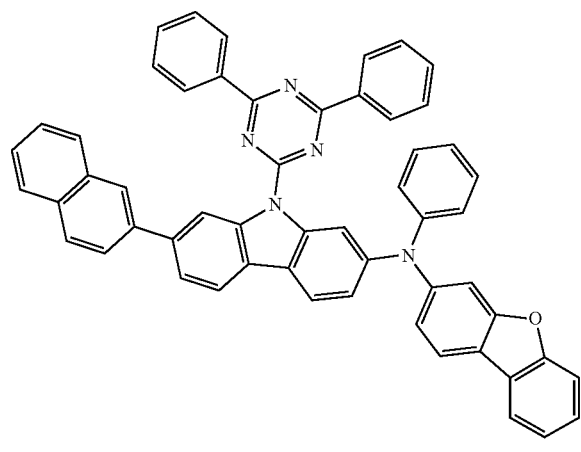
44
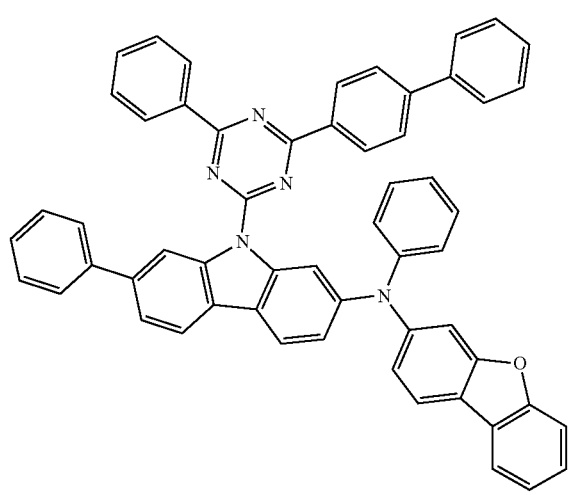
45
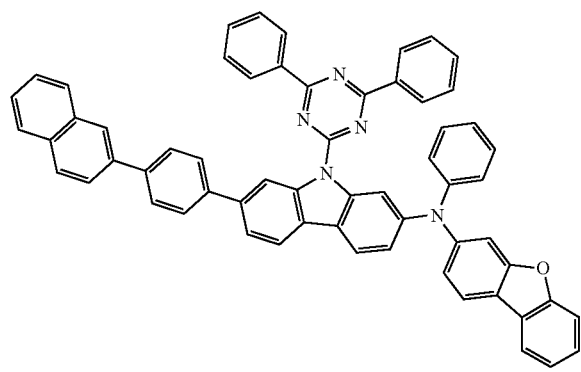
46
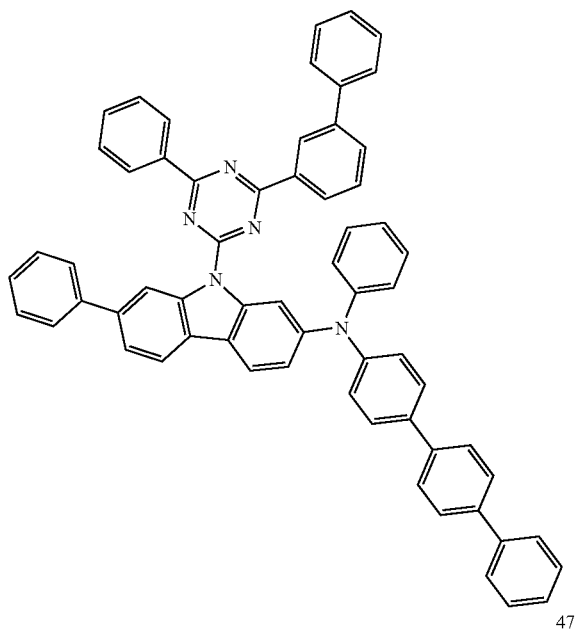
47
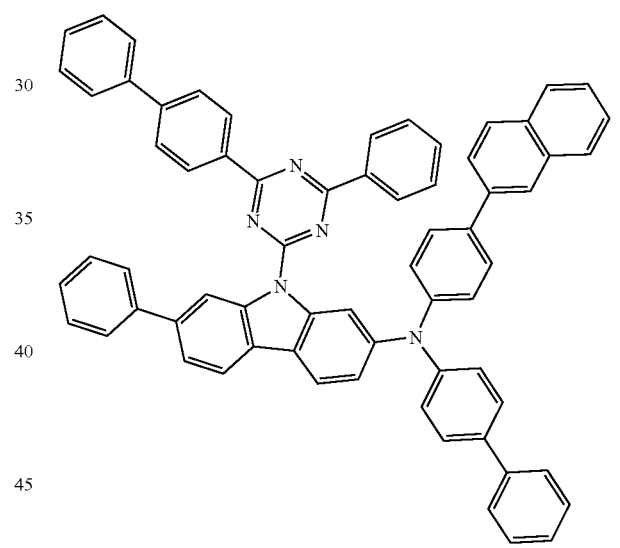
48
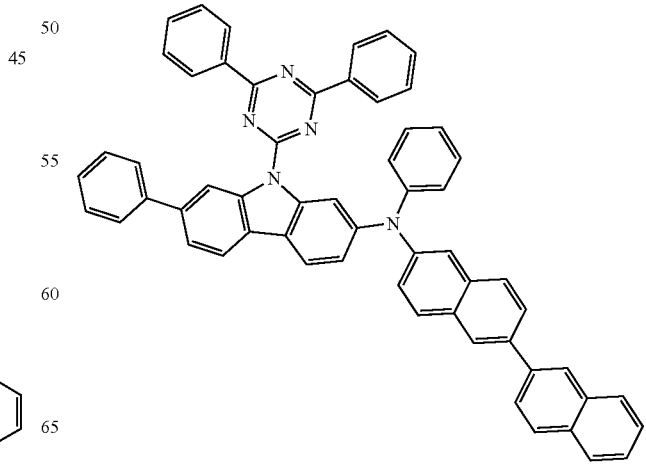

49
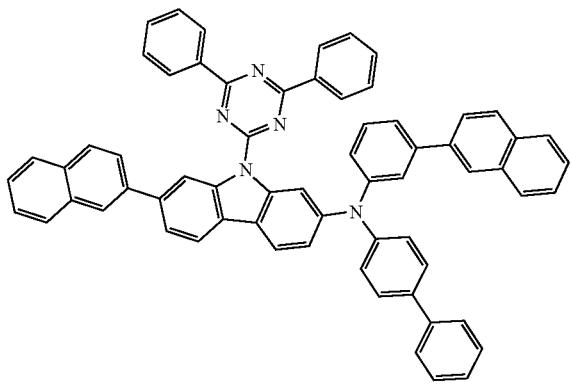
50
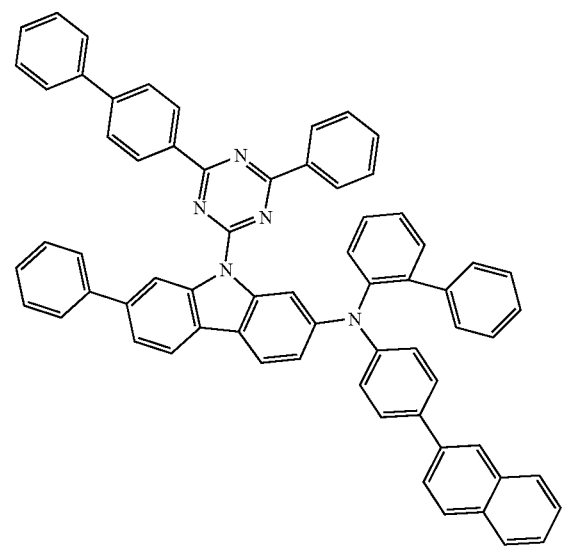
51
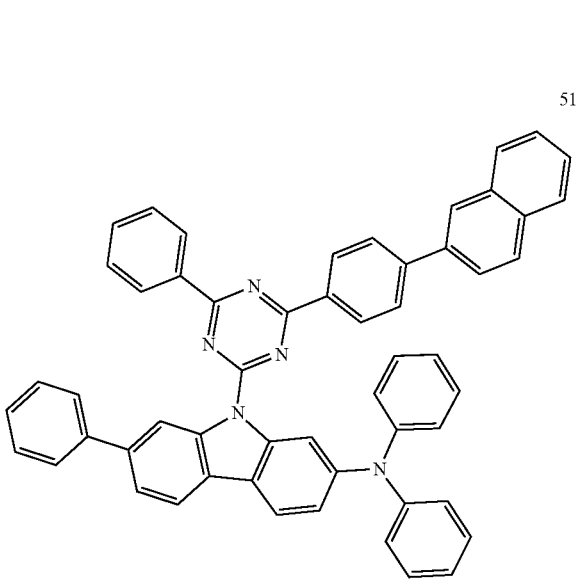
52
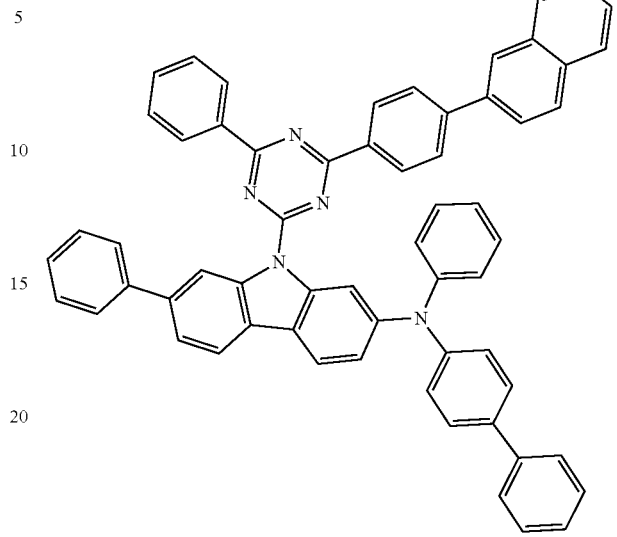
53
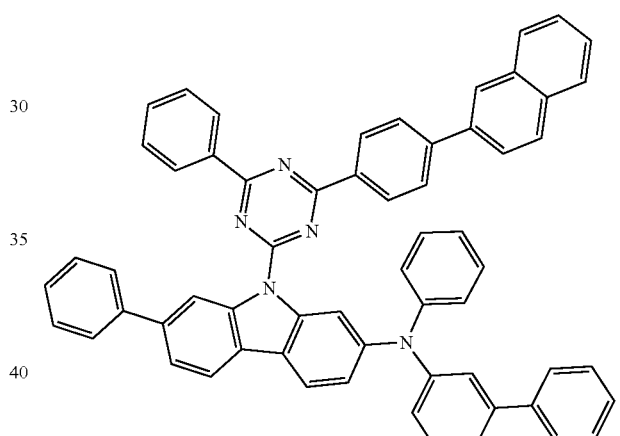
54
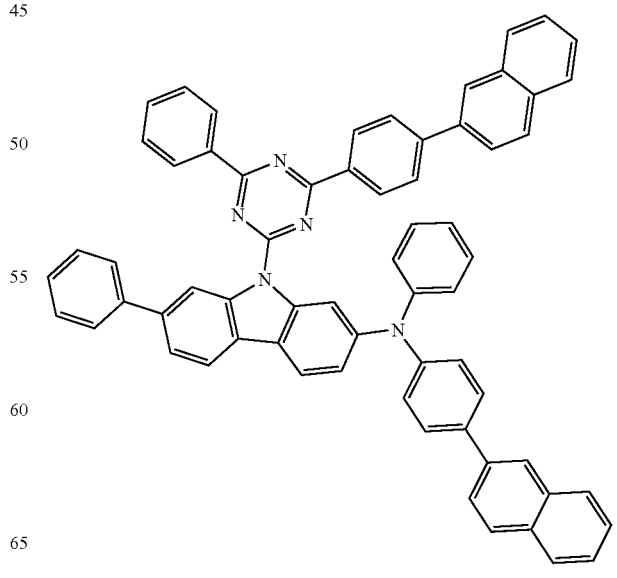

-continued
55
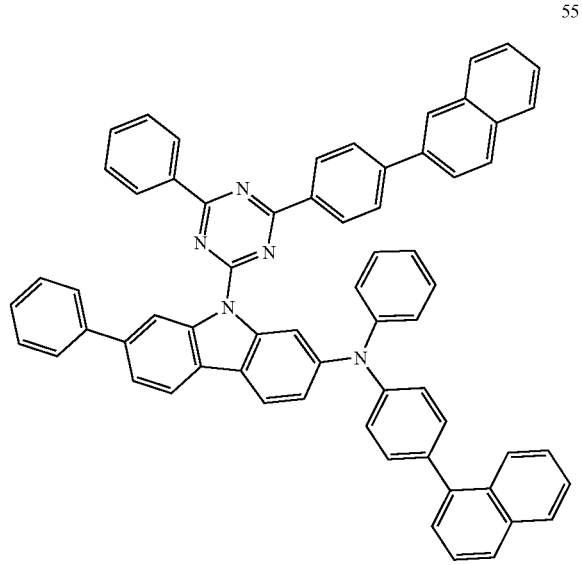
56
-continued
57
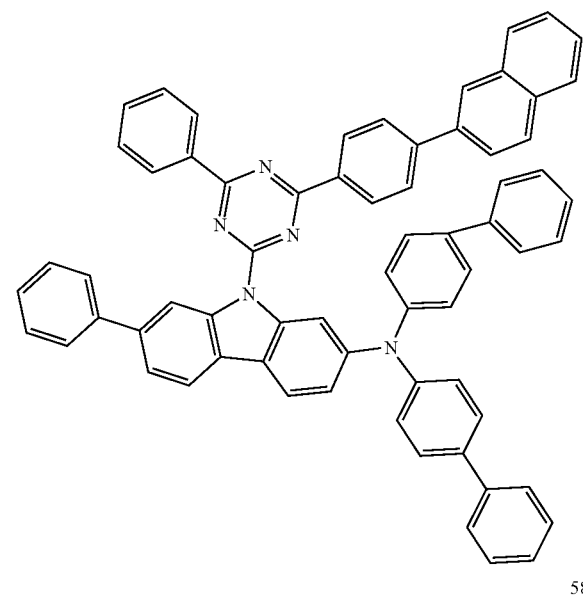
58
59

-continued
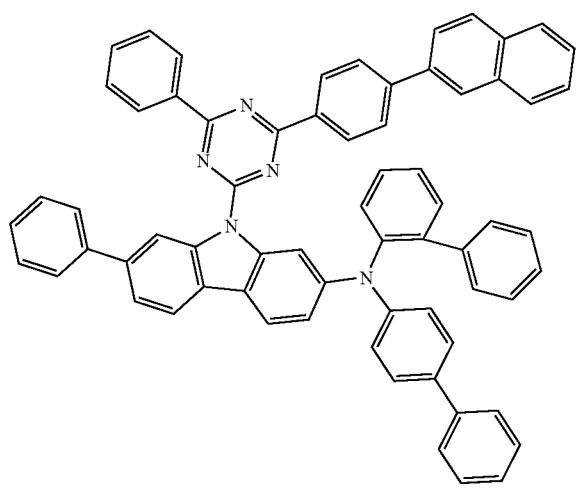
60
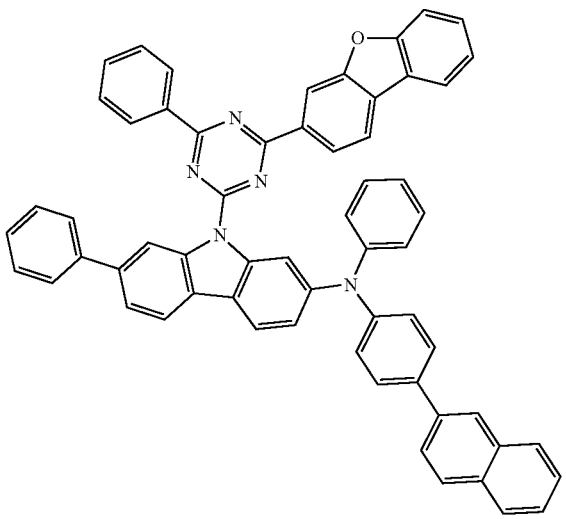
63
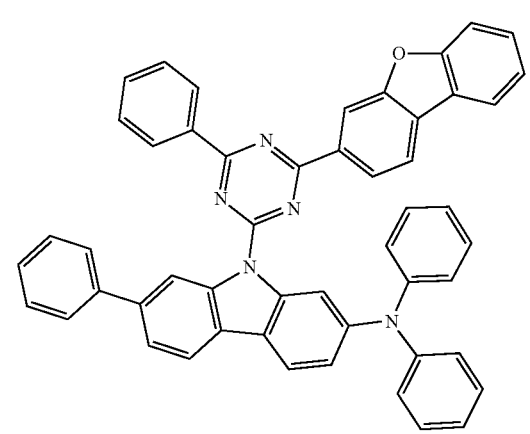
61
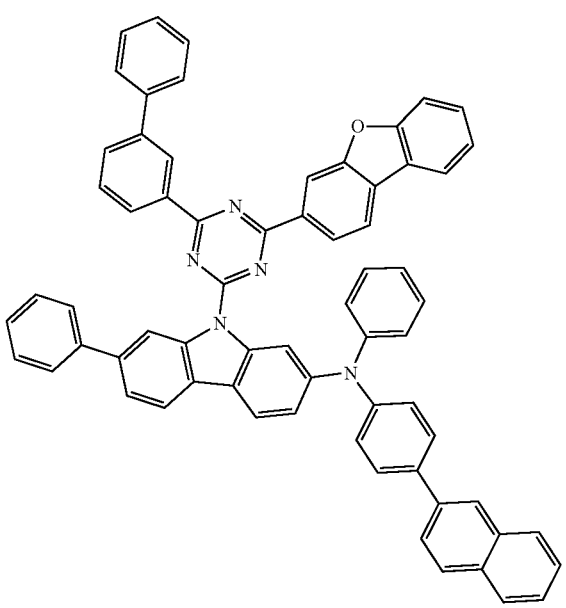
64

-continued

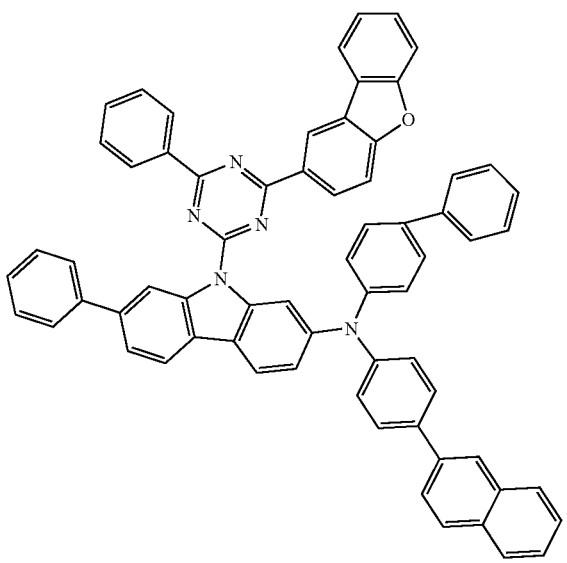

Hereinafter, an organic optoelectronic device to which the aforementioned compound is applied is described.

The organic optoelectronic device may be any device to convert electrical energy into photoenergy and vice versa, and may be, e.g., an organic photoelectric device, an organic light emitting diode, an organic solar cell, or an organic photo conductor drum.

Herein, an organic light emitting diode as one example of an organic optoelectronic device is described referring to drawings.

Figure 2:
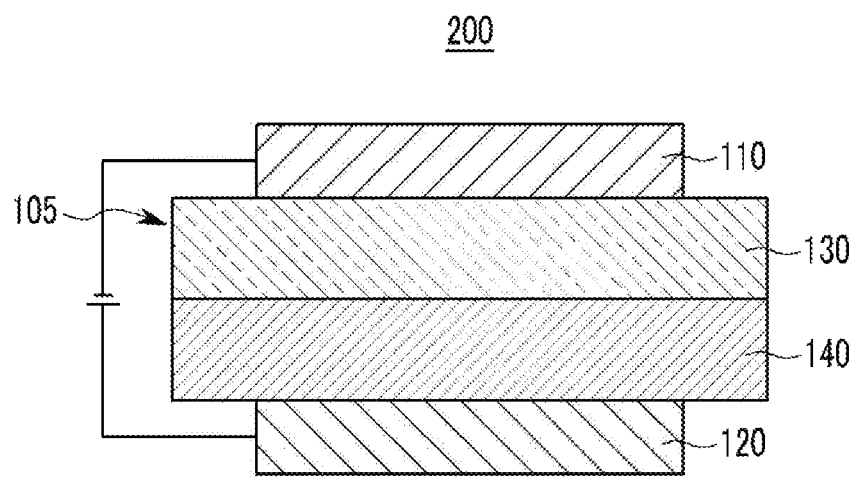

FIGS. 1 and 2 are cross-sectional views showing organic light emitting diodes according to embodiments.

Referring to FIG. 1, an organic light emitting diode 100 according to an embodiment may include an anode 120 and a cathode 110 facing each other and an organic layer 105 between the anode 120 and the cathode 110.

The anode 120 may be made of a conductor having a large work function to facilitate hole injection, and may include, e.g., a metal, a metal oxide and/or a conductive polymer. The anode 120 may include, e.g., a metal such as nickel, platinum, vanadium, chromium, copper, zinc, gold, or the like or an alloy thereof; metal oxide such as zinc oxide, indium oxide, indium tin oxide (ITO), indium zinc oxide (IZO), or the like; a combination of a metal and an oxide such as ZnO and Al or $SnO_2$ and Sb; a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to facilitate electron injection, and may include, e.g., a metal, a metal oxide and/or a conductive polymer. The cathode 110 may include, e.g., a metal such as magnesium, calcium, sodium, potassium, titanium, indium, yttrium, lithium, gadolinium, aluminum, silver, tin, lead, cesium, barium, or the like or an alloy thereof; a multi-layer structure material such as LiF/Al, $LiO_2$/Al, LiF/Ca, LiF/Al, or $BaF_2$/Ca.

The organic layer 105 may include a light emitting layer 130 including the aforementioned compound for the organic optoelectronic device.

The light emitting layer 130 may include, e.g., the aforementioned compound for the organic optoelectronic device. In an implementation, the compound for the organic optoelectronic device may be a phosphorescent host of the light emitting layer.

The light emitting layer may include a composition further including at least one compound in addition to the aforementioned compound for the organic optoelectronic device.

In an implementation, it may further include a dopant, e.g., a phosphorescent dopant. In an implementation, the dopant may be, e.g., a red phosphorescent dopant.

The dopant may be a material mixed with the aforementioned compound for the organic optoelectronic device in a small amount to cause light emission and generally a material such as a metal complex that emits light by multiple excitation into a triplet or more. The dopant may include, e.g., an inorganic, organic, or organic/inorganic compound, and one or more types thereof may be used.

Examples of the dopant may include a phosphorescent dopant and examples of the phosphorescent dopant may be an organometal compound including Ir, Pt, Os, Ti, Zr, Hf, Eu, Tb, Tm, Fe, Co, Ni, Ru, Rh, Pd, or a combination thereof. In an implementation, the phosphorescent dopant may include, e.g., a compound represented by Chemical Formula Z.

LMX [Chemical Formula Z]

In Chemical Formula Z, M may be, e.g., a metal, L and X may each independently be, e.g., a ligand to form a complex compound with M.

The M may include, e.g., Ir, Pt, Os, Ti, Zr, Hf, Eu, Tb, Tm, Fe, Co, Ni, Ru, Rh, Pd, or a combination thereof and L and X may include, e.g., a bidendate ligand.

The aforementioned compound for the organic optoelectronic device and/or the composition thereof may be formed by a dry film formation method such as chemical vapor deposition (CVD).

Referring to FIG. 2, an organic light emitting diode 200 may further include a hole auxiliary layer 140 in addition to the light emitting layer 130. The hole auxiliary layer 140 may further increase hole injection and/or hole mobility and may block electrons between the anode 120 and the light emitting layer 130. The hole auxiliary layer 140 may be include, e.g., a hole transport layer, a hole injection layer, and/or an electron blocking layer and may include at least one layer.

The hole auxiliary layer 140 may include, e.g., a compound of Group A, below.

In an implementation, the hole auxiliary layer 140 may include a hole transport layer between the anode 120 and the light emitting layer 130 and a hole transport auxiliary layer between the light emitting layer 130 and the hole transport layer and at least one of the compounds of Group A may be included in the hole transport auxiliary layer.

[Group A]
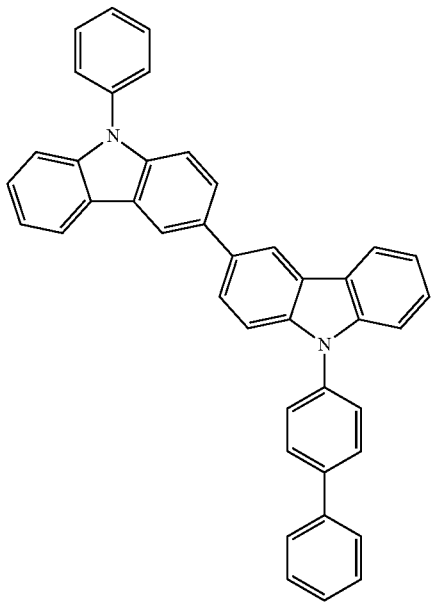
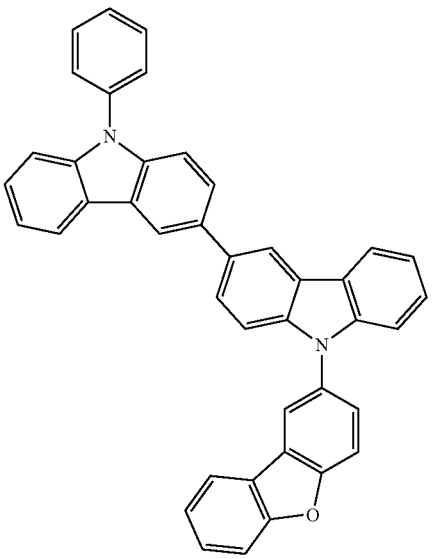
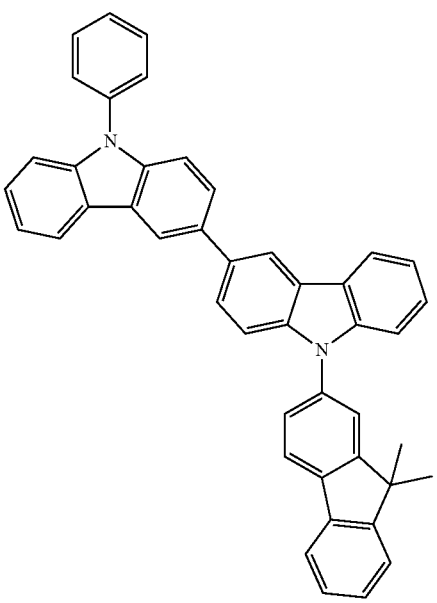
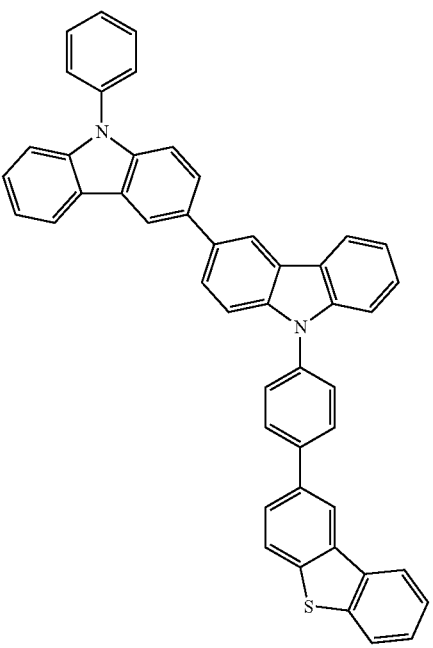

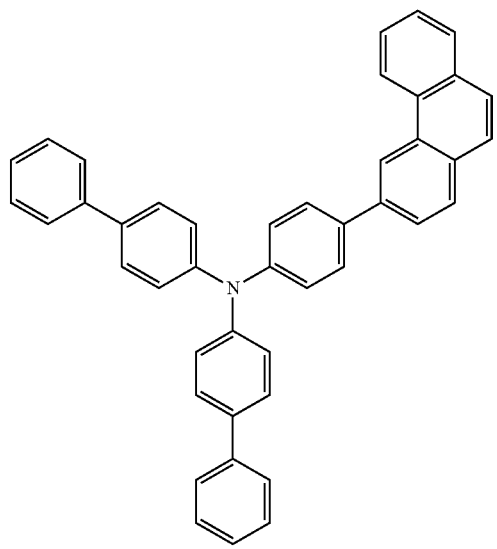
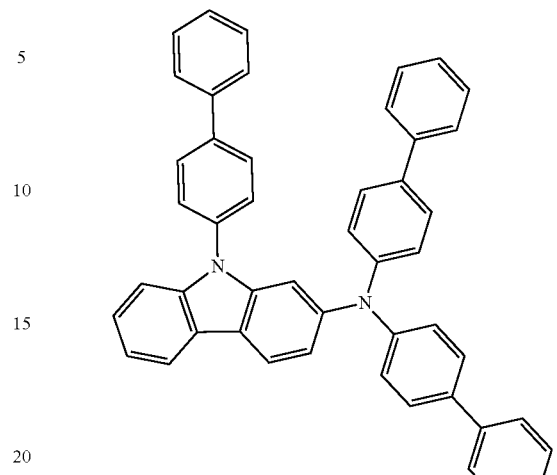
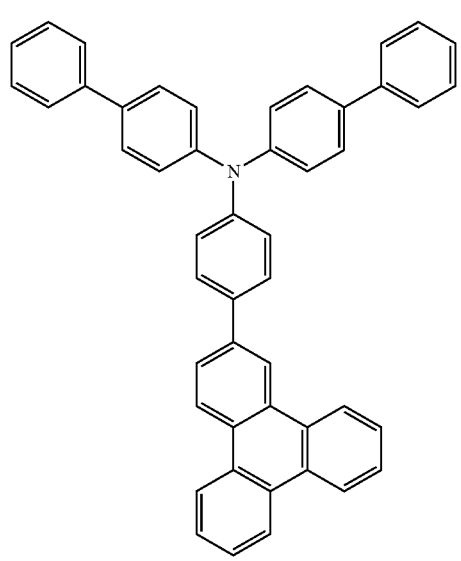
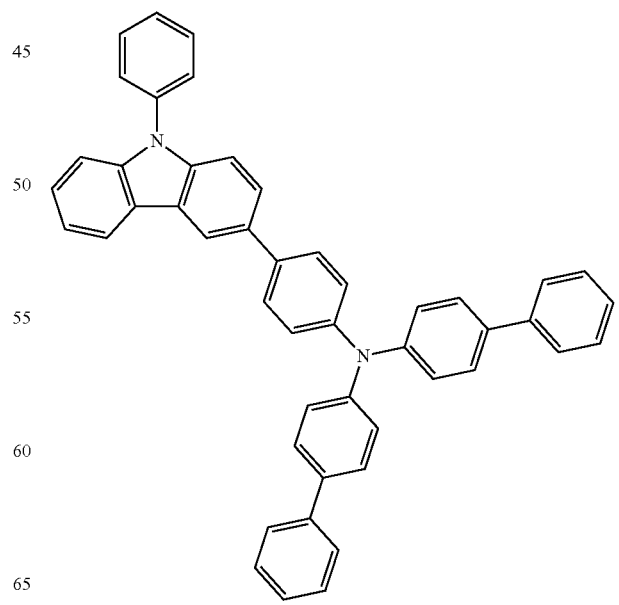

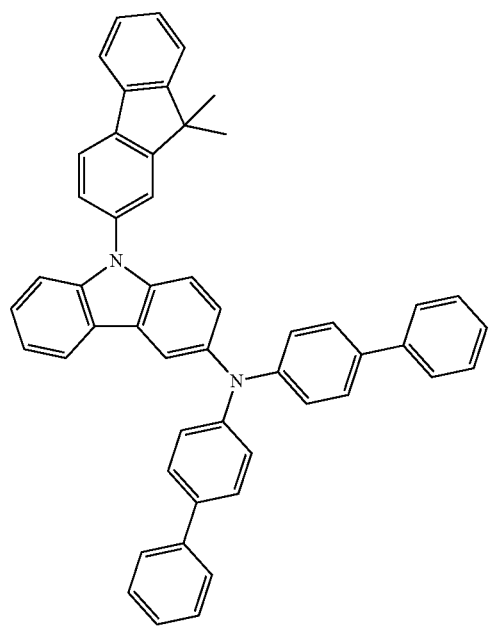
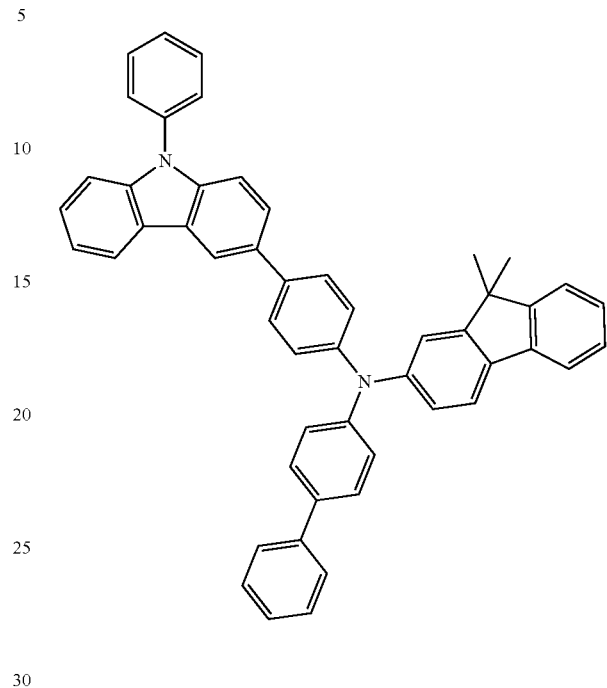
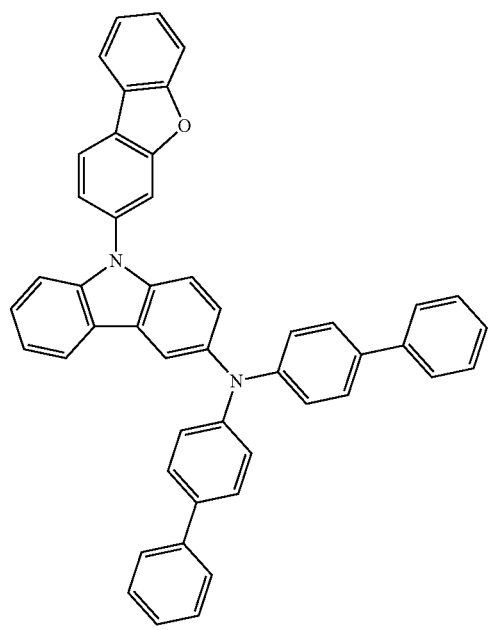
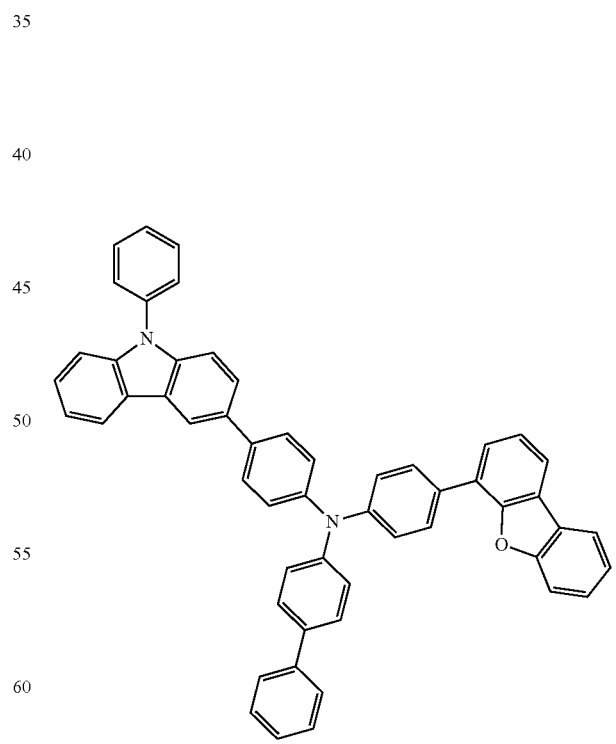

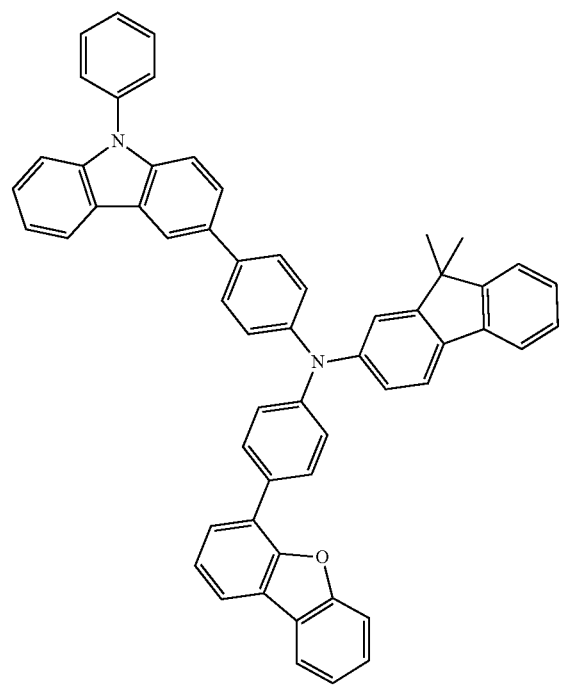
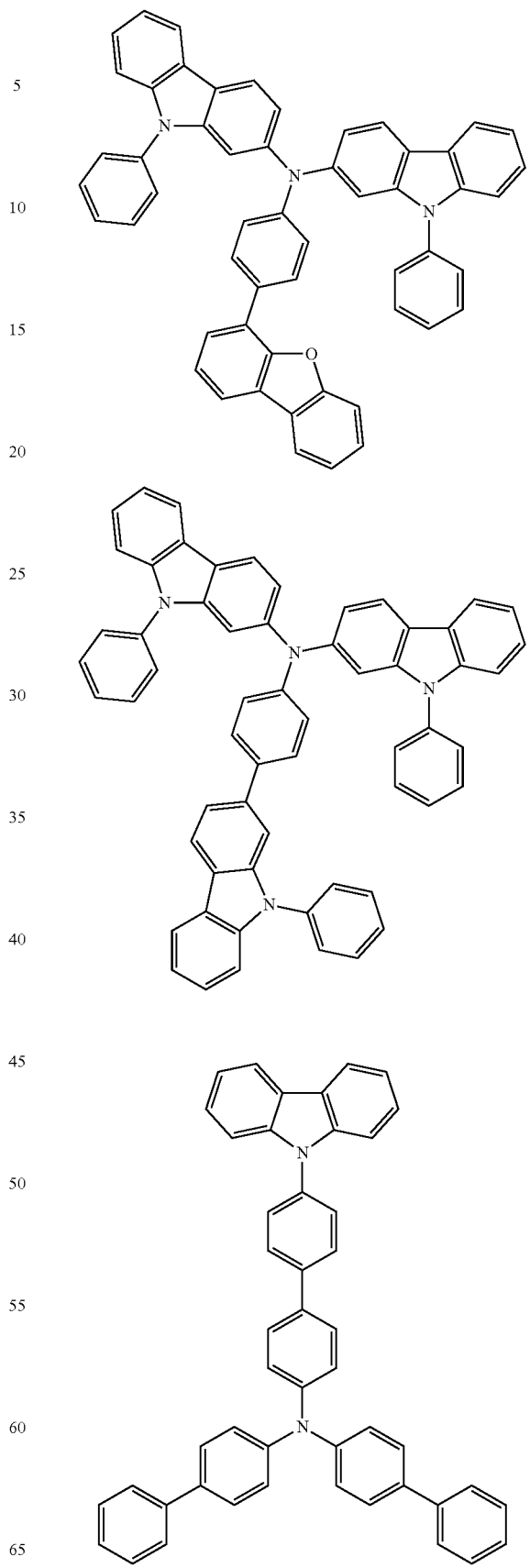

65
-continued
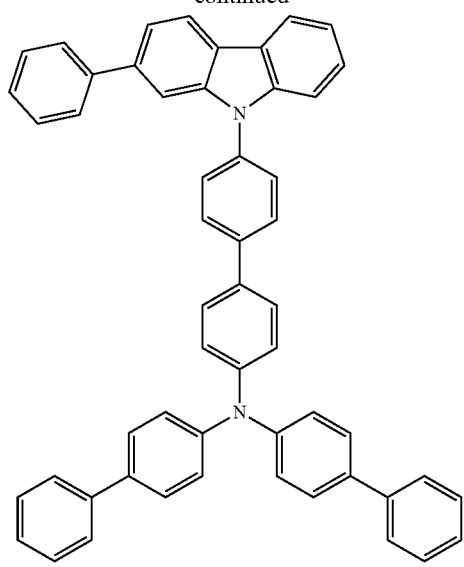
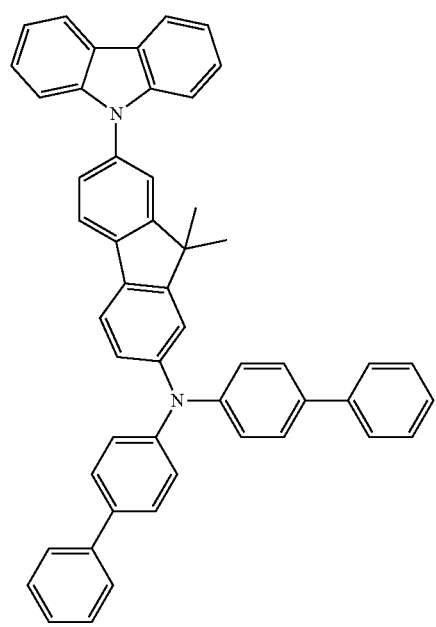
66
-continued
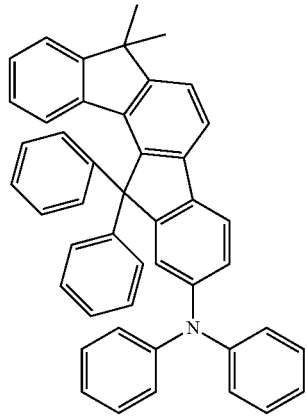
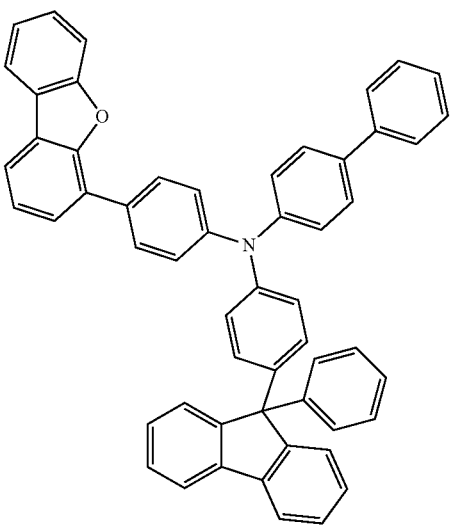
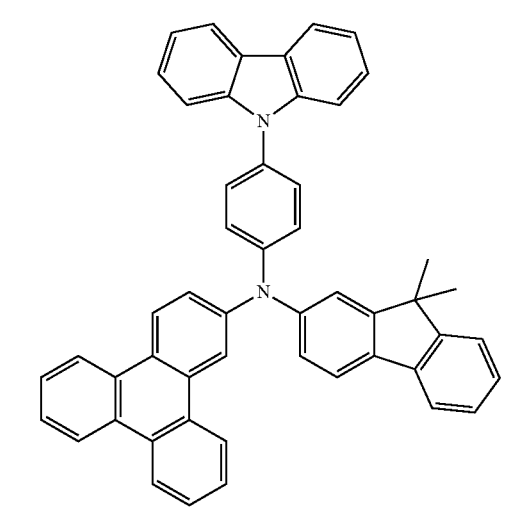

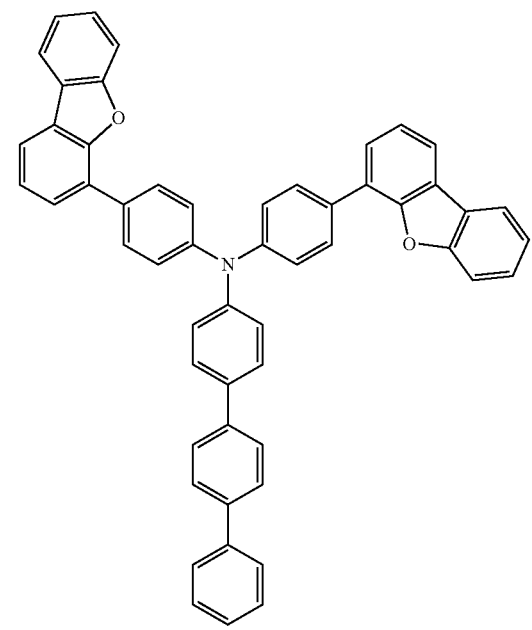
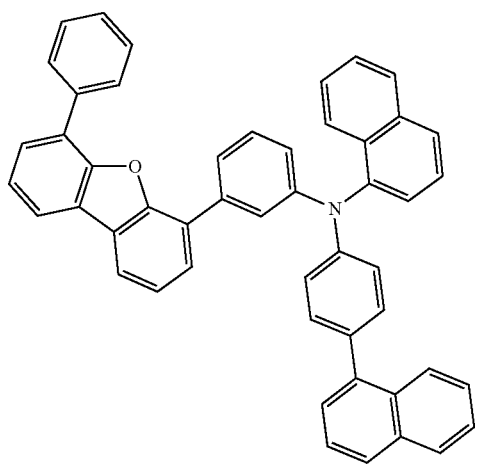
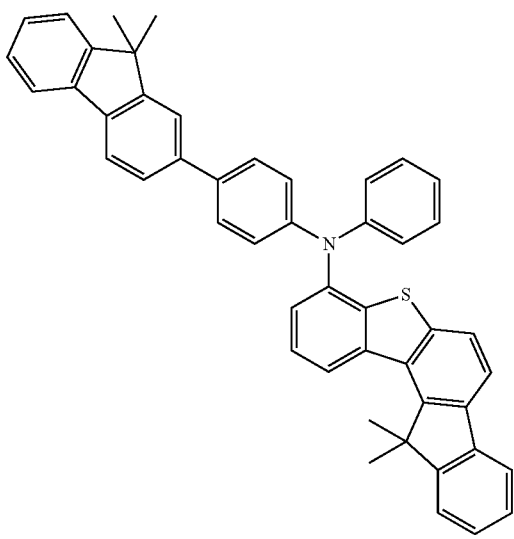
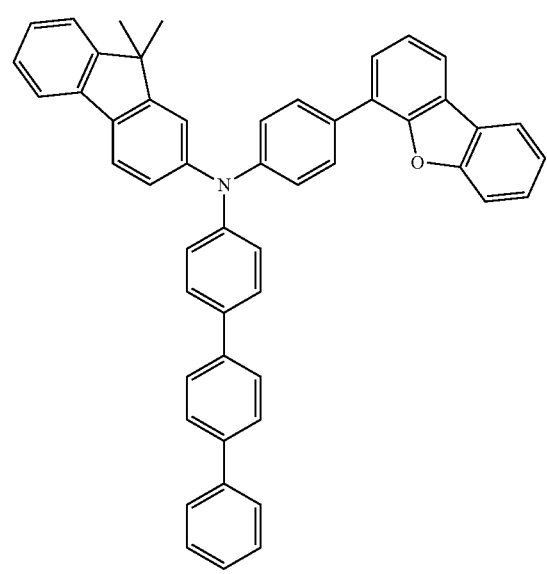
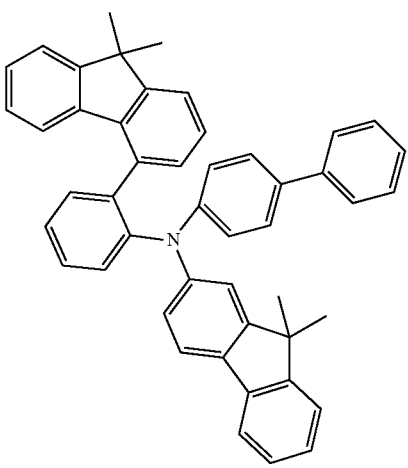

69
-continued
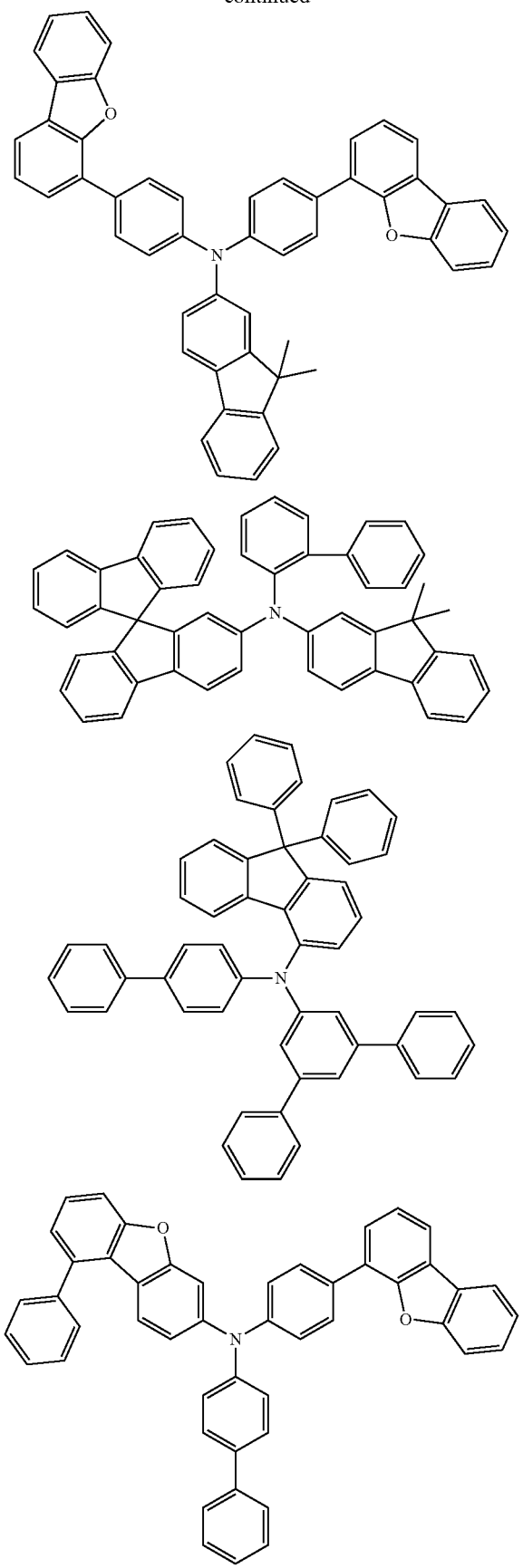
70
-continued
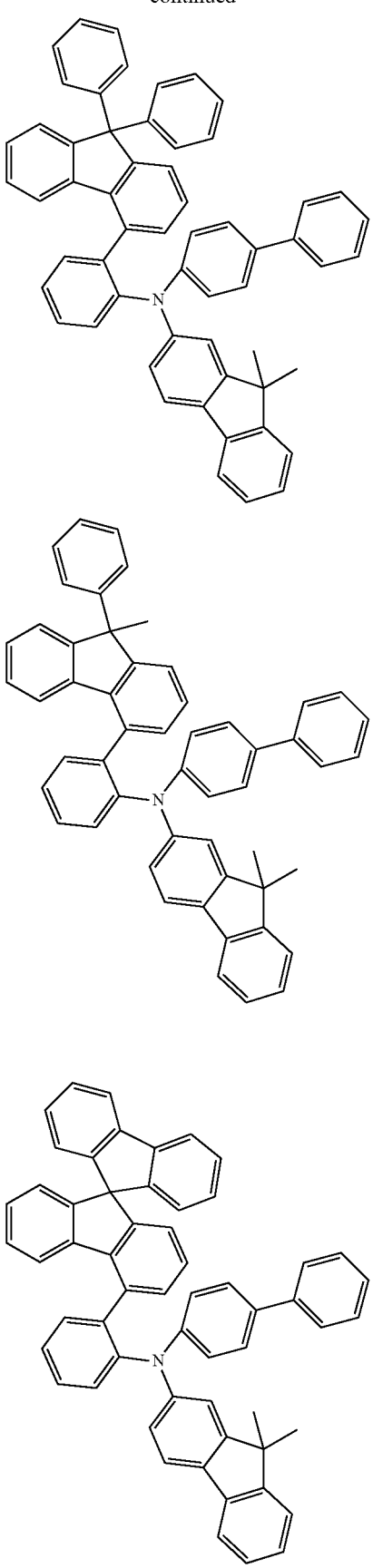

71
-continued
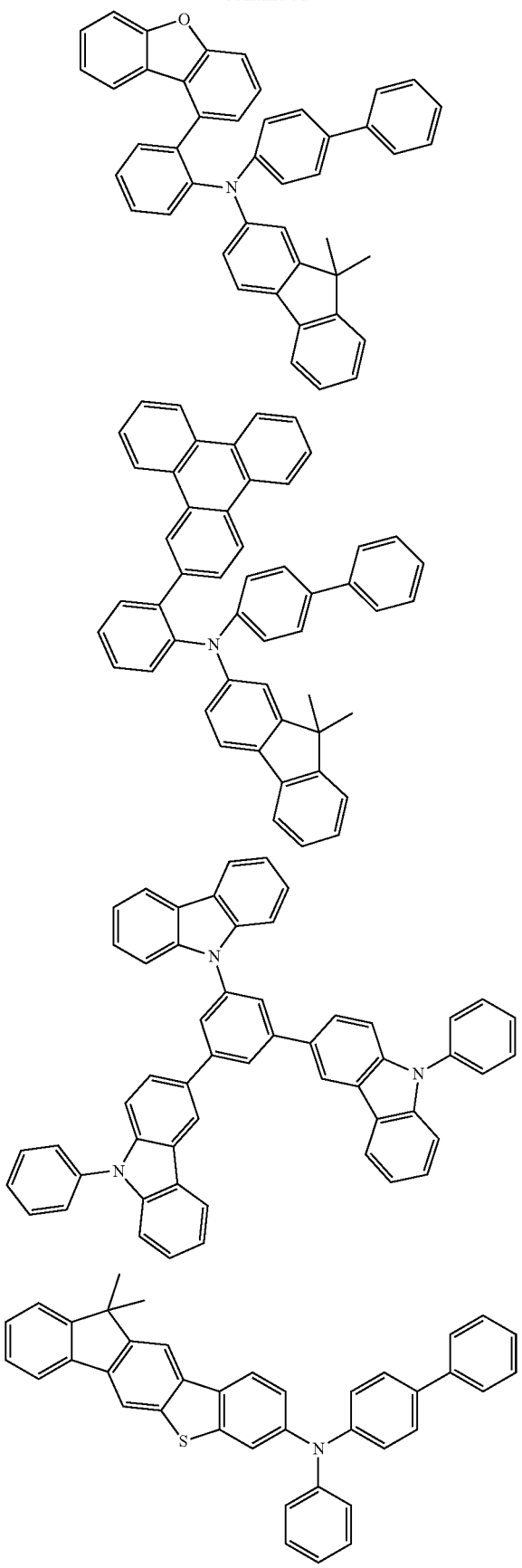
72
-continued
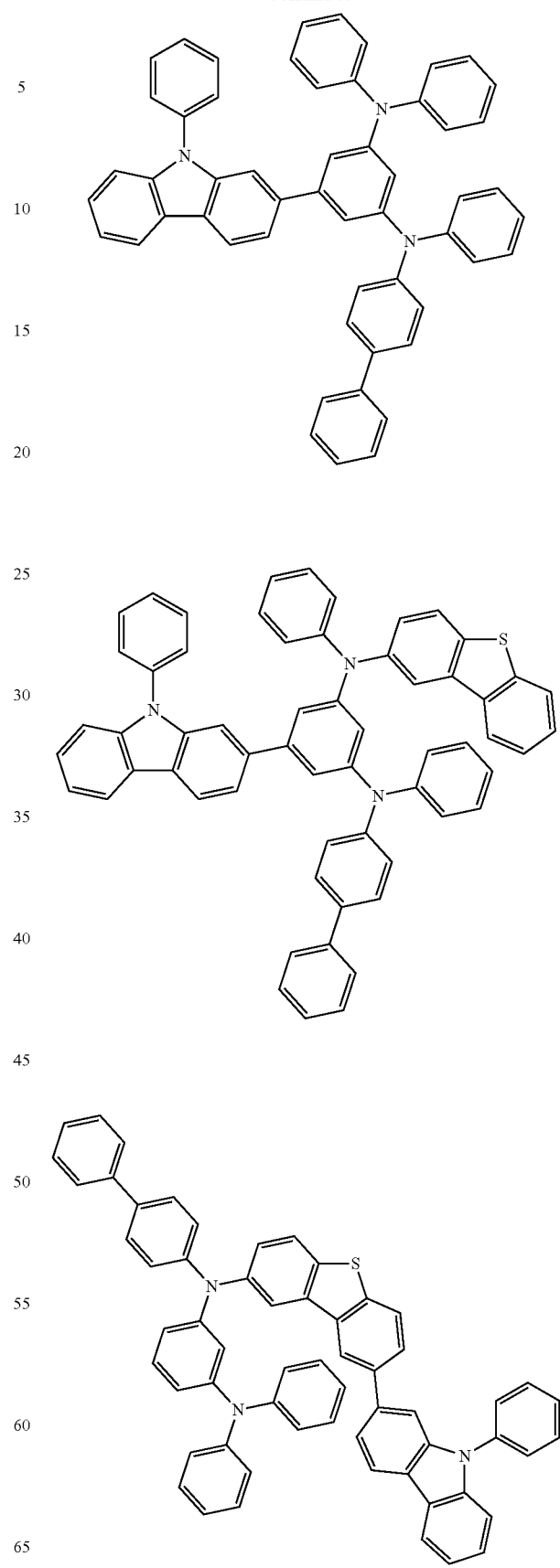

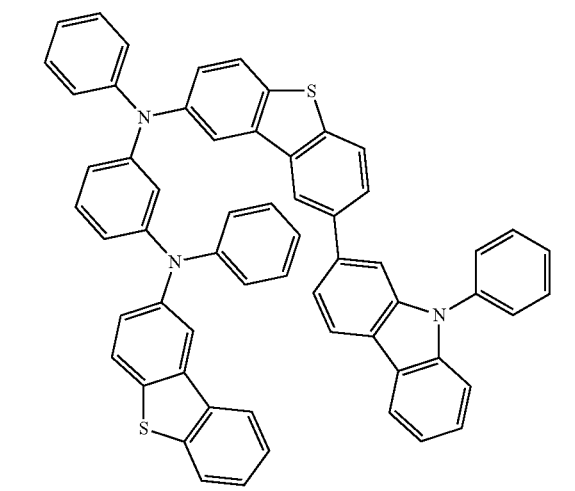
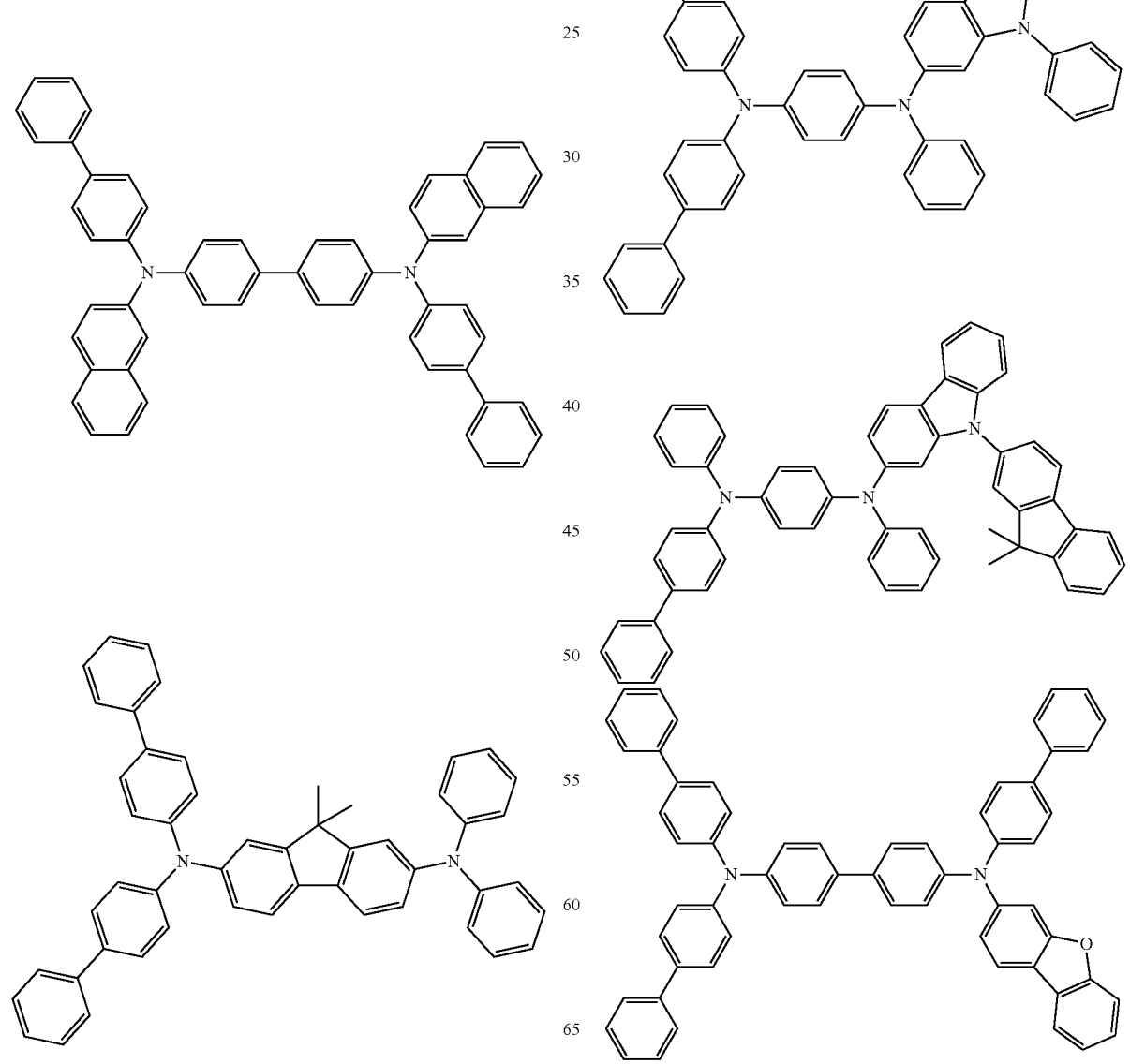

75
-continued
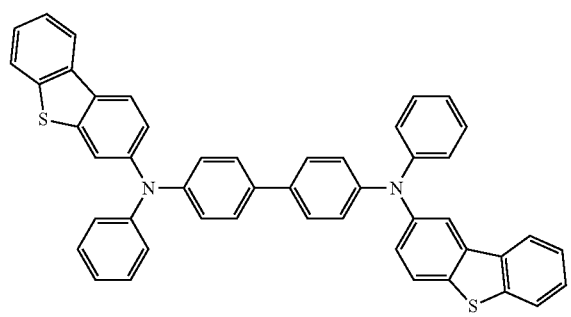
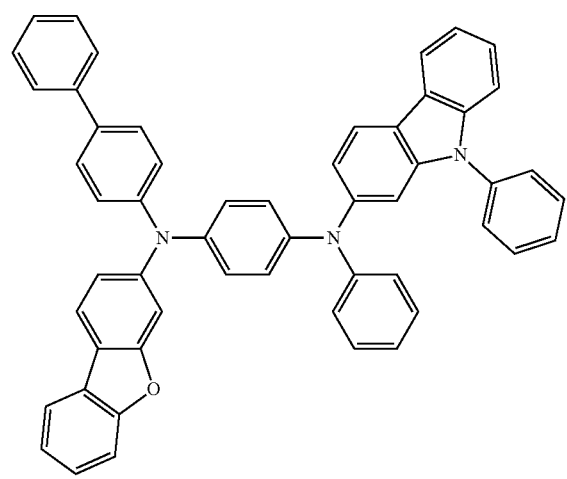
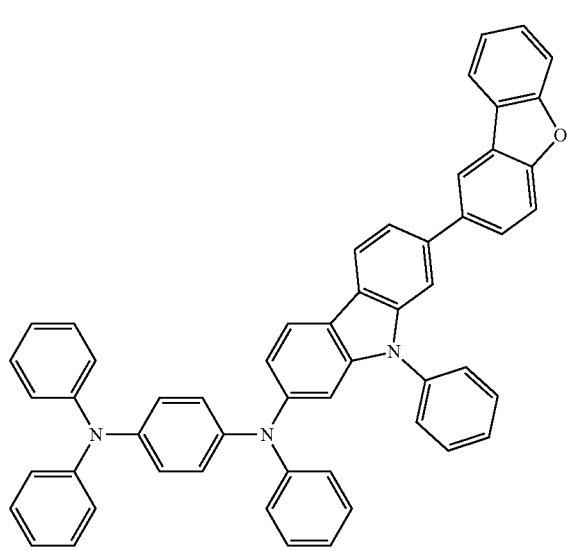
76
-continued
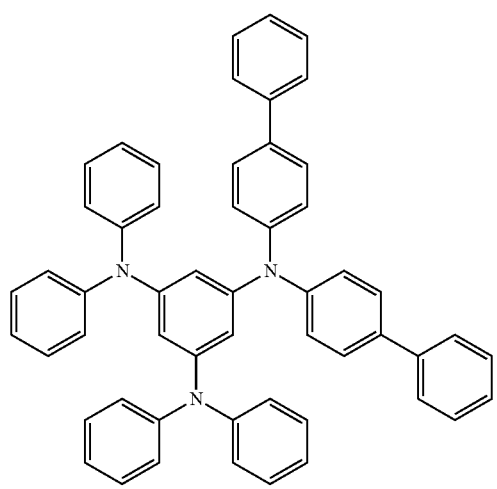
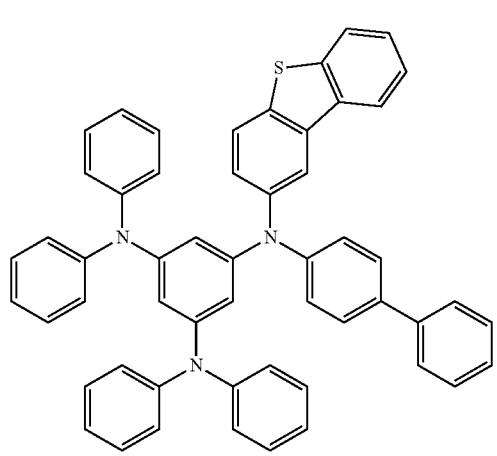
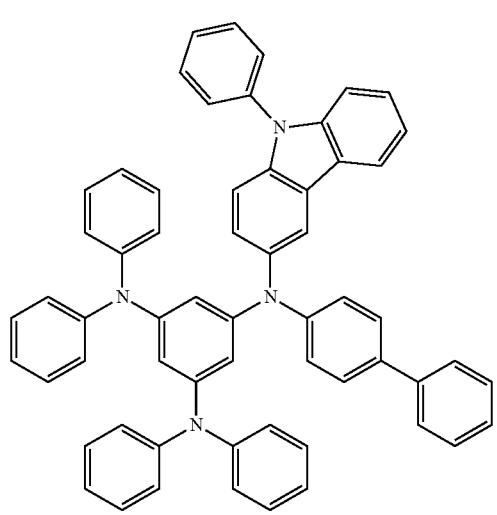

77
-continued
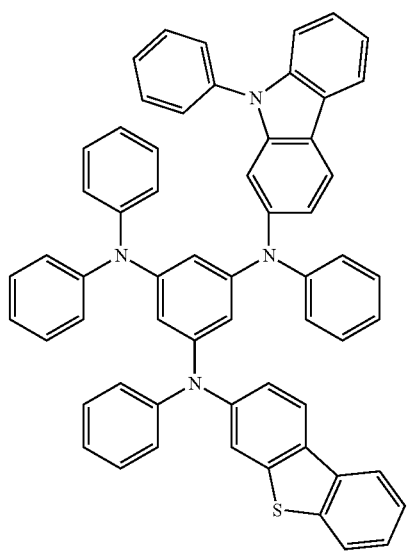
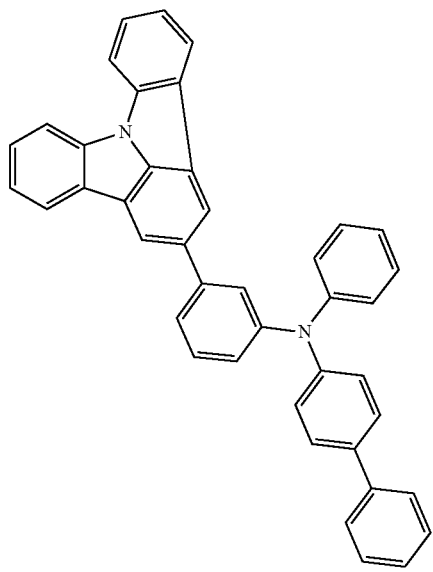
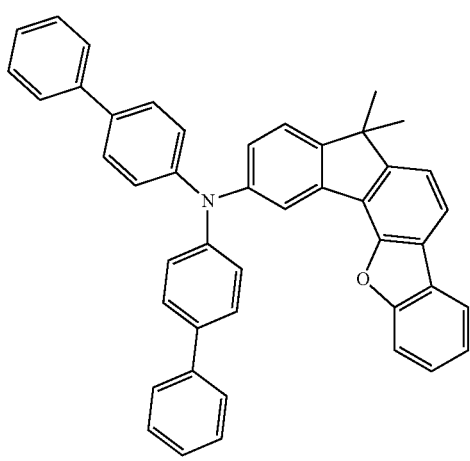
78
-continued
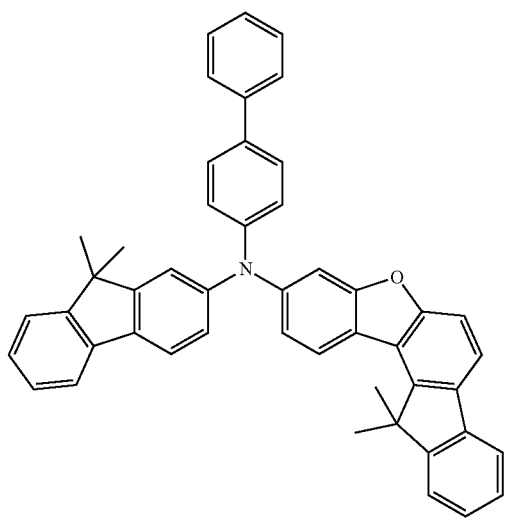
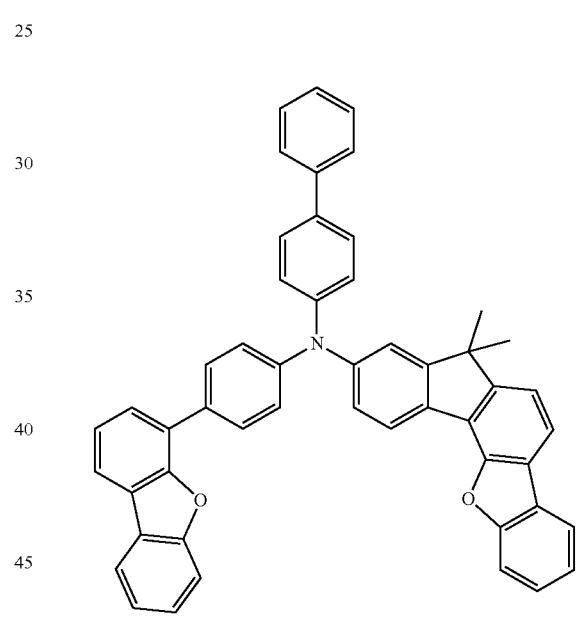
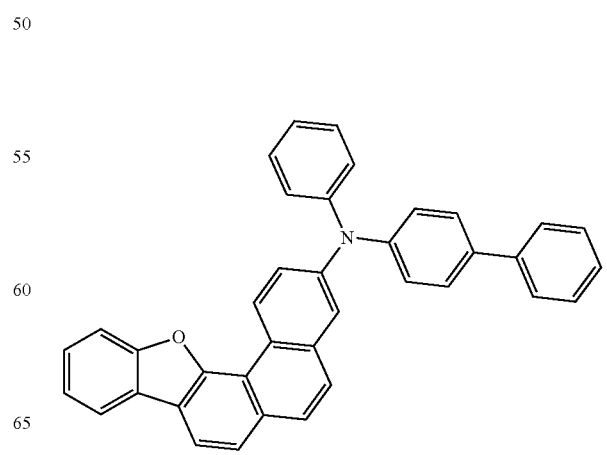

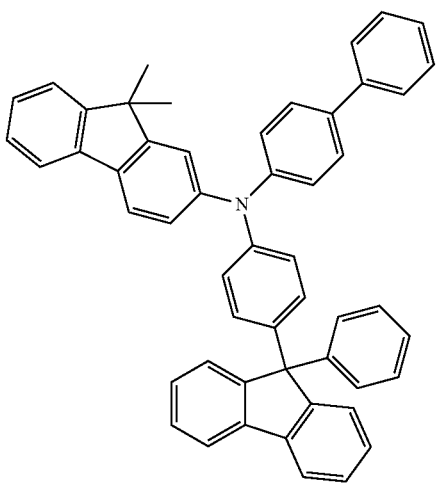
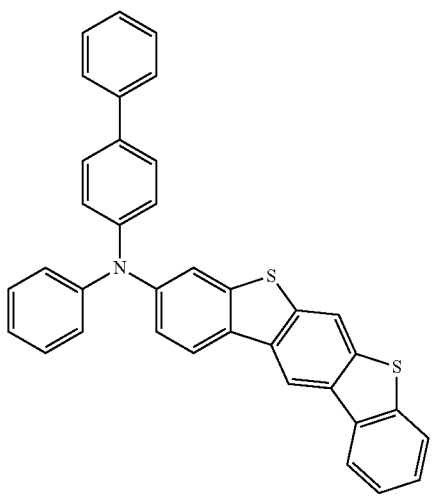
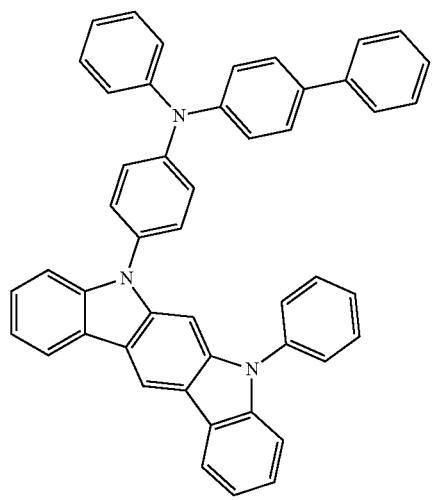
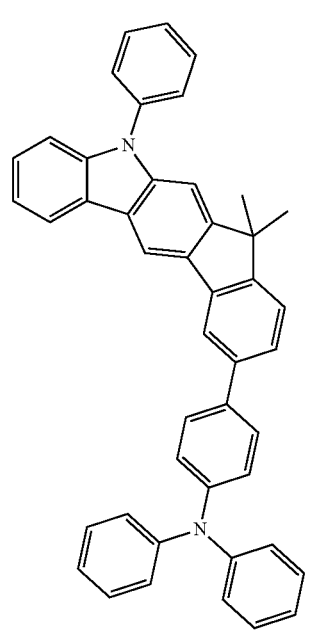
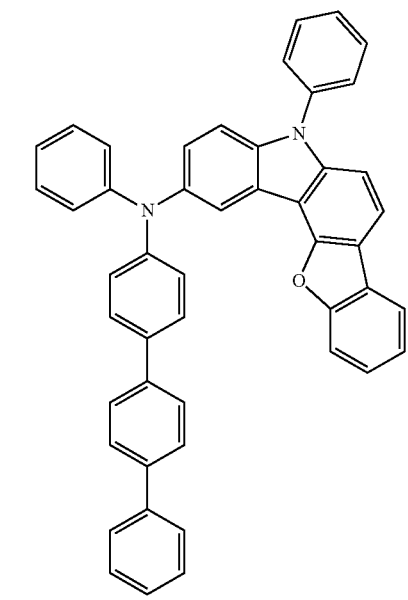
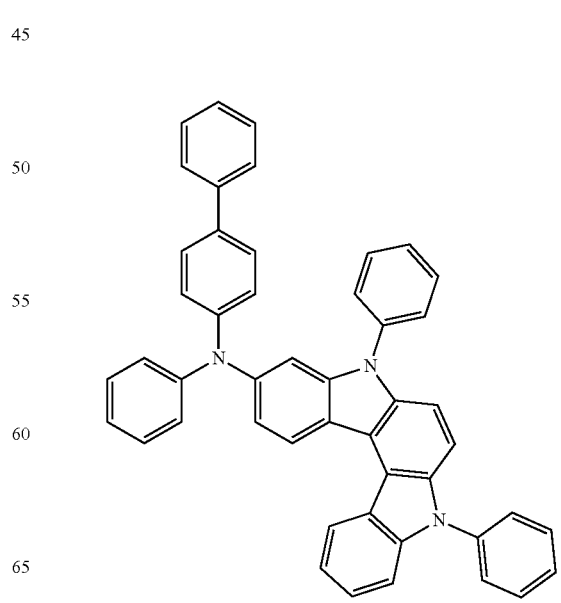

-continued

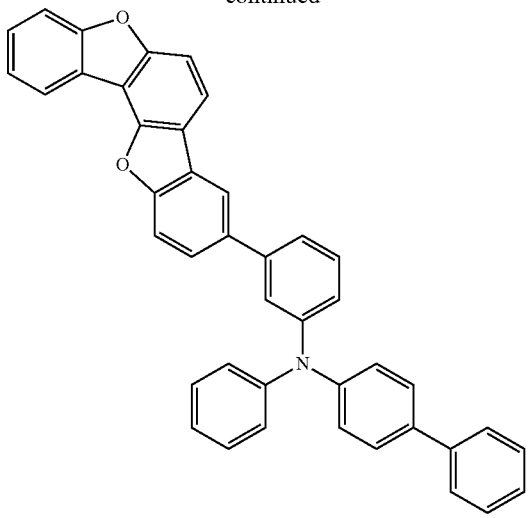

In addition to the aforementioned compounds, other suitable compounds, and compounds having a similar structure thereto may be used as the hole transport auxiliary layer.

In an implementation, the organic light emitting diode may further include an electron transport layer, an electron injection layer, and a hole injection layer as the organic layer 105 in FIG. 1 or 2.

The organic light emitting diodes 100 and 200 may be manufactured by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1: Synthesis of Compound 4

[Reaction Scheme 1]

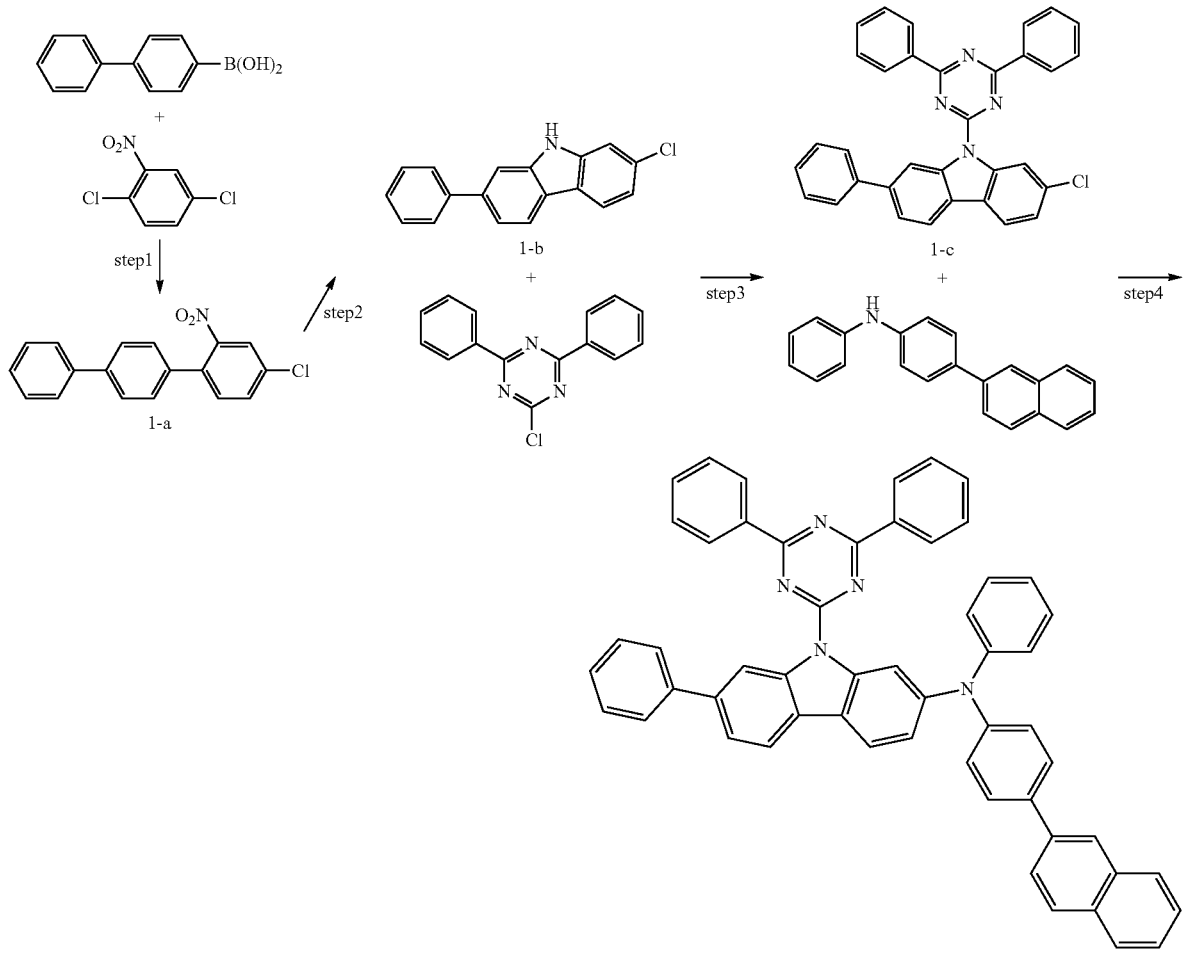

4

Step 1: Synthesis of Intermediate 1-a 1 eq (30.3 g) of 1,4-dichloro-2-nitrobenzene, 1 eq (31.3 g) of 4-biphenyl boronic acid, 5 mol % (9.1 g) of Pd(PPh$_3$)$_4$, and 2 eq (43.6 g) of K$_2$CO$_3$ were suspended in 310 ml of tetrahydrofuran and 220 ml of distilled water and then, refluxed and stirred under a nitrogen gas flow for 12 hours. When a reaction was complete, an organic layer was extracted with tetrahydrofuran and distilled water therefrom, dried with magnesium sulfate (MgSO$_4$) and filtered, and the filtrate was concentrated under a reduced pressure. A solid produced therefrom was recrystallized with dichloromethane and hexane to obtain 37 g (Y=74%) of Intermediate 1-a.

Step 2: Synthesis of Intermediate 1-b 37 g of Intermediate 1-a and 100 g of triphenylphosphine were suspended in 400 ml of 1,2-dichlorobenzene and then, refluxed and stirred under a nitrogen gas flow for 18 hours. When a reaction was complete, after extracting the solvent, an organic layer was recrystallized with 200 ml of acetone to obtain 20 g (Y=61%) of Intermediate 1-b.

Step 3: Synthesis of Intermediate 1-c 20 g of Intermediate 1-b, 23 g of 2-chloro-4,6-diphenyl-1,3,5-triazine, and 4.3 g of NaH (60% dispersion in mineral oil) were suspended in 300 ml of dimethylformamide and then, refluxed and stirred under a nitrogen gas flow. When a reaction was complete, the resultant was precipitated in methanol and filtered to obtain a solid, and the solid was dissolved in monochlorobenzene, silica-filtered, and then, recrystallized to obtain 28 g (Y=76%) of Intermediate 1-c.

Step 4: Synthesis of Compound 4

1 eq (13 g) of Intermediate 1-c, 1 eq (7.7 g) of benzeneamine-(4-(2-naphthyl)phenyl), 2 eq (5.0 g) of sodium-t-butoxide, and 0.03 eq (0.7 g) of Pd$_2$(dba)$_3$ were suspended in 80 ml of xylene, and 0.09 eq of tri-tert-butylphosphine was added thereto and then, refluxed and stirred for 12 hours. When a reaction was complete, an organic layer was extracted with toluene and distilled water, dried with magnesium sulfate, and filtered, and the filtered solution was concentrated under a reduced pressure. After removing the organic solvent therefrom, the residue was dissolved in dichlorobenzene, silica gel-filtered, and recrystallization with acetone to obtain 17.2 g (Y=86%) of Compound 4. LC-Mass measurement (theoretical value: 767.92 g/mol, measured value: M=768 g/mol)

Synthesis Example 2: Synthesis of Compound 8

18.7 g (Y=94%) of Compound 8 was obtained according to the same method as Step 4 of Synthesis Example 1 except that 1 eq (12.1 g) of Intermediate 1-c and 1 eq (8.8 g) of N-[4-(2-naphthyl)phenyl][1,1'-biphenyl]-4-amine were used. LC-Mass measurement (theoretical value: 844.01 g/mol, measured value: M=844 g/mol)

Synthesis Example 3: Synthesis of Compound 12

18.2 g (Y=91%) of Compound 12 was obtained according to the same method as Step 4 of Synthesis Example 1 except that 1 eq (12.1 g) of Intermediate 1-c and 1 eq (8.8 g) of N-[4-(2-naphthyl)phenyl][1,1'-biphenyl]-3-amine were used. LC-Mass measurement (theoretical value: 844.01 g/mol, measured value: M=844 g/mol)

Synthesis Example 4: Synthesis of Compound 18

Step 1: Synthesis of Intermediate 4-a 41.3 g (Y=83%) of Intermediate 4-a was obtained according to the same method as Step 1 of Synthesis Example 1 except that 1 eq (26.7 g) of 1,4-dichloro-2-nitrobenzene and 1 eq (34.5 g) of [4-(2-naphthyl)phenyl] boronic acid were used.

Step 2: Synthesis of Intermediate 4-b 41.3 g of Intermediate 4-a and 100 g of triphenylphosphine were suspended in 400 ml of 1,2-dichlorobenzene and then, refluxed and stirred under a nitrogen gas flow. When a reaction was complete, the solvent was extracted, and an organic layer therefrom was recrystallized with 200 ml of acetone to obtain 25 g of Intermediate 4-b (Y=66%).

Step 3: Synthesis of Intermediate 4-c 25 g of Intermediate 4-b, 24.5 g of 2-chloro-4,6-diphenyl-1,3,5-triazine, and 4.6 g of NaH (60% dispersion in mineral oil) were suspended in 300 ml of dimethylformamide and then, refluxed and stirred under a nitrogen gas flow. When a reaction was complete, the resultant was precipitated in methanol and filtered to obtain a solid, and the solid was dissolved in 1,2-dichlorobenzene, silica-filtered, and then, recrystallized to obtain 32.6 g (Y=77%) of Intermediate 4-c.

Step 4: Synthesis of Compound 18

1 eq (13.6 g) of Intermediate 4-c, 1 eq (7.2 g) of benzeneamine-(4-(2-naphthyl)phenyl), 2 eq (4.7 g) of sodium-t-butoxide, 0.03 eq (0.7 g) of Pd$_2$(dba)$_3$ were suspended in 80 ml of xylene, and 0.09 eq of tri-tert-butylphosphine was added thereto and then, refluxed and stirred for 12 hours. When a reaction was complete, an organic layer was extracted with toluene and distilled water, dried with magnesium sulfate, and filtered, and the filtered solution was concentrated under a reduced pressure. After removing the organic solvent, the residue was dissolved in dichlorobenzene, silica gel-filtered, and recrystallized with acetone to obtain 18.0 g (Y=90%) of Compound 18. LC-Mass measurement (theoretical value: 817.97 g/mol, measured value: M=818 g/mol)

Synthesis Example 5: Synthesis of Compound 43

13.7 g (Y=91%) of Compound 43 was obtained according to the same method as Step 4 of Synthesis Example 1 except that 1 eq (10.7 g) of Intermediate 4-c and 1 eq (5.0 g) of benzeneamine-(3-dibenzofuran) were used. LC-Mass measurement (theoretical value: 791.9 g/mol, measured value: M=782 g/mol)

Synthesis Example 6: Synthesis of Compound 63

Step 1: Synthesis of Intermediate 6-a 17.7 g of Intermediate 1-b, 21.5 g of 2-chloro-4-phenyl-6-[3-dibenzofuran]-1,3,5-triazine, and 3.0 g of NaH (60% dispersion in mineral oil) were suspended in 250 ml of dimethylformamide and then, refluxed and stirred under a nitrogen gas flow. When a reaction was complete, the resultant was precipitated in methanol and filtered to obtain a solid, and the solid was dissolved in 1,2-dichlorobenzene, silica-filtered, and recrystallized to obtain 27.2 g (Y=91%) of Intermediate 6-a.

Step 2: Synthesis of Compound 63

1 eq (10.5 g) of Intermediate 6-a, 1 eq (5.2 g) of N-[4-(2-naphthyl)phenyl]-phenyl-4-amine, 2 eq (3.4 g) of sodium-t-butoxide, and 0.03 eq (0.48 g) of Pd$_2$(dba)$_3$ were suspended in 60 ml of xylene, and 0.09 eq of tri-tert-butylphosphine was added thereto and then, refluxed and stirred for 12 hours. When a reaction was complete, an organic layer was extracted with toluene and distilled water, dried with magnesium sulfate, and filtered, and the filtered solution was concentrated under a reduced pressure. After removing the organic solvent, the residue was dissolved in methylpyrrolidone and recrystallized to obtain 11.4 g (Y=76%) of Compound 63. LC-Mass measurement (theoretical value: 858.00 g/mol, measured value: M=858 g/mol)

Synthesis Example 7: Synthesis of Compound Y-1

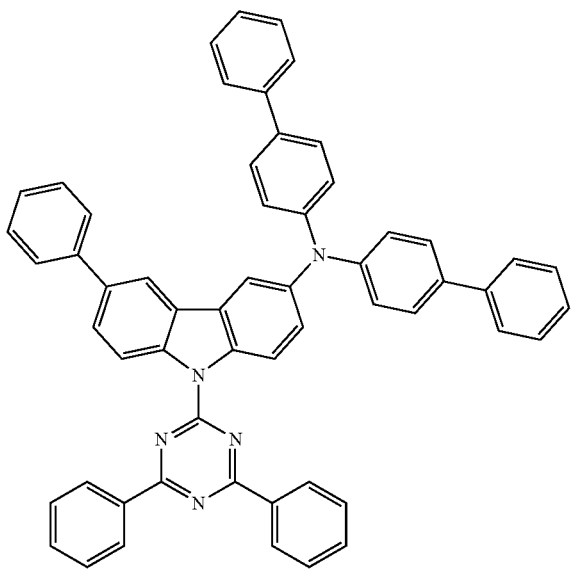

Y-1

Step 1: Synthesis of Intermediate 7-a 1 eq (6.6 g) of 3,6-dibromo-9-(4,6-diphenyl-1,3,5-triazine-2-yl)-9H-carbazole, 1 eq (30.3 g) of phenyl boronic acid, 5 mol % (3.1 g) of Pd(PPh$_3$)$_4$, and 2 eq (15.0 g) of K$_2$CO$_3$ were suspended in 150 ml of tetrahydrofuran and 70 ml of distilled water and then, refluxed and stirred under a nitrogen gas flow for 12 hours. When a reaction was complete, an organic layer was extracted with tetrahydrofuran and distilled water, dried with magnesium sulfate (MgSO$_4$), and filtered, and the filtered solution was concentrated under a reduced pressure. A solid produced therefrom was recrystallized with monochlorobenzene and hexane to obtain 22.7 g (Y=76%) of Intermediate 7-a.

Step 2: Synthesis of Compound Y-1

1 eq (10.5 g) of Intermediate 7-a, 1 eq (6.0 g) of bis(4-biphenylyl)amine, 2 eq (3.6 g) of sodium-t-butoxide, and 0.03 eq (0.52 g) of Pd$_2$(dba)$_3$ were suspended in 60 ml of xylene, and 0.09 eq of tri-tert-butylphosphine was added thereto and then, refluxed and stirred for 12 hours. When a reaction was complete, an organic layer was extracted with toluene and distilled water, dried with magnesium sulfate, and filtered, and the filter solution was concentrated under a reduced pressure. After removing an organic solution, the residue was recrystallized with methylpyrrolidone to obtain 10.9 g (Y=73%) of Compound Y-1. LC-Mass measurement (theoretical value: 793.95 g/mol, measured value: M=794 g/mol)

Synthesis Example 8: Synthesis of Compound Y-2

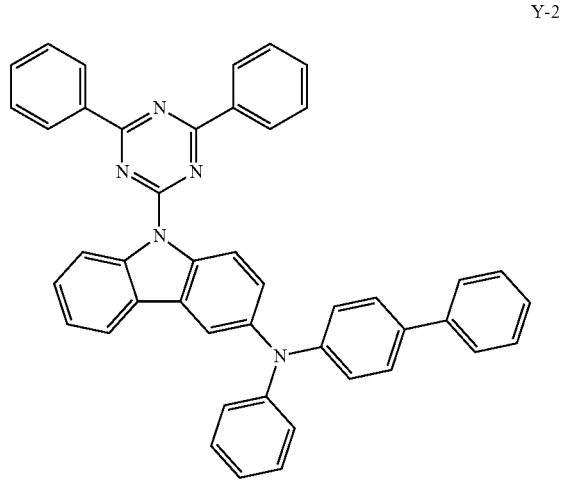 [SMILES: c1ccc(-c2ccc(N(c3ccccc3)c3ccc4c(c3)c3ccccc3n4-c3nc(-c4ccccc4)nc(-c4ccccc4)n3)cc2)cc1]

Y-2

1 eq (11.2 g) of 3-bromo-9-(4,6-diphenyl-1,3,5-triazine-2-yl)-9H-carbazole, 1 eq (5.7 g) of N-phenyl-4-biphenylamine, 2 eq (4.5 g) of sodium-t-butoxide, and 0.03 eq (0.64 g) of Pd$_2$(dba)$_3$ were suspended in 80 ml of xylene and 0.09 eq of tri-tert-butylphosphine was added thereto and then, refluxed and stirred for 12 hours. When a reaction was complete, an organic layer was extracted with toluene and distilled water, dried with magnesium sulfate, and filtered, and the filtered solution was concentrated under a reduced pressure. After removing an organic solution, the residue was dissolved in 1,2-dichlorobenzene and recrystallized to obtain 12.0 g (Y=80%) of Compound Y-2. LC-Mass measurement (theoretical value: 641.76 g/mol, measured value: M=642 g/mol)

Synthesis Example 9: Synthesis of Compound Y-3

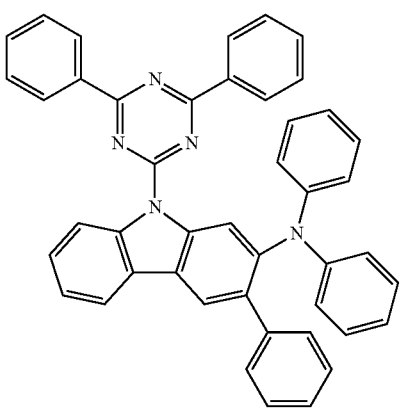

Y-3

Step 1: Synthesis of Intermediate 9-a 32 g (Y=64%) of Intermediate 9-a was obtained according to the same method as Step 1 of Synthesis Example 1 except that 1 eq (42.5 g) of 1,5-dichloro-2,4-dinitrobenzene and 1 eq (21.9 g) of phenyl boronic acid were used instead of 1,4-dichloro-2-nitrobenzene and 4-biphenyl boronic acid.

Step 2: Synthesis of Intermediate 9-b 1 eq (32 g) of Intermediate 9-a was reacted according to the same method as Step 2 of Synthesis Example 1 to obtain 16.8 g (Y=63%) of Intermediate 9-b.

Step 3: Synthesis of Intermediate 9-c 1 eq (16.8 g) of Intermediate 9-b was reacted according to the same method of Step 3 of Synthesis Example 1 to obtain 18.5 g (Y=58%) of Intermediate 9-c.

Step 4: Synthesis of Intermediate 9-d 11.5 g (Y=58%) of Intermediate 9-d was obtained according to the same method as Step 1 of Synthesis Example 1 except that 1 eq (18.5 g) of Intermediate 9-c and 1 eq (6.0 g) of phenyl boronic acid were used.

Step 5: Synthesis of Intermediate 9-e 1 eq (11.5 g) of Intermediate 9-d and 5 eq (8.1 g) of sodium dithionite, and 2 eq (15.0 g) of $K_2CO_3$ were suspended in 150 ml of tetrahydrofuran, 150 ml of distilled water, and 150 ml of ethanol and then, refluxed and stirred under a nitrogen gas flow for 12 hours. When a reaction was complete, the solvent was dried, columned and purified, and then, recrystallized with monochlorobenzene and acetone to obtain 9.0 g (Y=83%) of Intermediate 9-e.

Step 6: Synthesis of Compound Y-6

1 eq (9 g) of Intermediate 9-e, 2.5 eq (9.3 g) of iodobenzene, 2 eq (7.1 g) of sodium-t-butoxide, and 0.03 eq (0.5 g) of $Pd_2(dba)_3$ were suspended in 150 ml of xylene, and 0.09 eq of tri-tert-butylphosphine was added thereto and then, refluxed and stirred for 12 hours. When a reaction was complete, an organic layer was extracted with toluene and distilled water, dried with magnesium sulfate, and filtered, and the filtered solution was concentrated under a reduced pressure. After removing the organic solvent, the residue was dissolved in 1,2-dichlorobenzene and then, recrystallized to obtain 6.8 g (Y=68%) of Compound Y-3. LC-Mass measurement (theoretical value: 641.76 g/mol, measured value: M=642 g/mol)

(Manufacture of Organic Light Emitting Diode)

Example 1

A glass substrate coated with ITO (indium tin oxide) as a 1,500 Å-thick thin film was washed with distilled water. After washing with the distilled water, the glass substrate was ultrasonic wave-washed with isopropyl alcohol, acetone, or methanol and dried and then, moved to a plasma cleaner, cleaned by using oxygen plasma for 10 minutes, and moved to a vacuum depositor. This obtained ITO transparent electrode was used as an anode, Compound A was vacuum-deposited on the ITO substrate to form a 700 Å-thick hole injection layer, Compound B was deposited to be 50 Å-thick on the injection layer, and Compound C was deposited to be 700 Å-thick to form a hole transport layer. On the hole transport layer, Compound C-1 was deposited to be 400 Å-thick to form a hole transport auxiliary layer. On the hole transport auxiliary layer, Compound 4 was used as host and 2 wt % of [Ir(piq)$_2$acac] as a dopant was doped with vacuum deposition to form a 400 Å-thick light emitting layer. Subsequently, Compound D and Liq were vacuum-deposited simultaneously at a 1:1 ratio on the light emitting layer to form a 300 Å-thick electron transport layer and a cathode was formed by sequentially vacuum-depositing Liq to be 15 Å thick and Al to be 1,200 Å thick on the electron transport layer, manufacturing an organic light emitting diode.

The organic light emitting diode had a five-layered organic thin layer structure as follows:

A structure of ITO/Compound A (700 Å)/Compound B (50 Å)/Compound C (700 Å)/Compound C-1 (400 Å)/EML [Compound 4: [Ir(piq)$_2$acac] (2 wt %)] (400 Å)/Compound D: Liq (300 Å)/Liq (15 Å)/Al (1,200 Å).

Compound A: N4,N4'-diphenyl-N4,N4'-bis(9-phenyl-9H-carbazol-3-yl)biphenyl-4,4'-diamine Compound B: 1,4,5,8,9,11-hexaazatriphenylene-hexacarbonitrile (HAT-CN), Compound C: N-(biphenyl-4-yl)-9,9-dimethyl-N-(4-(9-phenyl-9H-carbazol-3-yl)phenyl)-9H-fluoren-2-amine Compound C-1: N,N-di([1,1'-biphenyl]-4-yl)-7,7-dimethyl-7H-fluoreno[4,3-b]benzofuran-10-amine Compound D: 8-(4-(4,6-di(naphthalen-2-yl)-1,3,5-triazin-2-yl)phenyl)quinoline Examples 2 to 6

Each organic light emitting diode was manufactured in the same manner as in Example 1, except that the host compound was changed as described in Table 1.

Comparative Examples 1 to 3

Each organic light emitting diode was manufactured in the same manner as in Example 1, except that the host compound was changed as described in Table 1.

Evaluation

Power efficiency of the organic light emitting diodes according to Examples 1 to 6 and Comparative Examples 1 to 3 was evaluated.

Specific measurement methods are as follows, and the results are shown in Table 1.

(1) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Power Efficiency

Power efficiency (cd/A) at the same current density (10 mA/cm$^2$) were calculated by using the luminance, current density, and voltages (V) from the items (1) and (2).

(4) Measurement of Life-Span

The results were obtained by measuring a time when current efficiency (cd/A) was decreased down to 97%, while luminance (cd/m$^2$) was maintained to be 6,000 cd/m$^2$.

(5) Measurement of Driving Voltage

A driving voltage of each diode was measured using a current-voltage meter (Keithley 2400) at 15 mA/cm$^2$ to obtain the results.

TABLE 1

| | Host | Color | Power efficiency (cd/A) | Driving voltage (V) | Life-span T97 (h) |
|---|---|---|---|---|---|
| Example 1 | Compound 4 | red | 20.3 | 4.0 | 103 |
| Example 2 | Compound 8 | red | 20.8 | 4.1 | 104 |
| Example 3 | Compound 12 | red | 20.9 | 4.3 | 102 |
| Example 4 | Compound 18 | red | 20.7 | 4.2 | 120 |

TABLE 1-continued

| | Host | Color | Power efficiency (cd/A) | Driving voltage (V) | Life-span T97 (h) |
|---|---|---|---|---|---|
| Example 5 | Compound 43 | red | 21.0 | 4.3 | 85 |
| Example 6 | Compound 63 | red | 19.8 | 4.4 | 107 |
| Comparative Example 1 | Compound Y-1 | red | 19.5 | 4.5 | 10 |
| Comparative Example 2 | Compound Y-2 | red | 18.1 | 4.3 | 7 |
| Comparative Example 3 | Compound Y-3 | red | 17.9 | 4.5 | 8 |

Referring to Table 1, the organic light emitting diodes according to Examples 1 to 6 exhibited significantly improved driving voltage, efficiency, and life-span, compared with the organic light emitting diodes according to Comparative Examples 1 to 3.

One or more embodiments may provide a compound for an organic optoelectronic device capable of realizing an organic optoelectronic device having high efficiency and a long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectronic device, the compound being represented by Chemical Formula 1:

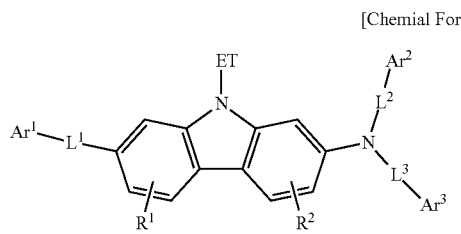

[Chemial Formula 1]

wherein, in Chemical Formula 1,
$L^1$ to $L^3$ are independently a single bond or a substituted or unsubstituted C6 to C20 arylene group,
$Ar^1$ is a substituted or unsubstituted C6 to C20 aryl group,
$Ar^2$ and $Ar^3$ are independently a substituted or unsubstituted C6 to C20 aryl group, a substituted or unsubstituted dibenzofuranyl group, or a substituted or unsubstituted dibenzothiophenyl group,
$R^1$ and $R^2$ are independently hydrogen, deuterium, a cyano group, a halogen, a C1 to C10 alkyl group, a C6 to C20 aryl group, a C2 to C20 heterocyclic group, or a combination thereof, and ET is a group represented by Chemical Formula A,

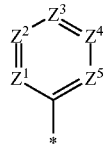

[Chemical Formula A]

wherein, in Chemical Formula A,
$Z^1$ to $Z^5$ are independently N or C-$L^a$-$R^a$,
at least one of $Z^1$ to $Z^5$ is N,
each $L^a$ is independently a single bond or a substituted or unsubstituted C6 to C20 arylene group,
each $R^a$ is independently hydrogen, deuterium, a cyano group, a halogen, a substituted or unsubstituted C1 to C10 alkyl group, a substituted or unsubstituted C6 to C20 aryl group, a substituted or unsubstituted C2 to C20 heterocyclic group, or a combination thereof,
each $R^a$ is separate or adjacent ones thereof are linked with each other to form a substituted or unsubstituted aliphatic, aromatic, or heteroaromatic monocyclic ring; or a substituted or unsubstituted aliphatic, aromatic, or heteroaromatic polycyclic ring, and
* is a linking point.

2. The compound as claimed in claim 1, wherein ET is a substituted or unsubstituted pyridinyl group, a substituted or unsubstituted pyrimidinyl group, a substituted or unsubstituted triazinyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted phenanthrolinyl group, a substituted or unsubstituted benzofuranpyrimidinyl group, a substituted or unsubstituted benzothiophenepyrimidinyl group, or a combination thereof.

3. The compound as claimed in claim 1, wherein the compound represented by Chemical Formula 1 is represented by Chemical Formula 1A:

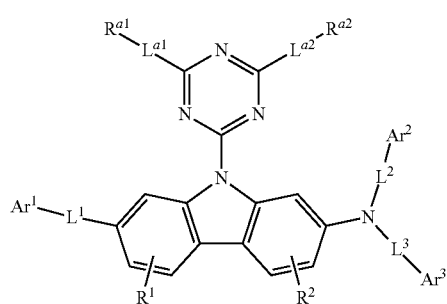

[Chemial Formula 1A]

wherein, in Chemical Formula 1A,
$L^1$ to $L^3$, $L^{a1}$, and $L^{a2}$ are independently a single bond or a substituted or unsubstituted C6 to C20 arylene group,
$Ar^1$ is a substituted or unsubstituted C6 to C20 aryl group,
$Ar^2$ and $Ar^3$ are independently a substituted or unsubstituted C6 to C20 aryl group, a substituted or unsubstituted dibenzofuranyl group, or a substituted or unsubstituted dibenzothiophenyl group, $R^{a1}$ and $R^{a2}$ are independently a substituted or unsubstituted C6 to C20 aryl group, a dibenzofuranyl group, or a dibenzothiophenyl group, and $R^1$ and $R^2$ are independently hydrogen, deuterium, a cyano group, a halogen, a C1 to C10 alkyl group, a C6 to C20 aryl group, a C2 to C20 heterocyclic group, or a combination thereof.

4. The compound as claimed in claim 3, wherein:

$L^{a1}$ and $L^{a2}$ are independently a single bond or a substituted or unsubstituted phenylene group, and $R^{a1}$ and $R^{a2}$ are independently a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group.

5. The compound as claimed in claim 1, wherein:

$L^2$ and $L^3$ are independently a single bond, a substituted or unsubstituted phenylene group, a substituted or unsubstituted biphenylene group, or a substituted or unsubstituted naphthylene group, and $Ar^2$ and $Ar^3$ are independently a substituted or unsubstituted phenyl group, a substituted or unsubstituted biphenyl group, a substituted or unsubstituted terphenyl group, a substituted or unsubstituted naphthyl group, a substituted or unsubstituted dibenzofuranyl group, or a substituted or unsubstituted dibenzothiophenyl group.

6. The compound as claimed in claim 1, wherein moieties *-$L^2$-$Ar^2$ and *-$L^3$-$Ar^3$ of Chemical Formula 1 are independently a moiety of Group II:

[Group II]

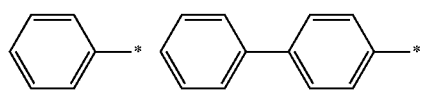

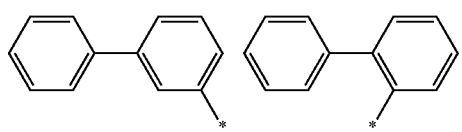

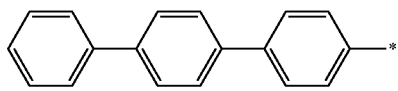

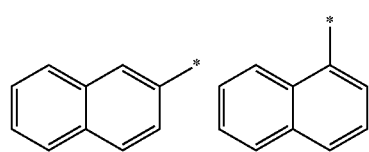

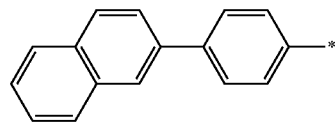

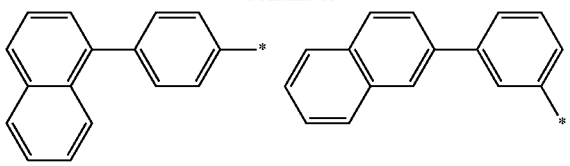

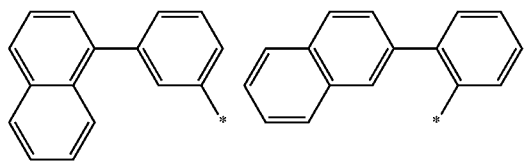

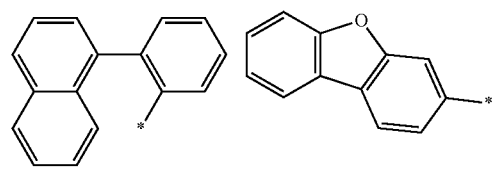

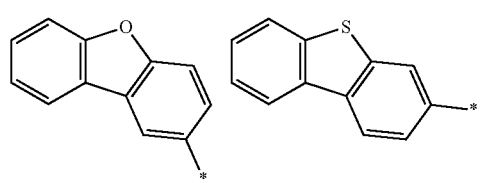

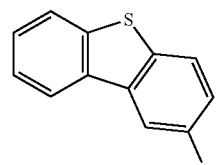

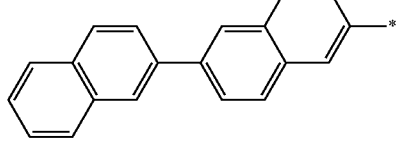

wherein, in Group II, * is a linking point.

7. The compound as claimed in claim 1, wherein:

$Ar^1$ is a substituted or unsubstituted phenyl group, a substituted or unsubstituted biphenyl group, or a substituted or unsubstituted naphthyl group, $Ar^2$ and $Ar^3$ are independently a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group, $R^a$ is a substituted or unsubstituted phenyl group, a substituted or unsubstituted biphenyl group, a substituted or unsubstituted naphthyl group, a substituted or unsubstituted dibenzofuranyl group, or a substituted or unsubstituted dibenzothiophenyl group, $L^a$ and $L^1$ to $L^3$ are independently a single bond or a substituted or unsubstituted phenylene group, and both $R^1$ and $R^2$ are hydrogen.

8. The compound as claimed in claim 1, wherein the compound represented by Chemical Formula 1 is a compound of Group 1:
[Group 1]
1
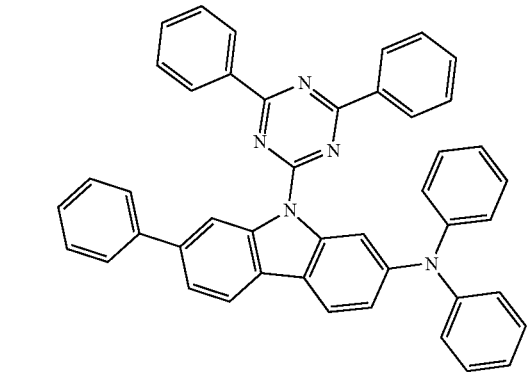
2
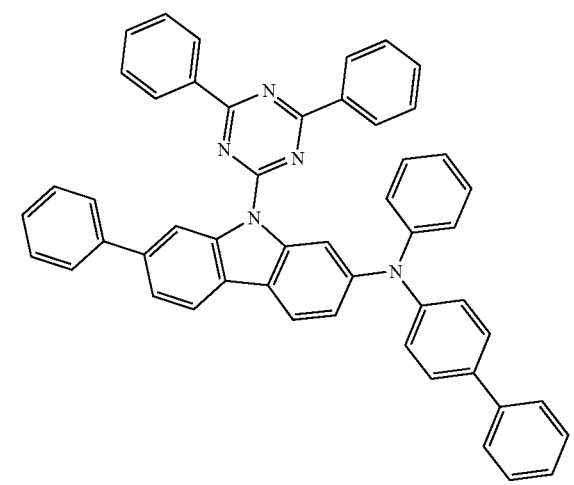
3
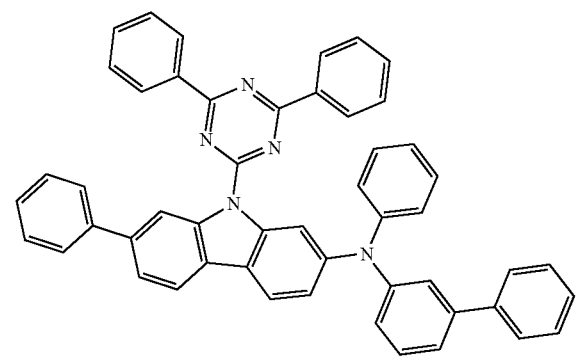
-continued
4
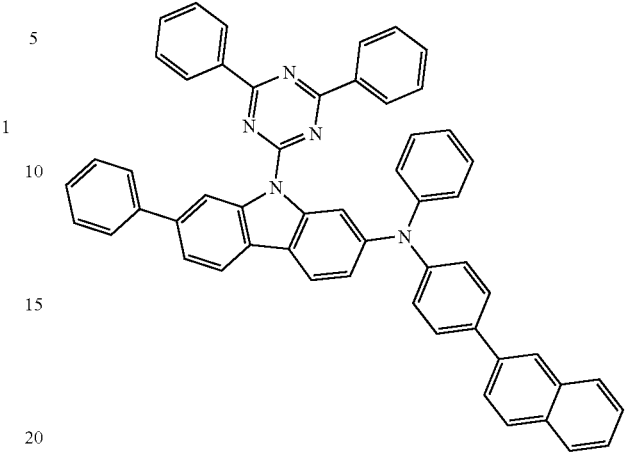
5
6

7
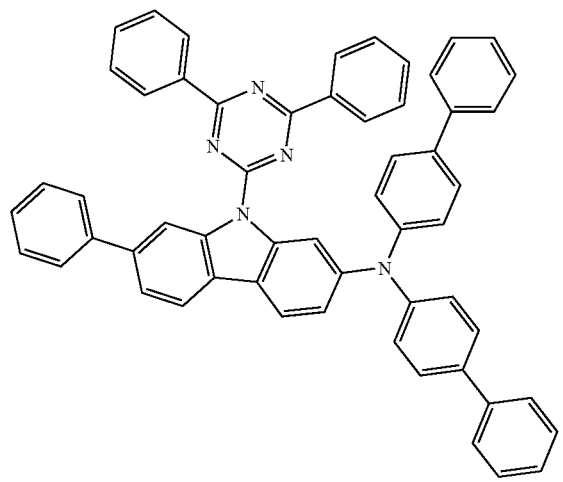
8
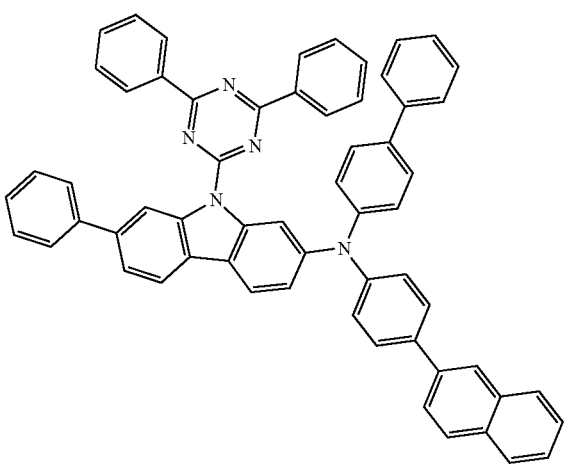
9
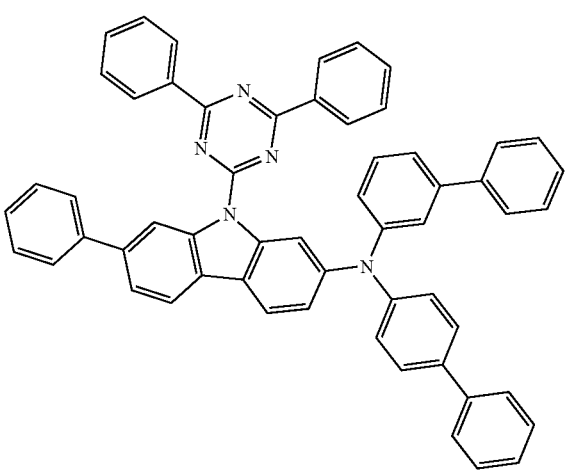
10
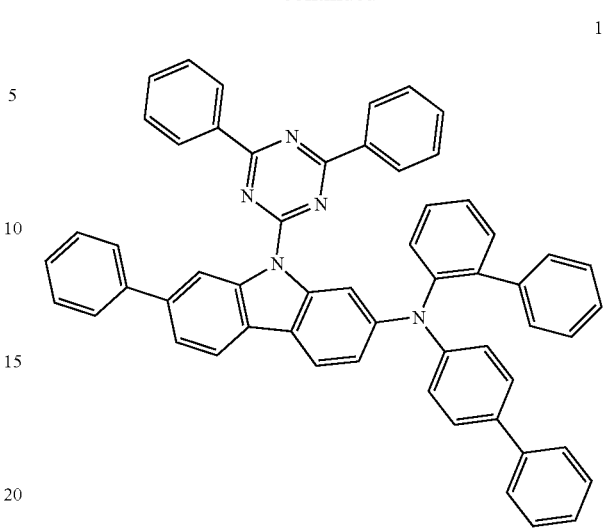
11
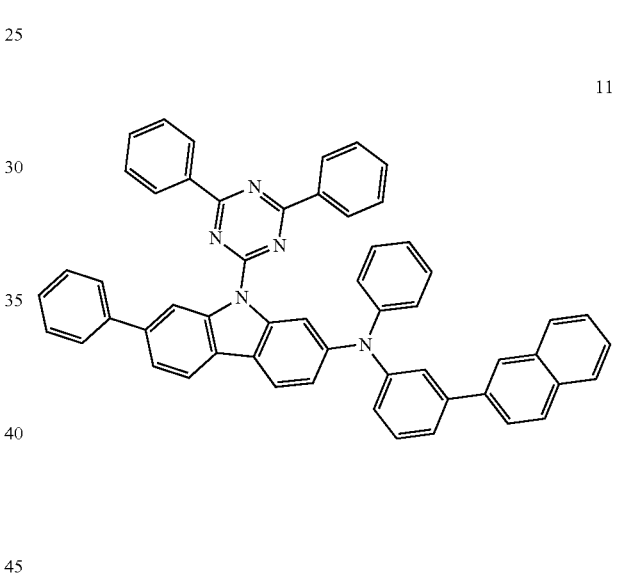
12
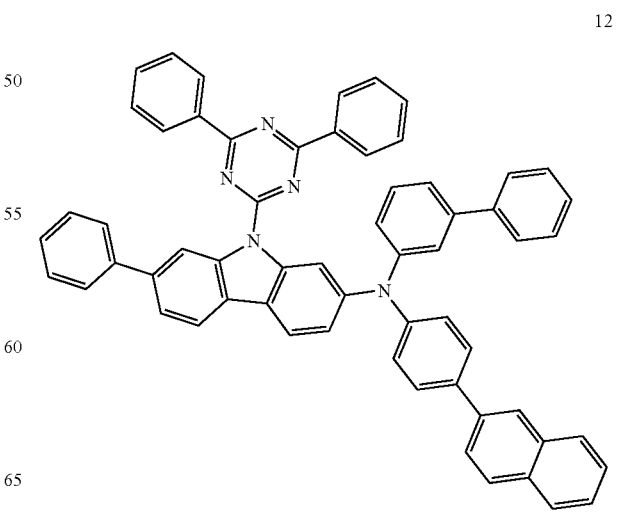

13
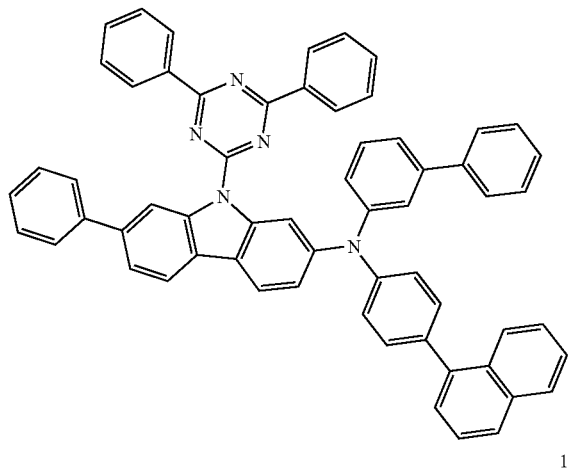
14
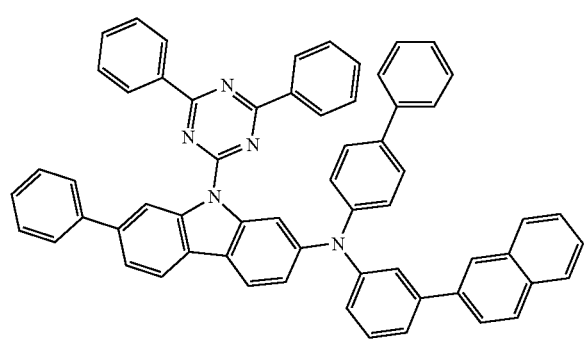
15
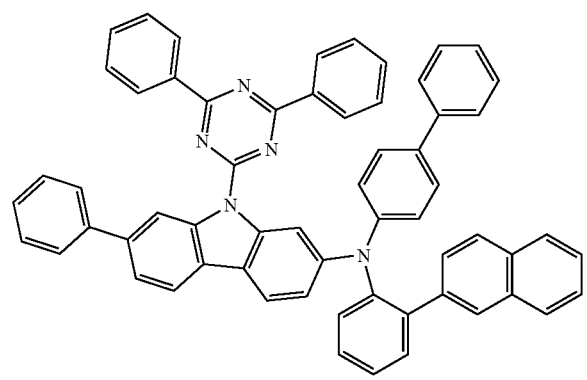
16
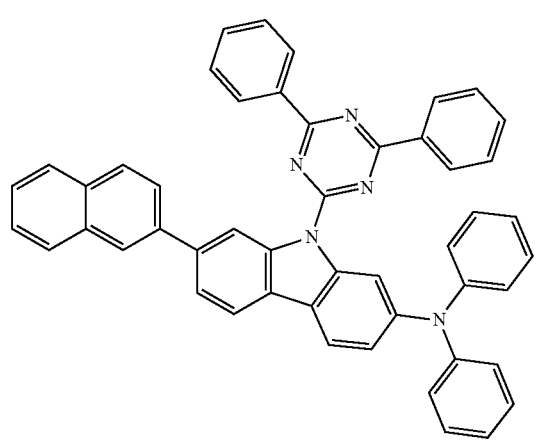
17
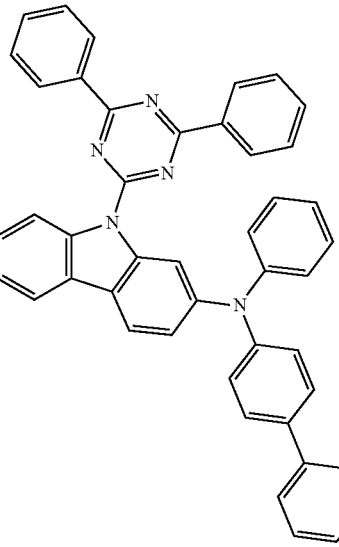
18
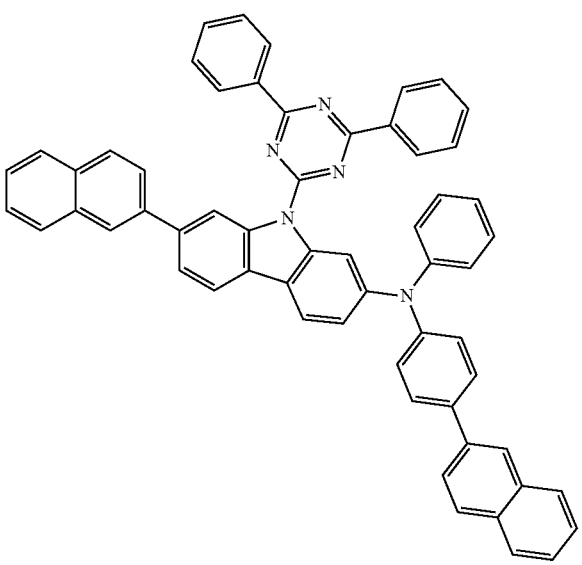
19
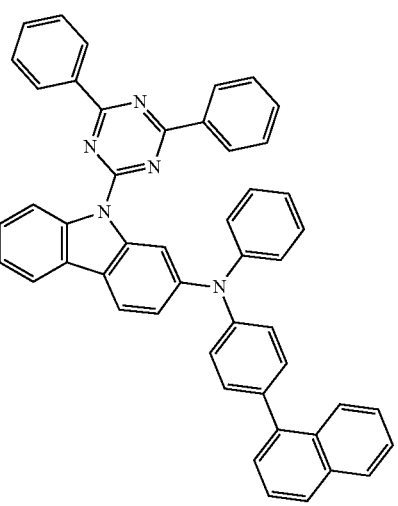

99 100
-continued -continued
20
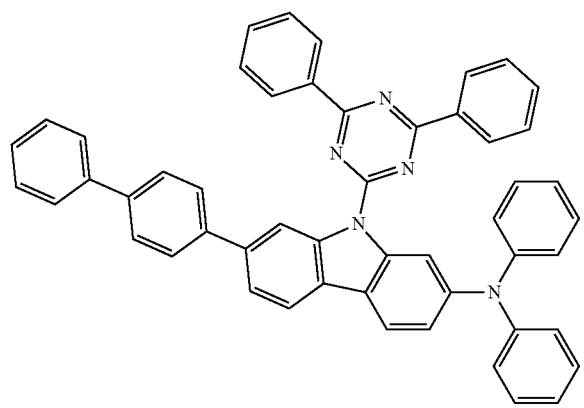
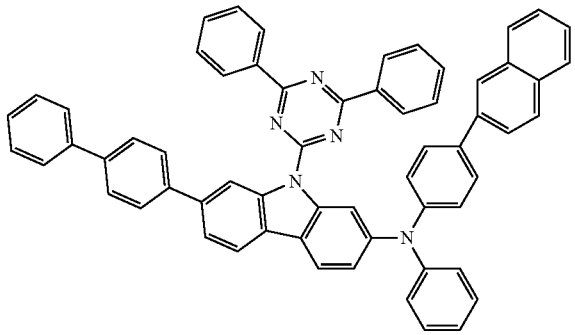
21
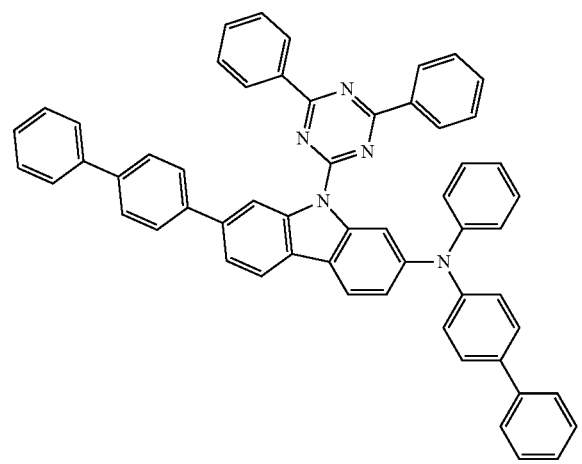
24
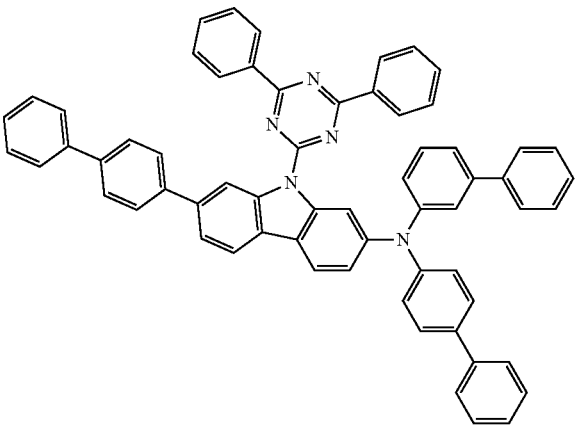
22
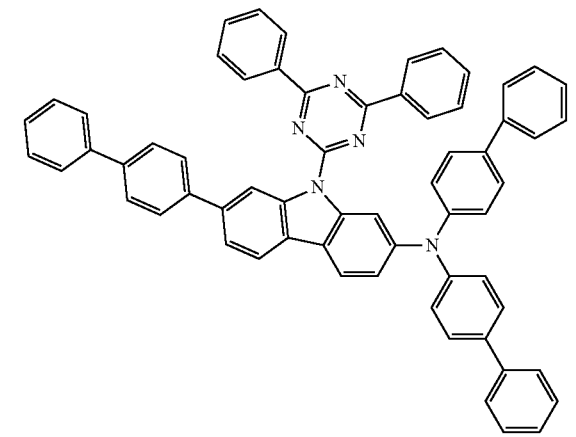
25
26

101
-continued
27
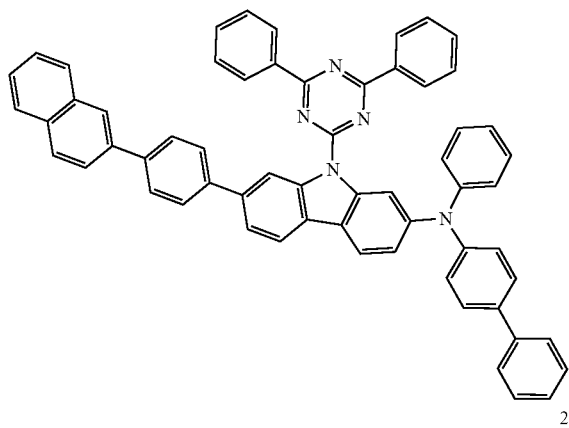
28
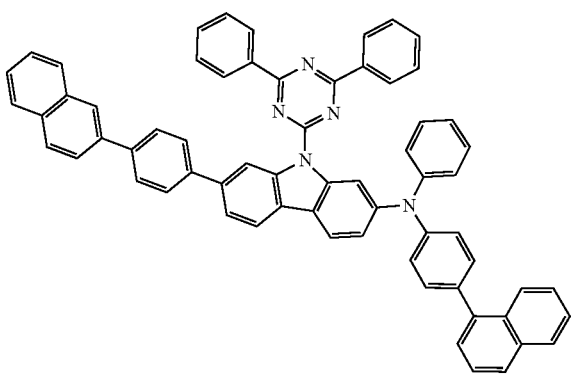
29
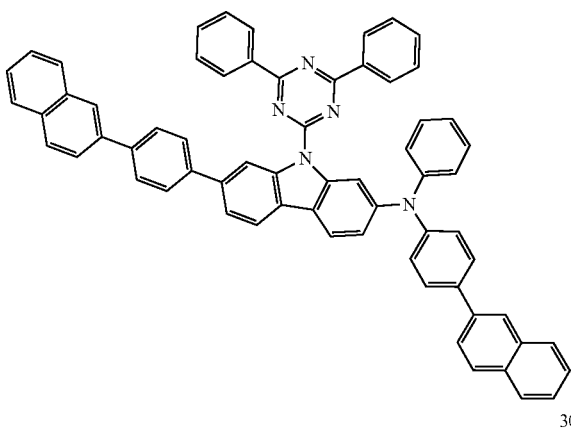
30
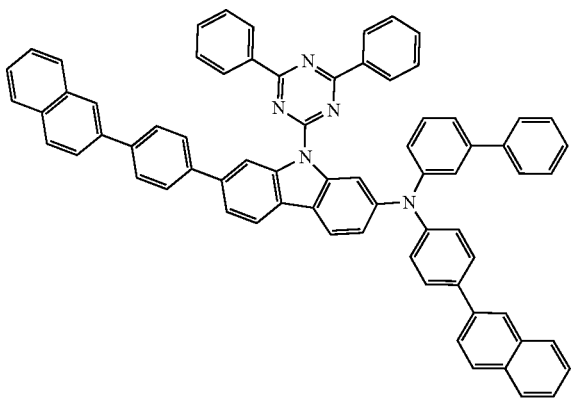
102
-continued
31
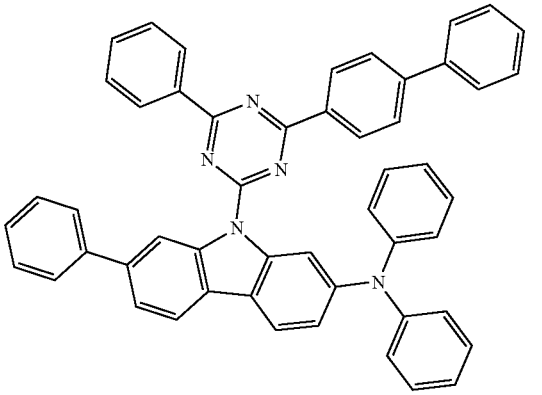
32
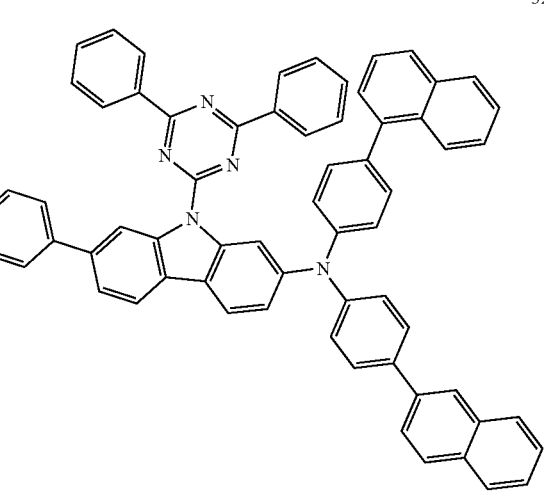
33
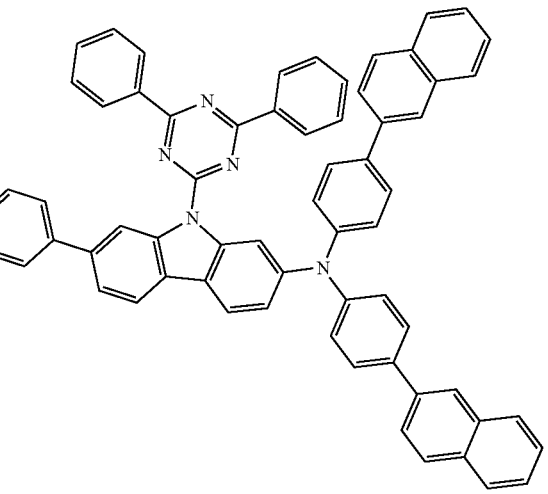

34
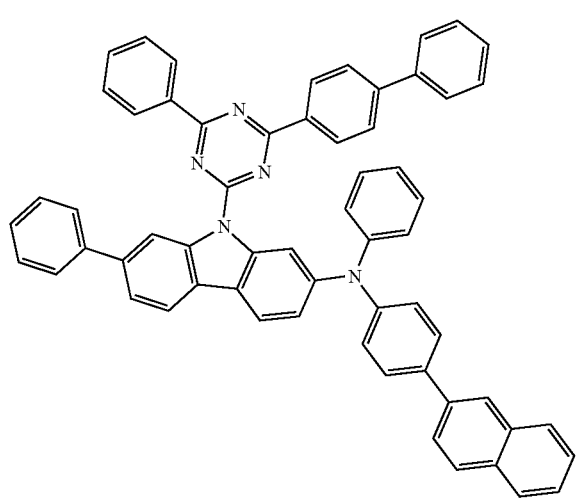
35
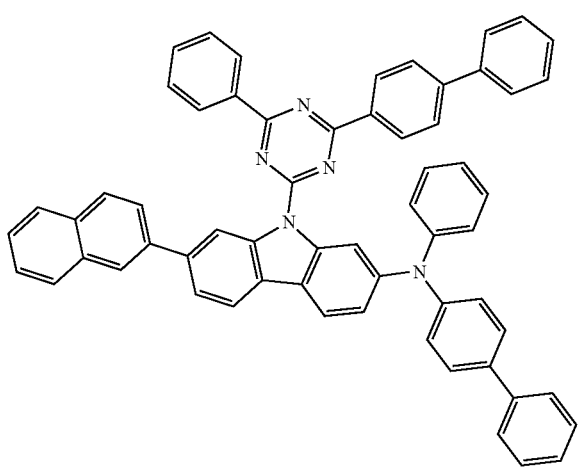
36
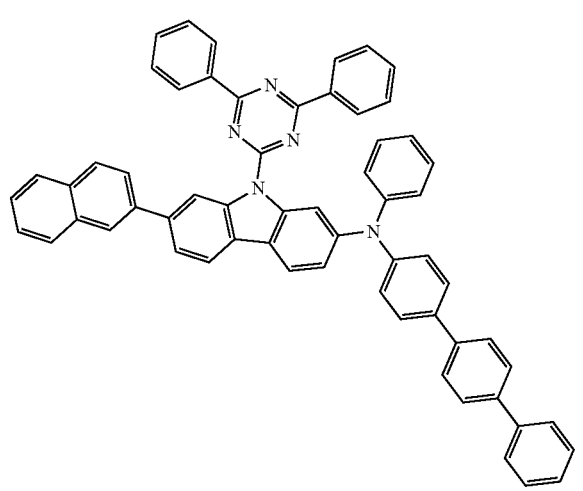
37
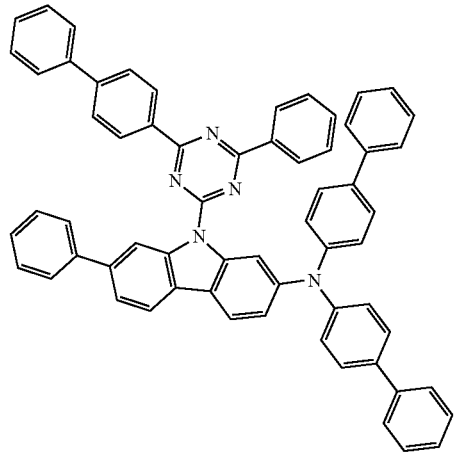
38
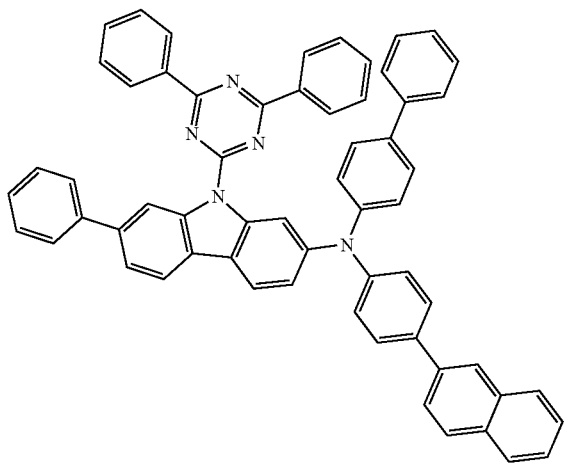
39
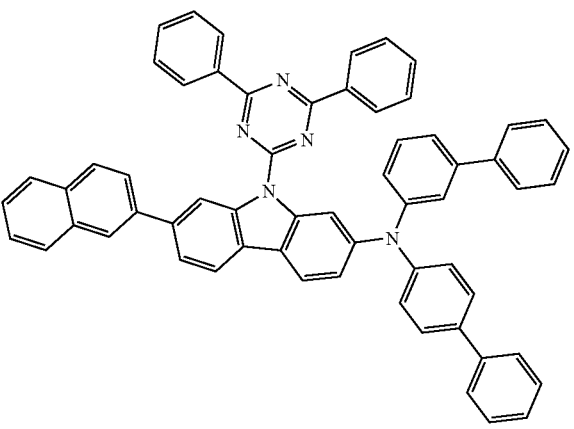

40
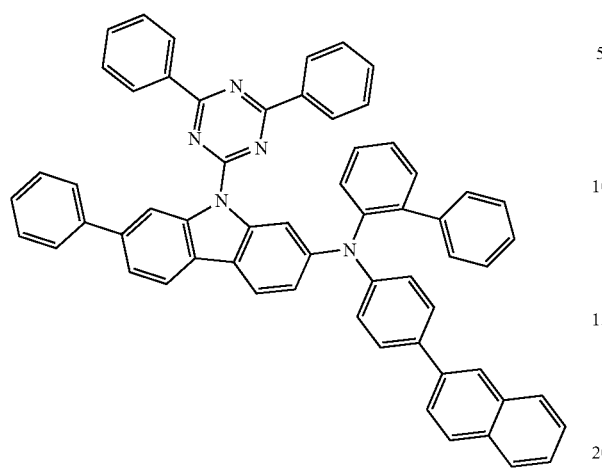
41
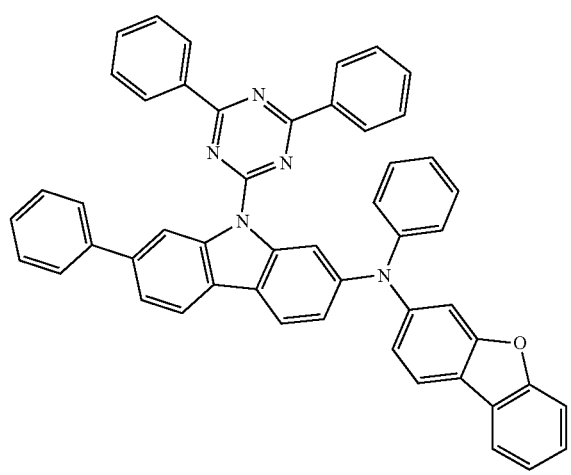
42
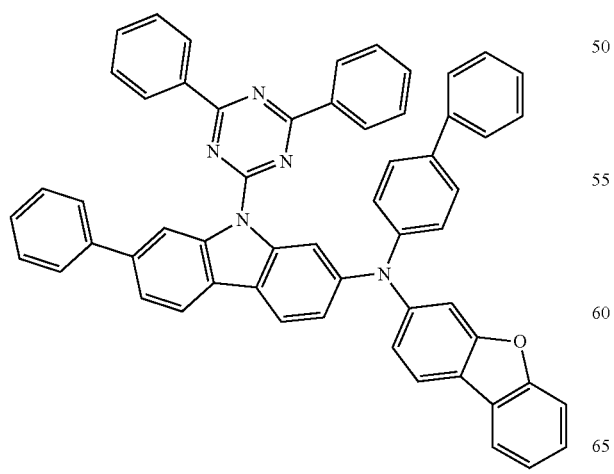
43
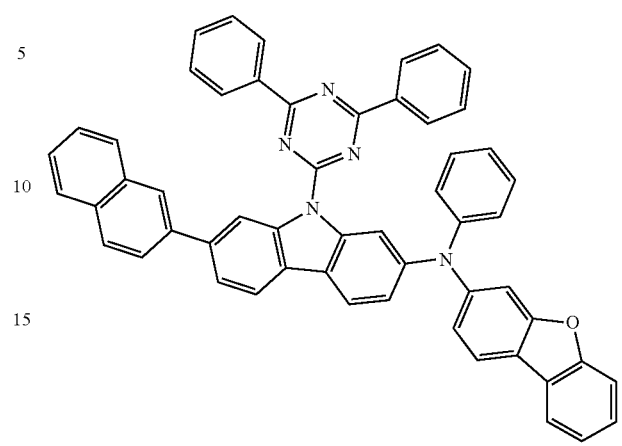
44
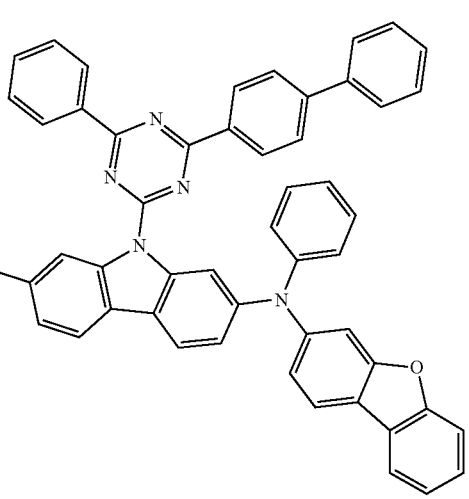
45
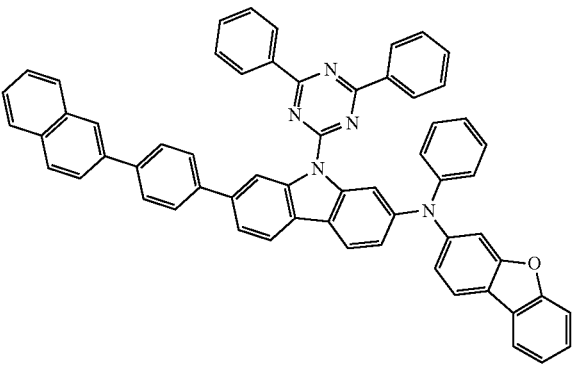

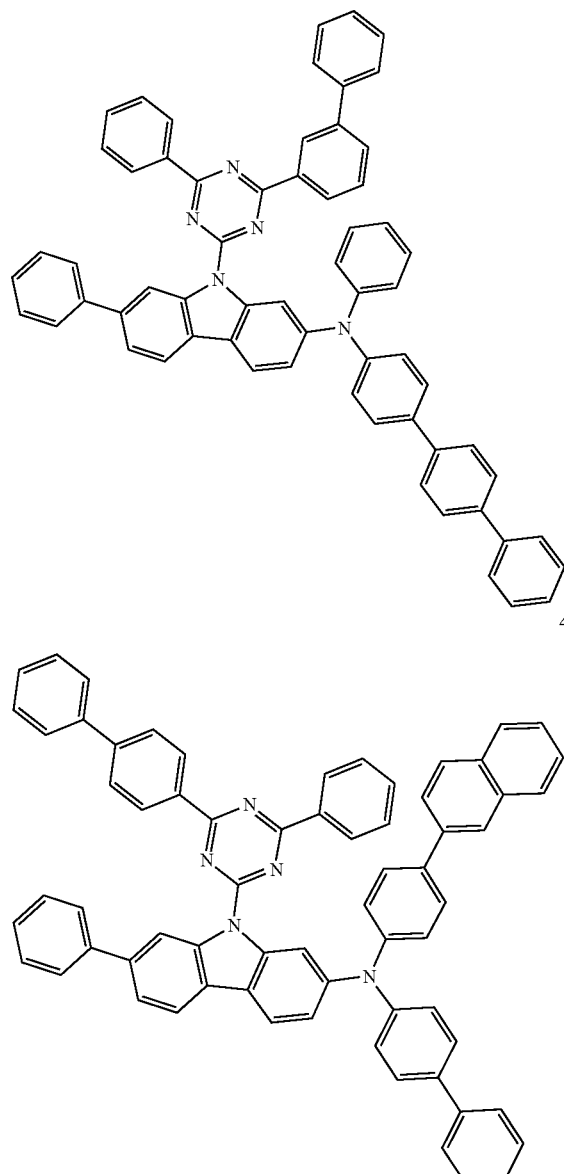
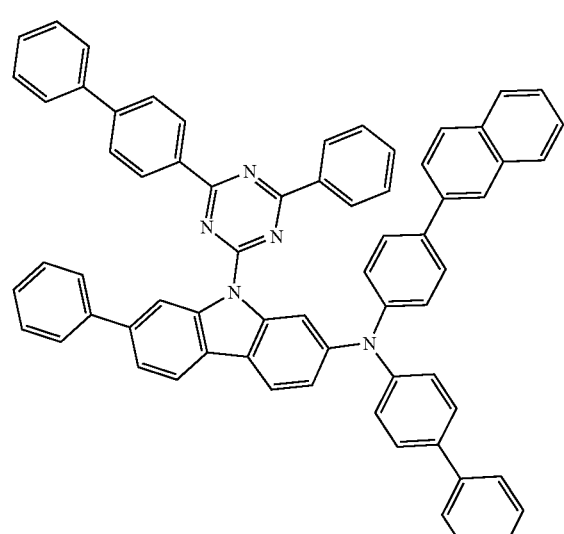
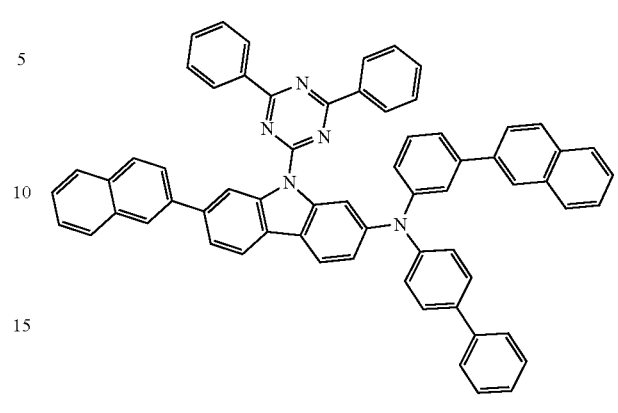
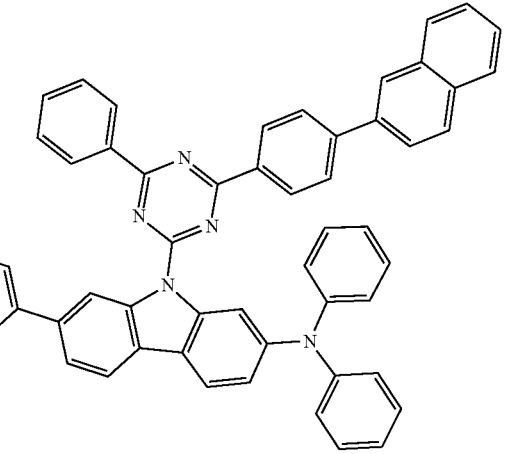

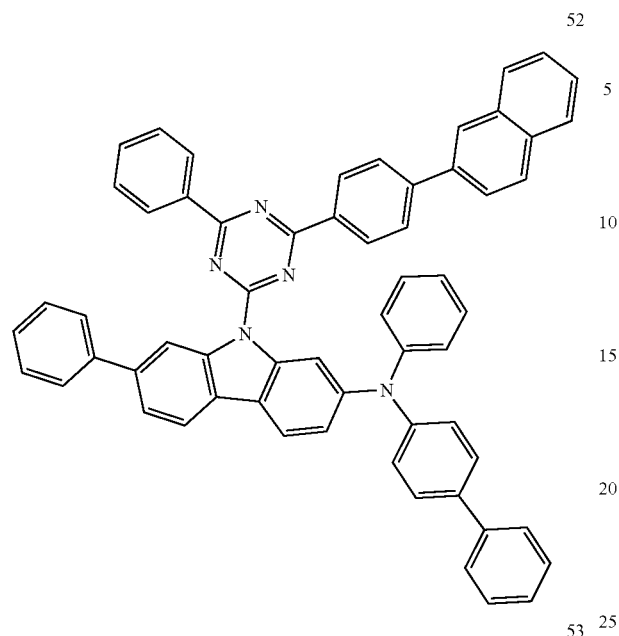
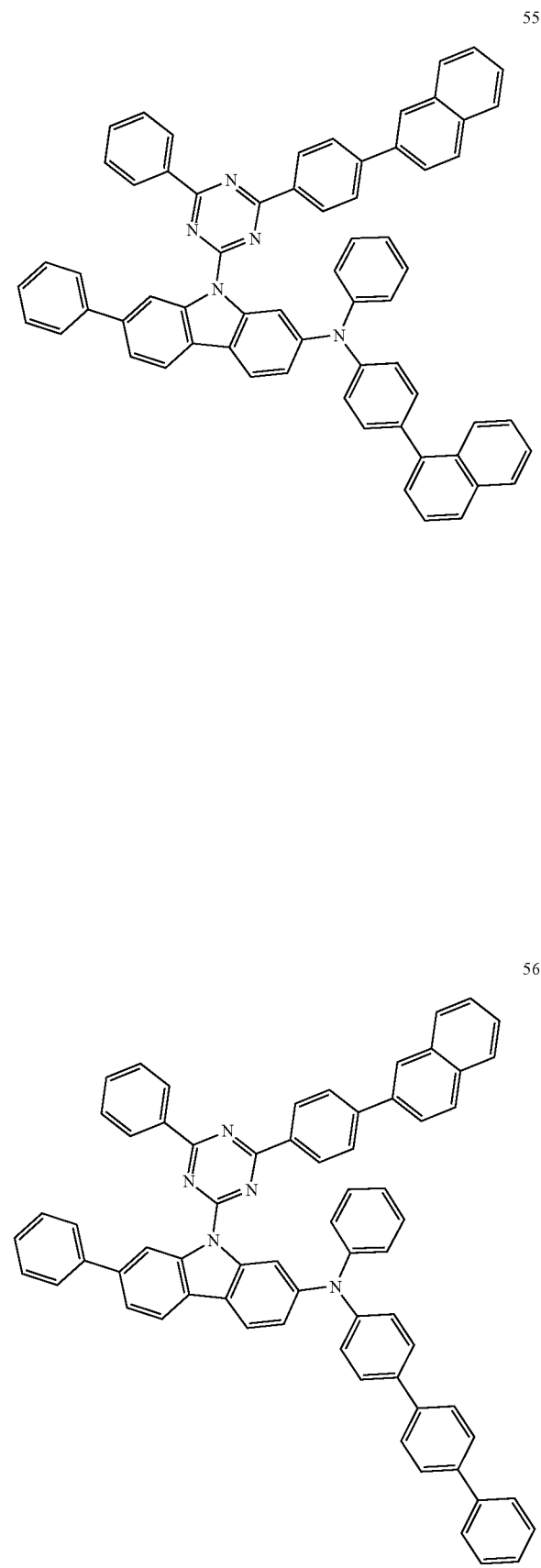

-continued
57
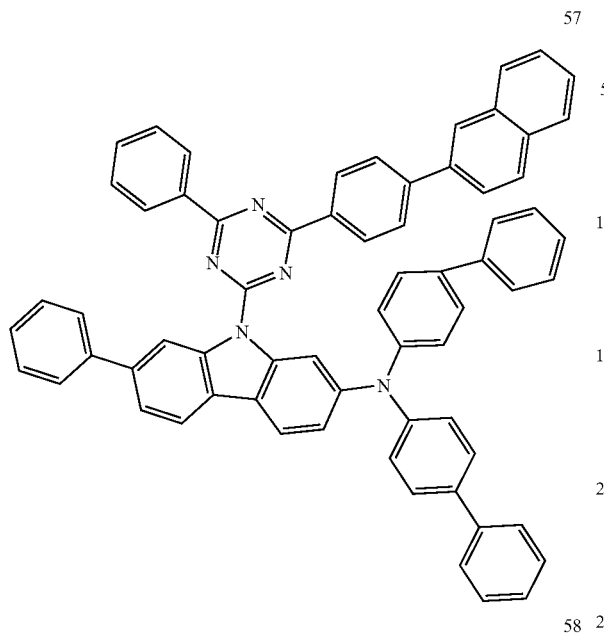
58
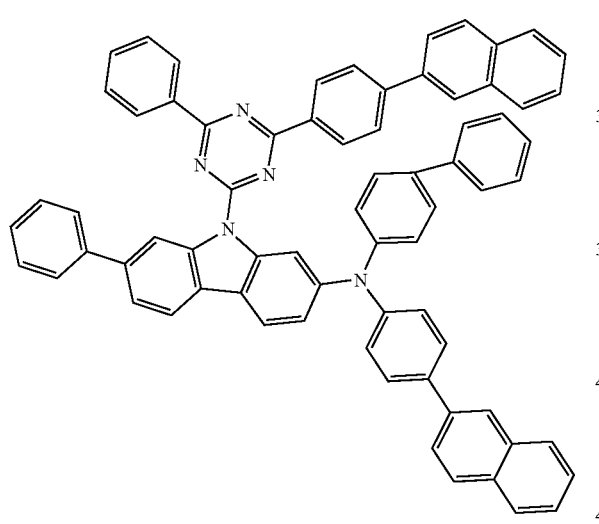
59
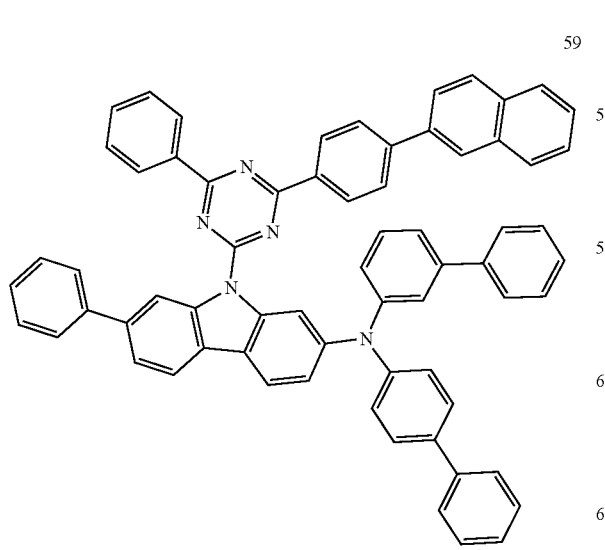
-continued
60
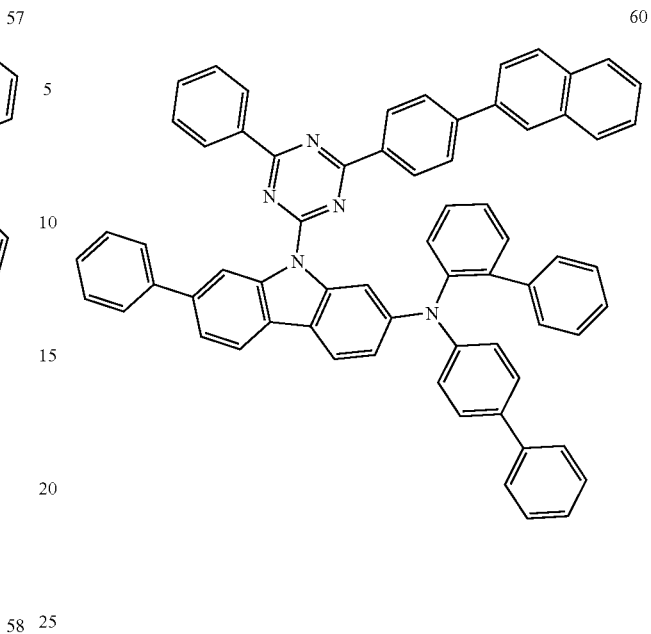
61
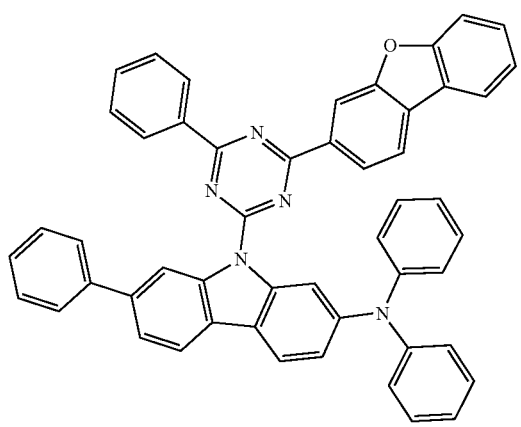
62
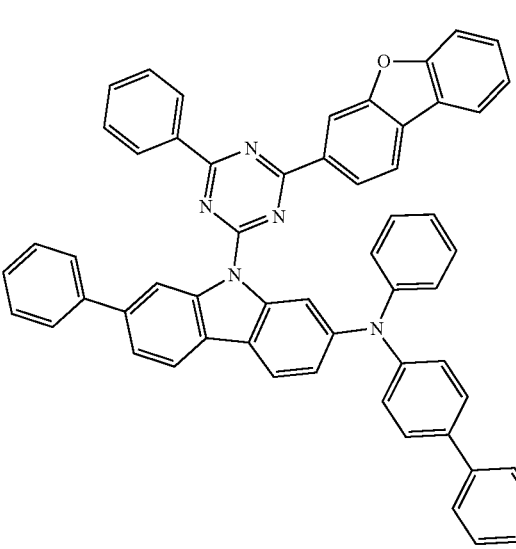

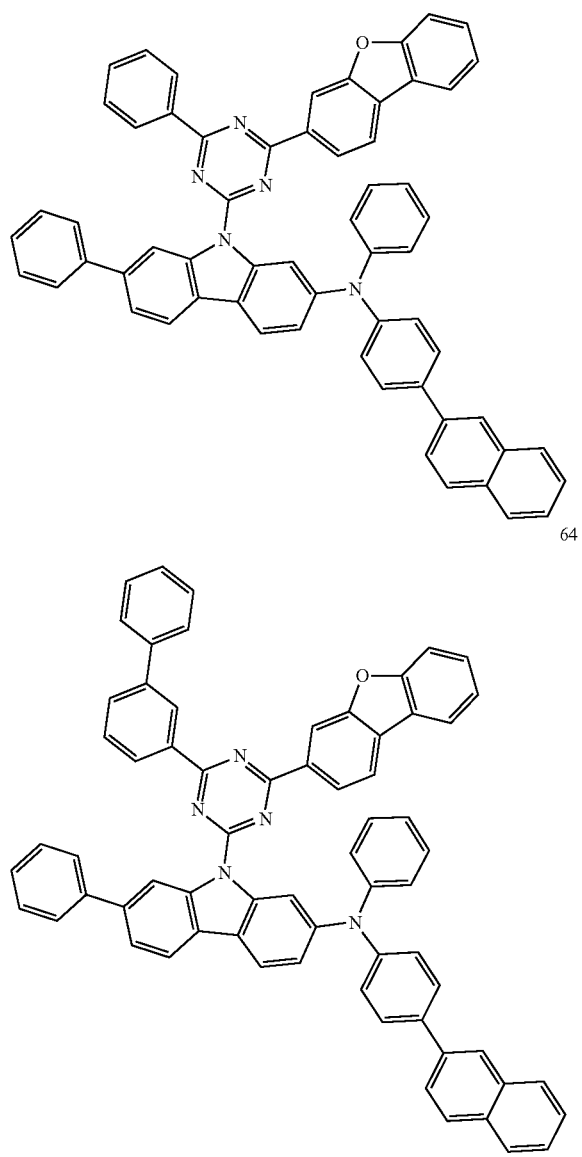

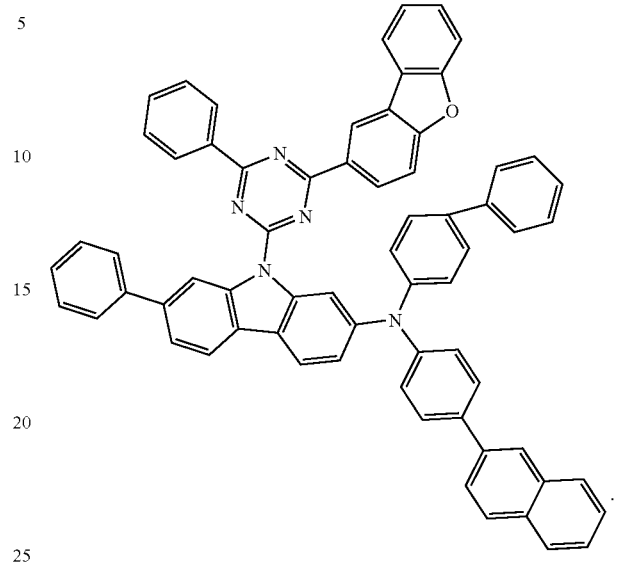

9. An organic optoelectronic device, comprising:
   an anode and a cathode facing each other,
   at least one organic layer between the anode and the cathode,
   wherein the organic layer includes the compound as claimed in claim 1.

10. The organic optoelectronic device as claimed in claim 9, wherein:
    the organic layer includes a light emitting layer, and
    the light emitting layer includes the compound.

11. The organic optoelectronic device as claimed in claim 10, wherein the compound is a phosphorescent host of the light emitting layer.

12. A display device comprising the organic optoelectronic device as claimed in claim 9.

* * * * *